(12) United States Patent
Argibay et al.

(10) Patent No.: US 10,763,000 B1
(45) Date of Patent: Sep. 1, 2020

(54) STABLE NANOCRYSTALLINE METAL ALLOY COATINGS WITH ULTRA-LOW WEAR

(71) Applicant: National Technology & Engineering Solutions of Sandia, LLC, Albuquerque, NM (US)

(72) Inventors: Nicolas Argibay, Albuquerque, NM (US); Michael E. Chandross, Albuquerque, NM (US); David P. Adams, Albuquerque, NM (US); Michael T. Dugger, Tijeras, NM (US); Blythe G. Clark, Albuquerque, NM (US); Brad L. Boyce, Albuquerque, NM (US); Ping Lu, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/968,618

(22) Filed: May 1, 2018

Related U.S. Application Data

(60) Provisional application No. 62/500,842, filed on May 3, 2017.

(51) Int. Cl.
  *C23C 30/00* (2006.01)
  *C23C 14/00* (2006.01)
  (Continued)

(52) U.S. Cl.
  CPC .............. *H01B 1/02* (2013.01); *B32B 15/018* (2013.01); *C22C 5/00* (2013.01); *C22C 5/02* (2013.01);
  (Continued)

(58) Field of Classification Search
  CPC ....... C23C 30/00; C23C 30/005; C23C 14/14; C23C 14/16; C23C 14/165; C23C 14/18; C23C 14/185; C23C 28/02; C23C 28/021; C23C 28/023; C23C 14/5806; C23C 14/35; C22C 2200/04; C22C 5/00–28; C22C 30/00; C22C 38/00; Y10S 977/70; Y10S 977/72; Y10S 977/755; Y10S 977/81; Y10T 428/12868; Y10T 428/12889; Y10T 428/12875; Y10T 428/265; Y10T 428/26; Y10T 428/2495; Y10T 428/24967;
  (Continued)

(56) References Cited

U.S. PATENT DOCUMENTS 6,578,254 B2  6/2003  Adams et al.
7,449,699 B1  11/2008 Adams et al.
(Continued)

OTHER PUBLICATIONS

M.M.Mohamed, "Fabrication and characterization of bimetallic Pt-Au nanowires supported on FSM-16 and their catalytic activities toward water-gas shift reaction," in J. Colloid Interface Science, 354 (2011), pp. 100-108. (Year: 2011).*

(Continued)

*Primary Examiner* — Michael E. La Villa
(74) *Attorney, Agent, or Firm* — Helen S. Baca; Kevin W. Bieg

(57) ABSTRACT

The present invention relates to metal coatings and methods thereof. In certain embodiments, the invention relates to ultra-low wear noble metal alloys, such as for use in electrical contact coatings.

24 Claims, 20 Drawing Sheets

(51) Int. Cl.

| | | |
|---|---|---|
| *C23C 28/00* | (2006.01) | |
| *C22C 5/00* | (2006.01) | |
| *H01B 1/02* | (2006.01) | |
| *B32B 15/01* | (2006.01) | |
| *C22C 5/04* | (2006.01) | |
| *C23C 14/16* | (2006.01) | |
| *H01B 13/00* | (2006.01) | |
| *C23C 14/58* | (2006.01) | |
| *C23C 28/02* | (2006.01) | |
| *C23C 14/18* | (2006.01) | |
| *C22C 5/02* | (2006.01) | |
| *C23C 14/14* | (2006.01) | |
| *C23C 14/35* | (2006.01) | |

(52) U.S. Cl.
CPC ............... *C22C 5/04* (2013.01); *C23C 14/14* (2013.01); *C23C 14/16* (2013.01); *C23C 14/165* (2013.01); *C23C 14/18* (2013.01); *C23C 14/185* (2013.01); *C23C 14/5806* (2013.01); *C23C 28/02* (2013.01); *C23C 28/021* (2013.01); *C23C 28/023* (2013.01); *C23C 30/00* (2013.01); *C23C 30/005* (2013.01); *H01B 13/0036* (2013.01); *B32B 2307/202* (2013.01); *B32B 2307/554* (2013.01); *B32B 2457/00* (2013.01); *C22C 2200/04* (2013.01); *C23C 14/35* (2013.01); *Y10S 977/70* (2013.01); *Y10S 977/72* (2013.01); *Y10S 977/755* (2013.01); *Y10S 977/81* (2013.01); *Y10T 428/12868* (2015.01); *Y10T 428/12875* (2015.01); *Y10T 428/12889* (2015.01); *Y10T 428/12896* (2015.01); *Y10T 428/12903* (2015.01); *Y10T 428/12944* (2015.01); *Y10T 428/2495* (2015.01); *Y10T 428/24967* (2015.01); *Y10T 428/26* (2015.01); *Y10T 428/265* (2015.01)

(58) Field of Classification Search
CPC ..... Y10T 428/12896; Y10T 428/12903; Y10T 428/12944; B32B 15/018; B32B 2307/202; B32B 2307/554; B32B 2457/00; H01B 1/02; H01B 13/0036
See application file for complete search history.

(56) References Cited

U.S. PATENT DOCUMENTS

| | | |
|---|---|---|
| 8,071,164 B1 | 12/2011 | Dugger et al. |
| 8,685,599 B1 | 4/2014 | Adams et al. |
| 9,463,532 B2 | 10/2016 | Boyle et al. |
| 9,499,699 B1 | 11/2016 | Hall et al. |
| 9,525,398 B1 | 12/2016 | Olsson et al. |
| 9,641,154 B2 | 5/2017 | Olsson et al. |
| 9,651,464 B1 | 5/2017 | Salzbrenner et al. |
| 9,725,373 B1 | 8/2017 | Adams et al. |
| 2001/0008157 A1* | 7/2001 | Bishop .................. H01H 1/023 148/678 |
| 2014/0319432 A1 | 10/2014 | Goeke et al. |
| 2014/0348203 A1 | 11/2014 | Murdoch et al. |
| 2015/0179204 A1* | 6/2015 | Mosendz ............. G11B 5/7325 369/13.33 |
| 2016/0027547 A1* | 1/2016 | Hattar .................... H01B 1/02 420/463 |

OTHER PUBLICATIONS

B. Brown, "Alloying effects of cosputtered gold-platinum thin films on the oxygen reduction reaction in acidic electrolyte," in J. Electrochemical Soc., 155 (2008), B852-B859. (Year: 2008).*

U.S. Appl. No. 14/242,746, filed Apr. 1, 2014, Goeke et al.
U.S. Appl. No. 14/923,031, filed Oct. 26, 2015, Kammler et al.
U.S. Appl. No. 15/153,453, filed May 12, 2016, Argibay et al.
U.S. Appl. No. 15/175,312, filed Jun. 7, 2016, Adams et al.
U.S. Appl. No. 15/239,631, filed Aug. 17, 2016, Adams et al.
U.S. Appl. No. 15/659,467, filed Jul. 25, 2017, Nation et al.
U.S. Appl. No. 15/659,479, filed Jul. 25, 2017, Nation et al.
U.S. Appl. No. 15/797,260, filed Oct. 30, 2017, Susan et al.
U.S. Appl. No. 15/924,572, filed Mar. 19, 2018, Wild et al.
U.S. Appl. No. 15/950,905, filed Apr. 11, 2018, Leathe et al.
Abdeljawad F et al., "Grain boundary segregation in immiscible nanocrystalline alloys," *Acta Mater.* 2017;126:528-39.
Abdeljawad F et al., "Stabilization of nanocrystalline alloys via grain boundary segregation: a diffuse interface model," *Acta Mater.* 2015;101:159-71.
Antler M. "Sliding wear of metallic contacts," *IEEE Trans. Components Hybrids Manuf. Technol.* 1981;CHMT-4:15-29.
Argibay N et al., "Copper-beryllium metal fiber brushes in high current density sliding electrical contacts." *Wear* 2010;268(11-12):1230-6.
Argibay N et al., "Is intrinsic nanocrystalline stability practically achievable? Insights from investigations with Pt—Au alloy," Oct. 2017, *Sandia Report No. SAND2017-11199C* (32 pp.).
Argibay N et al., "Linking microstructural evolution and macroscale friction behavior in metals," *J. Mater. Sci.* 2017;52(5):2780-99.
Argibay N et al., "Low wear metal sliding electrical contacts at high current density," *Wear* 2012;274-275:229-3.
Argibay N et al., "Nanocrystalline Pt—Au MEMS electricai switches" Oct. 2017, *Sandia Report No. SAND2017-11198C* (49 pp.).
Argibay N et al., "On the thermal stability of physical vapor deposited oxide-hardened nanocrystalline gold thin films," *J. Appl. Phys.* 2015;117: 145302 (13 pp.).
Argibay N et al., "Ultralow wear of stable nanocrystalline metals," Oct. 2017, *Sandia Report No. SAND2017-11319C* (22 pp.).
Bares JA et al., "High current density copper-on-copper sliding electrical contacts at low sliding velocities," *Wear* 2009;267:417-27.
Berman D et al., "Few layer graphene to reduce wear and friction on sliding steel surfaces," *Carbon* 2013;54:454-9.
Berman D et al., "Macroscale superlubricity enabled by graphene nanoscroll formation," *Science* 2015;348(6239):1118-22.
Bhaskaran H et al., "Ultralow nanoscale wear through atom-by-atom attrition in silicon-containing diamond-like carbon," *Nat. Nanotechnol.* 2010;5:181-5.
Boyce BL et al., "Anomalous fatigue behavior and fatigue-induced grain growth in nanocrystalline nickel alloys." *Metall. Mater. Trans. A* 2011;42(7):1793-804.
Brown L et al., "Testing and evaluation of metal fiber brush operation on slip rings and commutators," *IEEE Trans. Components Packaging Technols.* 2008;31(2):485-94.
Cahn JW. "The impurity-drag effect in grain boundary motion." *Acta Metall.* 1962;10(9):789-98.
Chandross M et al., "Shear-induced softening of nanocrystalline metal interfaces at cryogenic temperatures," *Scripta Mater.* 2018;143:54-8.
Chen X et al., "Lowering coefficient of friction in Cu alloys with stable gradient nanostructures," *Science Adv.* 2016;2(12):e1601942 (8 pp.).
Chhowalla M et al., "Thin films of fullerene-like $MoS_2$ nanoparticles with ultra-low friction and wear," *Nature* 2000;407:164-7.
Chookajorn T et al., "Design of stable nanocrystalline alloys," *Science* 2012;337(6097):951-4.
Chookajorn T et al., "Thermodynamics of stable nanocrystalline alloys: a Monte Carlo analysis," *Phys. Rev. B* 2014;89(6): 064102 (10 pp.).
Clark BG et al., "Nanostructure stability and wear of binary nanocrystalline alloys," Jul. 2016, *Sandia Report No. SAND2016-6443C* (59 pp.).
Clark BG et al., "Thermal stabililty comparison of nanocrystalline Fe-based binary alloy pairs," *JOM* 2016;68(6):1625-33.
Cliff G et al., "The quantitative analysis of thin specimens," *J. Microscop.* 1975;103(2):203-7.

(56) References Cited

OTHER PUBLICATIONS

Darling KA et al., "Grain size stabilization of nanocrystalline copper at high temperatures by alloying with tantalum." *J. Alloys Compd.* 2013;573:142-50.
Dienwiebel M et al., "Superlubricity of graphite," *Phys. Rev. Lett.* 2004;92:126101 (4 pp.).
Driver JH, "Stability of nanostructured metals and alloys," *Scripta Mater.* 2004;51(8):819-23.
Erdemir A et al., "Tribology of diamond-like carbon films: recent progress and future prospects," *J. Phys. D. Appl. Phys.* 2006;39(18):R311-R327.
Erickson GM et al., "Paleo-tribology: development of wear measurement techniques and a three-dimensional model revealing how grinding dentitions selfwear to enable functionality," *Surf. Topogr. Metrol. Prop.* 2016;4:024001 (12 pp.).
Foiles SM et al., "Alloy stabilization of nanocrystalline grain structures: case study of Pt—Au," Feb. 2017, *Sandia Report No. SAND2016-2067C* (18 pp.).
Foiles SM, "Calculation of grain-boundary segregation in Ni—Cu alloys," *Phys. Rev. B* 1989;40:11502-6.
Furnish T et al., "Microstructural evolution and friction transitions in nanocrystalline alloys," Jul. 2016, *Sandia Report No. SAND2016-6106C* (16 pp.).
Gianola DS et al., "Grain-size stabilization by impurities and effect on stress-coupled grain growth in nanocrystalline Al thin films," *Mater. Sci. Eng. A* 2008;483-484:637-40.
Greiner C et al., "Sequence of stages in the microstructure evolution in copper under mild reciprocating tribological loading" *ACS Appl. Mater. Interf.* 2016;8(24):15809-19.
Hamilton MA et al., "A possible link between macroscopic wear and temperature dependent friction behaviors of $MoS_2$ coatings," *Tribol. Lett.* 2008:32(2):91-8.
Hillert M et al., "A treatment of the solute drag on moving grain boundaries and phase interfaces in binary alloys," *Acta Metall.* 1976;24(8):731-43.
Hillert M. "Inhibition of grain growth by second-phase particles," *Acta Metall.* 1988;36(12):3177-81.
Holm EA et al., "On abnormal subgram growth and the origin of recrystallization nuclei," *Acta Mater.* 2003;51(9):2701-16.
Hyun S et al., "Mechanical behavior of Pt and Pt—Ru solid solution alloy thin films," *Acta Mater.* 2004;52(14):4199-211.
Jeong DH et al., "The effect of grain size on the wear properties of electrodeposited nanocrystalline nickel coatings," *Scripta Mater.* 2001;44(3):493-9.
Jung SH et al., "Mechanism of abnormal grain growth in ultrafine-grained nickel," *Acta Mater.* 2013;61(15):5685-93.
Kirchheim R. "Grain coarsening inhibited by solute segregation," *Acta Mater.* 2002;50(2):413-9.
Kirchheim P. "Reducing grain boundary, dislocation line and vacancy formation energies by solute segregation: I. Theoretical background," *Acta Mater.* 2007;55(15):5129-38.
Koch CC et al., "Stabilization of nanocrystalline grain sizes by solute additions," *J. Mater. Sci.* 2008;43(23):7264-72.
Korznikov AV et al., "Thermal stability of nanocrystalline Ni," *Acta Physica Polonica A* 2002;102(2):265-71; and.
Kresse G et al., "Efficient iterative schemes for ab initio total-energy calculations using a plane-wave basis set," *Phys. Rev. B* 1996;54(16):11169-86.
Kresse G et al., "From ultrasoft pseudopotentials to the projector augmented-wave method," *Phys. Rev. B* 1999;59(3):1758-75.
Krick BA et al., "Ultra low wear fluoropolymer composites: nanoscale functionality from microscale fillers," *Tribol. Int'l* 2016;95:245-55.
Kumar KS et al., "Mechanical behavior of nanocrystalline metals and alloys," *Acta Mater.* 2003;51(19):5743-74.
Lancaster JK. "A review of the influence of environmental humidity and water on friction, lubrication and wear," *Tribol. Int'l* 1990;23(6):371-89.
Lancaster JK, "The influence of substrate hardness on the formation and endurance of molybdenum disulphide films," *Wear* 1967;10:103-17.

Leyland A et al., "On the significance of the H/E ratio in wear control: a nanocomposite coating approach to optimised tribological behaviour," *Wear* 2000;246(1-2):1-11.
Lu Y et al., "A study of the wear mechanism of diamond like films," *Surf. Coatings Technol.* 1996;82:48-56.
Liu Y et al., "An investigation of the relationship between graphitization and frictional behavior of DLC coatings," *Surf. Coatings Technol.* 1996;88-87(2):564-8.
Meyers MA, "Mechanical properties of nanocrystalline materials." *Prog. Mater. Sci.* 2006;51(4): 427-556.
Murdoch HA et al., "Estimation of grain boundary segregation enthalpy and its rote in stable nanocrystalline alloy design," *J. Mater. Res.* 2013;28(16):2154-63.
Murdoch HA et al., "Stability of binary nanocrystalline alloys against grain growth and phase separation," *Acta Mater.* 2013;61(6):2121-32.
O'Brien CJ et al., "Grain boundary phase transformations in PtAu and relevance to thermal stabilization of bulk nahocrystalline metals," *J. Mater. Sci.* 2018;53(4):2911-27.
Oliver WC et al., "An improved technique for determining hardness and elastic modulus using load and displacement sensing indentation experiments," *J. Mater. Res.* 1992;7(6):1564-83.
Olmsted DL et al., "Survey of computed grain boundary properties in face-centered cubic metals: II. Grain boundary mobility," *Acta Mater.* 2009;57(13):3704-13.
Olmsted DL et al., "Survey of computed grain boundary properties in face-centered cubic metals: I. Grain boundary energy," *Acta Mater.* 2009;57(13):3694-703.
Padilla II HA et al., "A review of fatigue behavior in nanocrystalline metals," *Exp. Mech.* 2010;50(1):5-23.
Padilla HA et al., "Frictional performance and near-surface evolution of nanocrystalline Ni—Fe as governed by contact stress and sliding velocity," *Wear* 2013;297(1-2):860-71.
Pande CS et al., "Nanomechanics of Hall-Petch relationship in nanocrystalline materials," *Prog. Mater. Sci.* 2009;54(6):689-706.
Perdew JP et al., "Generalized radient approximation made simple," *Phys. Rev. Lett.* 1996;77(18):3865-8.
Plimpton SJ, "Fast parallel algorithms for short-range molecular dynamics," *J. Comput. Phys.* 1995;117(1):1-19.
Prasad SV et al., "EBSD studies on wear-induced subsurface regions in LIGA nickel," *Scripta Mater.* 2003;48(3):255-60.
Prasad SV et al., "Friction transitions in nanocrystalline nickel," *Scripta Mater.* 2011;64(8):729-32.
Ratanaphan S et al., "Grain boundary energies in body-centered cubic metals," *Acta Mater.* 2015;88:346-54.
Rupert TJ et al., "Sliding wear of nanocrystalline Ni—W: structural evolution and the apparent breakdown of Archard scaling," *Acta Mater.* 2010;58(12):4137-48.
Sansoz F et al., "Grain growth behavior at absolute zero during nanocrystalline metal indentation," *Appl. Phys. Lett.* 2006;89:111901 (3 pp.).
Sawyer WG et al., "Mechanistic studies in friction and wear of bulk materials," *Annu. Rev. Mater. Res.* 2014;44:395-427.
Scharf TW et al., "Friction and wear mechanisms in $MoS_2/Sb_2O_3/$Au nanocomposite coatings," *Acta Mater.* 2010;58(12):4100-9.
Scharf TW et al., "Solid lubricants: a review," *J. Mater. Sci.* 2013;48(2):511-31.
Schmitz TL et al., "Wear-rate uncertainty analysis," *ASME J. Tribol.* 2004;126(4):802-8.
Schuh CA, "Hall-Petch breakdown manifested in abrasive wear resistance of nanocrystalline nickel," *Scripta Mater.* 2002;46(10):735-40.
Seki A et al., "Monte Carlo simulations of segregation at [001] twist boundaries in a Pt(Au) alloy—I. Results," *Acta Metall. Mater.* 1991;39(12):3167-77.
Sharon JA et al., "Interpreting the ductility of nanocrystalline metals," *J. Mater. Res.* 2013;28(12):1539-52.
Suh NP, "An overview of the delamination theory of wear," *Wear* 1977;44(1):1-16.
Thompson CV, "Grain growth in thin films," *Annu. Rev. Mater. Sci.* 1990;20:245-68.
Wang N et al., "Isokinetic analysis of nanocrystalline nickel electrodeposits upon annealing," *Acta Mater.* 1997;45(4):1655-69.

(56) References Cited

OTHER PUBLICATIONS

Weertman JR, "Retaining the nano in nanocrystalline alloys," *Science* 2012;337(6097):921-2.
Weissmüller J, "Alloy effects in nanostructures," *Nanostructured Mater.* 1993;3(1-6):261-72.
Wörner CH et al., "Grain growth stagnation by inclusions or pores," *JOM* 1992;44(8):16-20.
Zeng G et al., "Ultralow wear of gallium nitride," *Appl. Phys. Lett.* 2016;109:051602 (5 pp.).

* cited by examiner

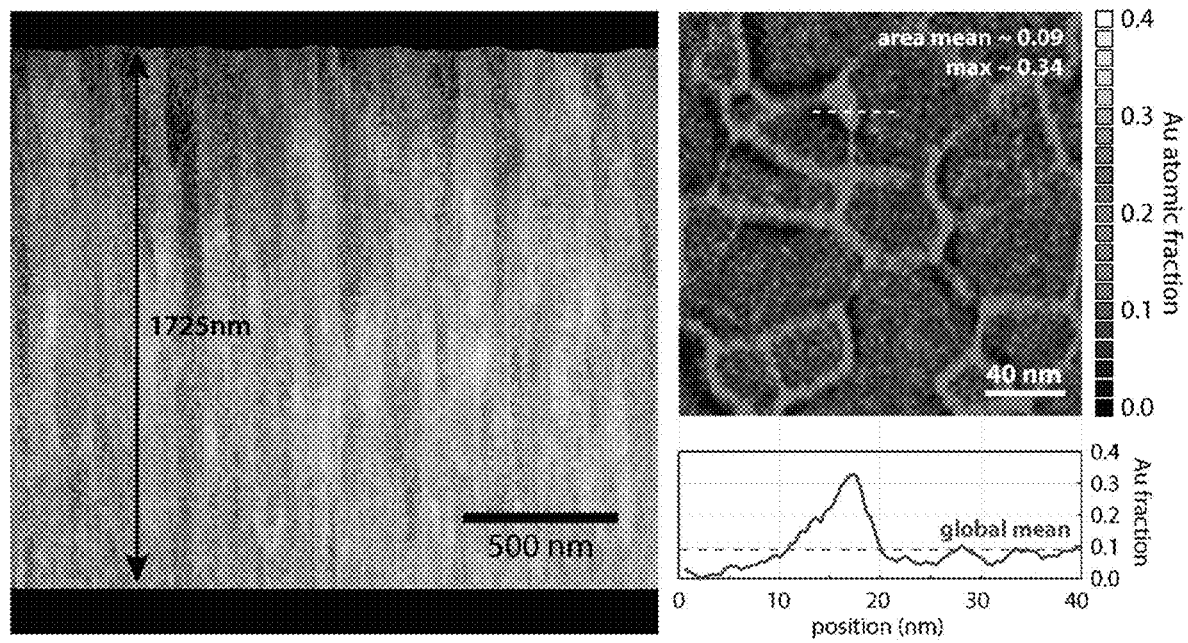
FIG. 11A             FIG. 11B
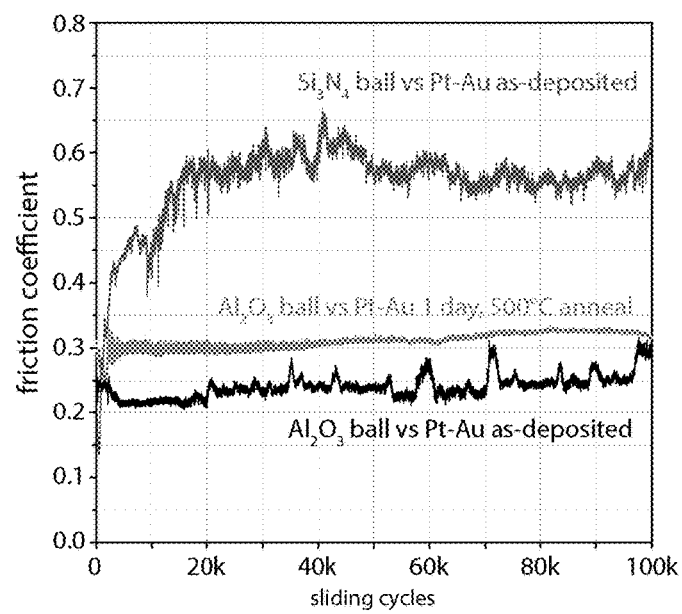
FIG. 12A

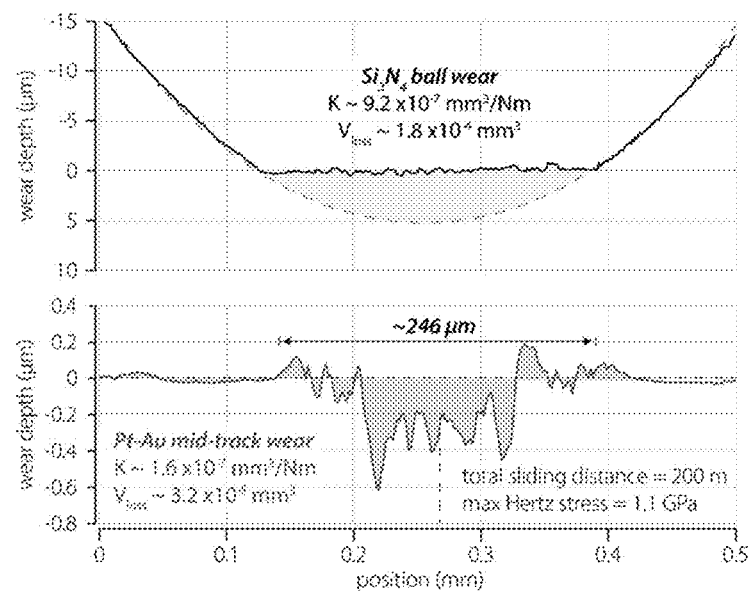
FIG. 14C
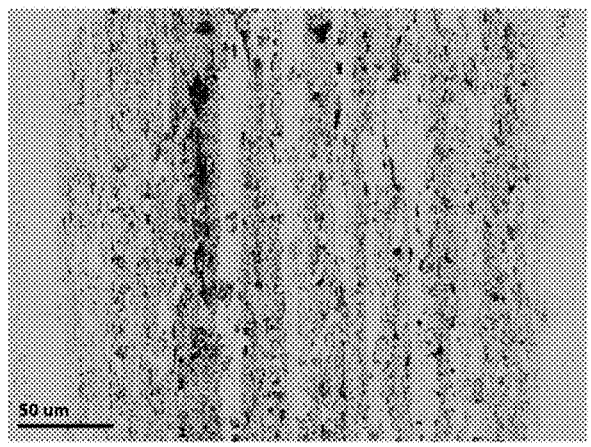
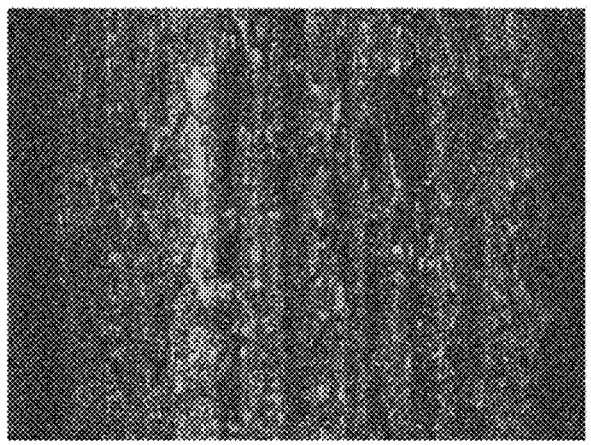
FIG. 14D          FIG. 14E

STABLE NANOCRYSTALLINE METAL ALLOY COATINGS WITH ULTRA-LOW WEAR

CROSS-REFERENCE TO RELATED APPLICATION

This application claims the benefit of U.S. Provisional Application No. 62/500,842, filed May 3, 2017, which is hereby incorporated by reference in its entirety.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to metal coatings and methods thereof. In certain embodiments, the invention relates to ultra-low wear noble metal alloys, such as for use in electrical contact coatings.

BACKGROUND OF THE INVENTION

Metal electrical contacts are an essential component in a wide range of devices, from switches to slip rings to relays. Ideally, such components would be electrically conductive while maintaining performance features (e.g., minimal wear and aging characteristics). The tribological behavior of materials, and specifically metals, has contributed to the present understanding of atomic scale mechanisms of deformation and macroscale behavior (e.g., friction and wear behavior). Yet, controlling atomic-scale characteristics and understanding their effect on macro-scale function still remain a challenge. There is a need for new routes of achieving stable metals with improved performance (e.g., wear and thermal aging resistance, enhanced efficiency, and increased reliability) beneficial for electrical contact technology.

SUMMARY OF THE INVENTION

The present invention is related to noble metal alloys. In particular embodiments, the alloys are provided as an ultra-low wear noble metal alloy electrical contact coating. In one non-limiting example, a noble metal alloy system (e.g., Pt—Au) shows remarkable thermo-mechanical nanocrystalline stability that can mitigate grain growth at extremely high temperatures and stresses, and thus reduce the wear rate and friction of nanocrystalline metals. These exemplary materials have wear rates similar to state-of-the-art non-conductive solid lubricants (e.g., with wear rates in the range $10^{-9}$ mm$^3$/N·m), such as diamond-like carbon. Furthermore, the exemplary Pt—Au alloy herein has a wear rate that is about 100× to 1000× lower than any reported nanocrystalline alloy (with wear rates of the order $10^{-6}$ mm$^3$/N·m), while exhibiting friction coefficients similar to polytetrafluoroethylene (e.g., Teflon™) nanocomposites (μ~0.2-0.3).

Moderate stresses and temperatures (>200° C.) can lead to rapid failure and constrain device design limits. The alloys herein can have any useful characteristic (e.g., low wear rate, low friction, electrical resistivity, and/or corrosion-resistance) to overcome failure and/or to expand design parameters by which devices can be manufactured. In one non-limiting instance, the present invention includes a Pt—Au coating with intrinsically thermomechanically stable nanocrystalline microstructures. This exemplary coating exhibited stability up to 500° C. and upon exposure millions of cycles at stresses up to 1 GPa. As a comparison, this coating outperformed conventional electrical contact coatings, with 100× higher wear life (e.g., low specific wear rates of less than about 1×10$^{-8}$ mm$^3$/N·m), even after prolonged (e.g., days) exposure to temperatures up to 500° C. Friction coefficients for self-mated exemplary coatings on steel substrates were in the range of =0.2 to 0.3, and electrical resistivity of the exemplary films was 3×10$^{-8}$ Ω·m (compared to that of oxide-free high-conductivity copper, the industry reference, of 1.7×10$^{-8}$ Ω·m, typical of highly refined grain size metals). Overall, the alloy can provide high endurance limit with reduced film thickness, high strength, fatigue and wear resistance, and electrical conductivity, in which these benefits were observed at applied stresses and temperatures far exceeding the performance limits of conventional electrical contact coating technologies. These exemplary coatings could enable unprecedented performance gains, wear resistance, and long life in electrical contact applications.

The ability to resist prolonged high temperature exposure degradation allows for reduced constraints to the way that a device can be are manufactured (e.g., the ability to solder and to heat coated parts without degrading coating performance). Thermal stability can also enable higher power density on existing devices, where current density driving microstructure changes through contact heating is a design limiter. The fact that the elemental constituents can be metals (e.g., noble metals) also reduces the potential for the diffusion of the hardener species to the contact surface. Such diffusion (e.g., as present in Ni-doped hard Au) could potentially form an insulating oxide layer, which will reduce electrical conductivity. The ability to operate at much elevated temperatures can provide other useful benefits. For example, if a coating remains unused for extended periods of time or is exposed to dirty environments, then an electrically insulating layer of soot or other undesired adventitious species can be formed on the surface of the coating. When a thermally resistive coating is employed, then such species can be removed by exposing the coating (e.g., as an electrical contact) to high currents to heat up and react these species off, essentially cleaning the surface in situ without the need for solvents and labor-intensive maintenance. Such as self-cleaning surface can be useful in electronic devices (e.g., packaged devices, monolithic devices, or encapsulated devices) in which a built-in cleaning feature can be provided with the device. Such a feature would be difficult to provide with conventional coating materials.

In a first aspect, the present invention features a coating including a binary alloy. In some embodiments, the alloy includes at least one columnar grain (e.g., a plurality of columnar grains). In some embodiments, the coating is a thin film.

In a second aspect, the present invention features an electrical contact including a thin film disposed on a substrate. In some embodiments, the thin film includes a binary alloy (e.g., including a plurality of columnar grains).

In a third aspect, the present invention features a noble metal alloy electrical contact coating. In further embodiments, the coating includes a thin film including an alloy of platinum and gold, the alloy including less than about 50 atomic percent (at. %) gold (e.g., including any other at. % or ranges described herein). In some embodiments, the gold is preferentially segregated at grain boundaries. In other embodiments, the thin film is deposited on a substrate by physical vapor deposition, chemical vapor deposition, sputter deposition, electroplating, or electroless plating.

In a fourth aspect, the present invention features a method of forming a thin film. In some embodiments, the method includes: depositing a binary alloy on a substrate; and annealing the alloy at a temperature greater than about 200° C. (e.g., after weeks of exposure at the temperature, including a temperature greater than about 250° C., 300° C., 350° C., 400° C., 450° C., or 500° C.). In other embodiments, the method includes forming the thin film including a plurality of columnar grains (e.g., where at least one grain has a grain diameter of less than about 100 nm and/or an aspect ratio of at least one grain is 1:2 or greater).

In a fifth aspect, the present invention features a method of forming an electrical contact. In some embodiments, the method includes: depositing a binary alloy on a substrate; annealing the alloy at a temperature greater than about 200° C. (e.g., a temperature greater than about 250° C., 300° C., 350° C., 400° C., 450° C., or 500° C.). In other embodiments, the method includes forming a film including a plurality of columnar grains (e.g., where at least one grain has a grain diameter of less than about 100 nm and/or an aspect ratio of at least one grain is 1:2 or greater). In further embodiments, the method includes exposing the thin film or the electrical contact to a current source, thereby removing one or more insulating species from a surface of the film.

In any method herein, the method includes annealing at a temperature of from about 150° C. to about 650° C. (e.g., from 150° C. to 200° C., 150° C. to 300° C., 150° C. to 400° C., 150° C. to 500° C., 150° C. to 550° C., 150° C. to 600° C., 200° C. to 300° C., 200° C. to 400° C., 200° C. to 500° C., 200° C. to 550° C., 200° C. to 600° C., 200° C. to 650° C., 250° C. to 300° C., 250° C. to 400° C., 250° C. to 500° C., 250° C. to 550° C., 250° C. to 600° C., 250° C. to 650° C., 300° C. to 400° C., 300° C. to 500° C., 300° C. to 550° C., 300° C. to 600° C., 300° C. to 650° C., 350° C. to 400° C., 350° C. to 500° C., 350° C. to 550° C., 350° C. to 600° C., 350° C. to 650° C., 400° C. to 500° C., 400° C. to 550° C., 400° C. to 600° C., 400° C. to 650° C., 450° C. to 500° C., 450° C. to 550° C., 450° C. to 600° C., 450° C. to 650° C., 500° C. to 550° C., 500° C. to 600° C., 500° C. to 650° C., 550° C. to 600° C., 550° C. to 650° C., and 600° C. to 650° C.).

In any embodiment herein, the alloy includes at least one columnar grain (e.g., a plurality of columnar grains). In further embodiments, at least one grain has a grain diameter of less than about 100 nm and/or an aspect ratio of at least one grain is 1:2 or greater (e.g., from about 1:5 to about 1:10 or any other ratios or ranges described herein). In other embodiments, at least one grain has a grain length greater than about 100 nm (e.g., including any other grain length or ranges herein). In yet other embodiments, an average grain diameter of the plurality of columnar grains is less than about 100 nm (e.g., including any other grain diameter or ranges herein), and/or an average grain length of the plurality of columnar grains in greater than about 100 nm (e.g., including any other grain length or ranges herein).

In any embodiment herein, the coating and/or contact is a thin film. In some embodiments, the film has a thickness greater than about 10 nm and/or less than about 1000 nm (e.g., of from about 10 nm to 25 nm, 10 nm to 50 nm, 10 nm to 75 nm, 10 nm to 100 nm, 10 nm to 250 nm, 10 nm to 500 nm, 10 nm to 750 nm, 20 nm to 25 nm, 20 nm to 50 nm, 20 nm to 75 nm, 20 nm to 100 nm, 20 nm to 250 nm, 20 nm to 500 nm, 20 nm to 750 nm, 20 nm to 1000 nm, 30 nm to 50 nm, 30 nm to 75 nm, 30 nm to 100 nm, 30 nm to 250 nm, 30 nm to 500 nm, 30 nm to 750 nm, 30 nm to 1000 nm, 50 nm to 75 nm, 50 nm to 100 nm, 50 nm to 250 nm, 50 nm to 500 nm, 50 nm to 750 nm, 50 nm to 1000 nm, 75 nm to 100 nm, 75 nm to 250 nm, 75 nm to 500 nm, 75 nm to 750 nm, 75 nm to 1000 nm, 100 nm to 250 nm, 100 nm to 500 nm, 100 nm to 750 nm, 100 nm to 1000 nm, 250 nm to 500 nm, 250 nm to 750 nm, 250 nm to 1000 nm, 500 nm to 750 nm, 500 nm to 1000 nm, and 750 nm to 1000 nm). In other embodiments, the thin film is deposited on a substrate by physical vapor deposition, chemical vapor deposition, sputter deposition, cold spray, electron beam deposition, atomic layer deposition, electroplating, or electroless plating.

In any embodiment herein, the coating and/or contact and/or alloy includes one or more noble metals.

In any embodiment herein, the alloy includes one or more selected from the group of Ag, Al, Au, Ba, Be, Bi, Ca, Cd, Co, Cr, Cs, Cu, Fe, Ga, Ge, Hf, In, Ir, K, La, Li, Mg, Mn, Mo, Na, Nb, Ni, Os, Pb, Pd, Pt, Rb, Re, Rh, Ru, Sb, Sc, Sn, Sr, Ta, Tc, Th, Ti, Tl, V, W, Y, Zn, and Zr.

In some embodiments, the alloy includes Pt and Au.

In any embodiment herein, the alloy includes a solvent and a solute. In further embodiments, the solute is preferentially segregated at grain boundaries. In other embodiments, the solvent is selected from the group consisting of Hf, La, Mo, Nb, Ni, Os, Pt, Re, Rh, Ru, Ta, Tc, Ti, V, W, Y, and Zr (e.g., or any other described herein). In yet other embodiments, the solute is selected from the group consisting of Ag, Al, Au, Ba, Be, Bi, Ca, Cd, Co, Cr, Cs, Cu, Fe, Ga, Ge, In, K, La, Li, Mg, Mn, Na, Ni, Pb, Rb, Sb, Sc, Sn, Sr, Th, Tl, Y, Zn, and Zr (e.g., or any other described herein). In some embodiments, the solvent includes Pt, and the solute includes Au. In some embodiments, Au is preferentially segregated at grain boundaries.

In any embodiment herein, the coating and/or contact and/or alloy includes a stable, nanocrystalline structure.

In any embodiment herein, the coating and/or contact and/or alloy includes Al—Pb, Al—Zn, Co—Cd, Co—Cu, Co—Pd, Cu—Ag, Cu—Bi, Cu—Pb, Cu—Y, Fe—Ag, Fe—Au, Fe—Cu, Fe—In, Fe—Mg, Hf—Mg, Hf—Sc, Hf—Ti, Ir—Ag, Ir—Au, Ir—Cu, Ir—Ni, Ir—Pd, Ir—Rh, La—Ba, La—Ca, La—Cr, La—Li, Mn—Cd, Mo—Au, Mo—Cr, Mo—Sc, Nb—Bi, Nb—Cu, Nb—Zr, Ni—Ag, Ni—Au, Ni—Cu, Ni—Pb, Ni—Sn, Ni—Tl, Os—Ag, Os—Cu, Os—Ni, Os—Pd, Os—Rh, Pd—Au, Pt—Au, Pt—Pd, Re—Cu, Re—Ni, Re—Pd, Re—Rh, Rh—Ag, Rh—Au, Rh—Co, Rh—Cu, Rh—Ni, Rh—Pd, Ru—Ag, Ru—Cu, Ru—Ni, Ru—Pd, Ru—Rh, Sc—Au, Sc—Ba, Sc—Cr, Sc—Cu, Sc—Sr, Sr—Mn, Ta—Bi, Ta—Cu, Ta—Hf, Ta—In, Ta—Zr, Tc—Cu, Tc—Ni, Tc—Pd, Th—Cr, Th—La, Th—Mo, Th—Sc, Th—Ti, Th—V, Th—Y, Ti—Ca, Ti—K, Ti—La, Ti—Mg, Ti—Sc, V—Cd, V—Cu, V—Sc, W—Au, W—Cr, W—Cu, W—Sb, W—Sc, W—Th, W—Y, Y—Ba, Y—Ca, Y—Cr, Y—Sr, Y—Tl, Y—V, Zr—Cs, Zr—K, Zr—Mg, Zr—Sc, Zr—Ti, or Zr—Y.

In any embodiment herein, the alloy includes columnar grains with a grain diameter (e.g., an average grain diameter) of less than about 100 nm (e.g., less than about 90 nm, 80 nm, 75 nm, 70 nm, 60 nm, 50 nm, 40 nm, 30 nm, 25 nm, 20 nm, 15 nm, 10 nm, 5 nm, 2 nm, or less) and/or of from about 0.5 nm to about 150 nm (e.g., including any range described herein); and/or a grain length (e.g., an average grain length) of greater than about 100 nm (e.g., greater than about 200 nm, 500 nm, 750 nm, 1000 nm) and/or of from about 20 nm to about 2000 nm (e.g., including any range described herein).

In any embodiment herein, grain growth is negligible up to a temperature of about 500° C. after weeks of exposure. Additional details follow.

Definitions

As used herein, the term "about" means±10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

BRIEF DESCRIPTION OF THE DRAWINGS

FIG. 11A-11B shows exemplary Pt—Au thin films. Provided are a cross-section view of a STEM-HAADF image of an as deposited Pt—Au films (FIG. 11A) and a plan view EDS composition map showing heterogeneous Au segregation (FIG. 11B). Also shown is a quantitative line scan of Au composition across the dashed line showing preferential segregation (i.e. above the global mean composition) to grain boundaries.

FIG. 12A-12B shows friction coefficients for various materials. Provided are cycle-average friction coefficients for sapphire and $Si_3N_4$ spheres sliding against Pt—Au films in as-deposited and annealed conditions (FIG. 12A) and friction coefficients and specific or volumetric wear rate map of tribological materials (FIG. 12B). Data in FIG. 12B were obtained from Erdemir A et al., *J. Phys. D. Appl. Phys.* 2006; 39(18):R311-R327; Scharf T W et al., *J. Mater. Sci.* 2013; 48(2):511-31; Sawyer W G et al., *Annu. Rev. Mater. Res.* 2014; 44:395-427; Slade P G (ed.), "Electrical Contacts: Principles and Applications," (Marcel Dekker, Inc., New York, N.Y., 1999); Rupert T J et al., *Acta Mater.* 2010; 58(12):4137-48; Jeong D H et al., *Scripta Mater.* 2001; 44(3):493-9; and Scharf T W et al., *Acta Mater.* 2010; 58(12):4100-9), and also includes the results of an exemplary Pt—Au film sliding against sapphire.

FIG. 14A-14E shows wear track results obtained near the end of the track after 100 k sliding passes. Provided are surface topographical area scans of the worn $Si_3N_4$ ball (FIG. 14A) and the Pt—Au wear track (FIG. 14B). Also provided are representative cross-section wear depth plots of the ball and Pt—Au wear track (FIG. 14C), a plan view BSD of the wear track surface (FIG. 14D), and a plan view EDS of the wear track surface (FIG. 14E).

(FIG. 15A); grain size histograms for $Pt_{0.90}Au_{0.10}$ thin film after annealing at 500° C. for ~1 day and 1 week (FIG. 15B); and representative STEM-HAADF images of a thin $Pt_{0.90}Au_{0.10}$ film (FIG. 15C) and a pure Pt film (FIG. 15D) at varying stages of annealing at 500° C.

(FIG. 19A). Atoms are classified by a combination of Common Neighbor Analysis (CNA) and the Centro-Symmetry Parameter (CSP) and are colored such that Pt atoms in a local FCC environment are gray and Au atoms in a local FCC environment are dark gray. Pt and Au in a disordered environment (e.g. GBs) are shifted from gray to light gray and dark gray to darker gray, respectively, with increasing disorder as quantified by their CSP. Also provided is a plot of mean squared grain size as a function of annealing time at 502° C. (FIG. 19B, lines are drawn to guide the eye).

DETAILED DESCRIPTION OF THE INVENTION

Figure 1A:
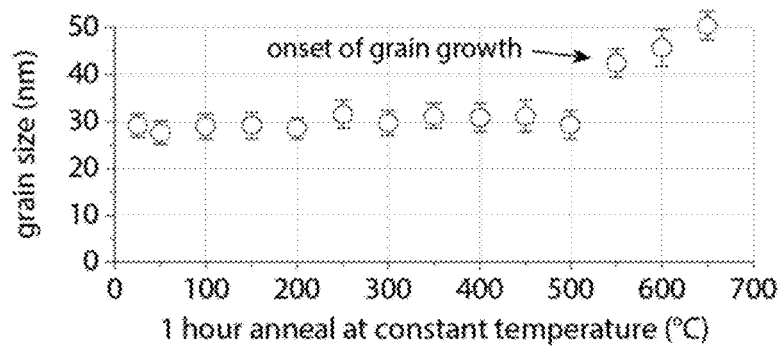
FIG. 1A-1E shows characterization data for Pt—Au films. Provided are annealing grain growth data for Pt—Au films using in situ x-ray diffraction (XRD) with incremental temperature steps and 1 hour holds with ~2 μm thick films (FIG. 1A) and interrupted transmission electron microscope (TEM) ultrahigh vacuum (UHV) anneals at 500° C. with freestanding thin (18 nm thickness) films or thick (2 μm thickness) films (FIG. 1B). Also provided are molecular dynamics simulations of thermal grain growth with equiaxed grain structures for a pure Pt film (FIG. 1C, left) and a Pt—Au film (FIG. 1C, right). Provided are scanning TEM high-angle annular dark-field (STEM-HAADF) images of freestanding (18 nm) thin films (plan view) after annealing (at 500° C.) for 1 day with pure nanocrystalline Pt (FIG. 1D, left) and for 1 week with Pt—Au (FIG. 1D, right). Both films had an initial average grain size of 7±3 nm. After coarsening rapidly into a steady-state condition in the first minute of the anneal, the Pt—Au grain size remained unchanged after up to 1 week (see FIG. 1B), while the pure Pt exhibited progressive abnormal grain growth. Also provided is a plan view of a composition map of an as-deposited Pt—Au thick film used for mechanical testing (FIG. 1E), showing heterogeneous Au segregation; additional characterization is provided in the Example 2. Also shown is a quantitative line scan of Au composition across the dashed line in FIG. 1E, showing preferential segregation (i.e., above the global mean composition) to the grain boundary.

The present invention relates to a metal alloy having a nanocrystalline structure. Without wishing to be limited by mechanism, the presence of columnar crystalline grains may impart unprecedented microstructural stability. At the macroscale, this stability provides beneficial characteristics, including stability at high temperatures (e.g., greater than about 100° C. and up to about 550° C.) and high stresses (e.g., up to about 1 GPa), which in turn provides high wear life.

In particular embodiments, the metal alloy outperforms conventional electrical contact coatings at high temperatures (e.g., hard gold coatings), even after prolonged (days) exposure to temperatures up to 500° C.

Manufacturing and processing of electronic devices can be limited by component materials. For instance, typical electrical contacts for a device can include a metal or an alloy, in which exposure above a critical temperature can degrade performance. Thus, processing and packaging of the device must be below that critical temperature. In one non-limiting embodiment, the alloys herein provide structural stability at elevated temperatures (e.g., greater than about 100° C. and/or up to about 550° C.), such that high temperature processing of device is possible. Furthermore, heat generation of high power device can limit material choices. In another non-limiting embodiment, the alloys herein can enable high power density in devices.

Nanocrystalline Structures

The present invention relates to an alloy having particular structural features. In one embodiment, the alloy is a binary alloy including a base material (e.g., a solvent) and a dopant (e.g., a solute). Exemplary solvents and solutes (e.g., a metal solvent and a metal solute) are described herein. In one non-limiting instance, the alloy includes a structure having segregation of the solute at grain boundaries. In particular embodiments, more than about 50% of the solute is segregated to grain boundaries (e.g., more than about 60%, 70%, 80%, or greater).

In another embodiment, the alloy has a nanocrystalline structure. In a further embodiment, the nanocrystalline structure is characterized by a plurality of crystalline grains. In at least some embodiments, a nanocrystalline structure refers to the size of a grain (a crystal or a crystalline grain) having a dimension that is less than or equal to about 1000 nm (e.g., less than or equal to about 500 nm, 200 nm, 100 nm, 50 nm, 20 nm, 10 nm, 5 nm, 2 nm, or less). For example, the grain size may be between about 1000 nm and about 2 nm (e.g., about 500 nm and about 2 nm, about 200 nm and about 2 nm, about 100 nm and about 2 nm, about 50 nm and about 2 nm, about 30 nm and about 2 nm, about 20 and about 2 nm, about 10 nm and about 2 nm). The size may refer to the largest dimension of the grain or an average dimension determined by measuring that dimension for a plurality of grains. An "average" may be measured by any suitable techniques. A dimension may refer to the diameter, length, width, and/or height, depending on the geometry of the grain. In some instances, a nanocrystalline material may also refer to a material including an amorphous microstructure or a metastable microstructure. In one non-limiting instance, a metastable nanocrystalline phase can refer to a nanocrystalline structure that is more energetically favorable than the single phase solid solution at that solute content, but less favorable than macroscopic phase separation of the system into two solid solutions.

An alloy herein can be characterized by a grain size. In one instance, the alloy includes grain (e.g., at least one grain or a plurality of grains) having a grain diameter (e.g., an average grain diameter) of less than about 100 nm (e.g., less than about 90 nm, 80 nm, 75 nm, 70 nm, 60 nm, 50 nm, 40 nm, 30 nm, 25 nm, 20 nm, 15 nm, 10 nm, 5 nm, 2 nm, or less). In another non-limiting instance, the alloy includes a grain (e.g., at least one grain or a plurality of grains) having a grain diameter (e.g., an average grain diameter) of from about 0.5 nm to about 150 nm (e.g., from 0.5 nm to 5 nm, 0.5 nm to 10 nm, 0.5 nm to 20 nm, 0.5 nm to 30 nm, 0.5 nm to 40 nm, 0.5 nm to 50 nm, 0.5 nm to 60 nm, 0.5 nm to 70 nm, 0.5 nm to 80 nm, 0.5 nm to 90 nm, 0.5 nm to 100 nm, 0.5 nm to 125 nm, 1 nm to 5 nm, 1 nm to 10 nm, 1 nm to 20 nm, 1 nm to 30 nm, 1 nm to 40 nm, 1 nm to 50 nm, 1 nm to 60 nm, 1 nm to 70 nm, 1 nm to 80 nm, 1 nm to 90 nm, 1 nm to 100 nm, 1 nm to 125 nm, 1 nm to 150 nm, 5 nm to 10 nm, 5 nm to 20 nm, 5 nm to 30 nm, 5 nm to 40 nm, 5 nm to 50 nm, 5 nm to 60 nm, 5 nm to 70 nm, 5 nm to 80 nm, 5 nm to 90 nm, 5 nm to 100 nm, 5 nm to 125 nm, 5 nm to 150 nm, 10 nm to 20 nm, 10 nm to 30 nm, 10 nm to 40 nm, 10 nm to 50 nm, 10 nm to 60 nm, 10 nm to 70 nm, 10 nm to 80 nm, 10 nm to 90 nm, 10 nm to 100 nm, 10 nm to 125 nm, 10 nm to 150 nm, 15 nm to 20 nm, 15 nm to 30 nm, 15 nm to 40 nm, 15 nm to 50 nm, 15 nm to 60 nm, 15 nm to 70 nm, 15 nm to 80 nm, 15 nm to 90 nm, 15 nm to 100 nm, 15 nm to 125 nm, 15 nm to 150 nm, 20 nm to 30 nm, 20 nm to 40 nm, 20 nm to 50 nm, 20 nm to 60 nm, 20 nm to 70 nm, 20 nm to 80 nm, 20 nm to 90 nm, 20 nm to 100 nm, 20 nm to 125 nm, 20 nm to 150 nm, 30 nm to 40 nm, 30 nm to 50 nm, 30 nm to 60 nm, 30 nm to 70 nm, 30 nm to 80 nm, 30 nm to 90 nm, 30 nm to 100 nm, 30 nm to 125 nm, 30 nm to 150 nm, 40 nm to 50 nm, 40 nm to 60 nm, 40 nm to 70 nm, 40 nm to 80 nm, 40 nm to 90 nm, 40 nm to 100 nm, 40 nm to 125 nm, 40 nm to 150 nm, 50 nm to 60 nm, 50 nm to 70 nm, 50 nm to 80 nm, 50 nm to 90 nm, 50 nm to 100 nm, 50 nm to 125 nm, 50 nm to 150 nm, 60 nm to 70 nm, 60 nm to 80 nm, 60 nm to 90 nm, 60 nm to 100 nm, 60 nm to 125 nm, 60 nm to 150 nm, 70 nm to 80 nm, 70 nm to 90 nm, 70 nm to 100 nm, 70 nm to 125 nm, 70 nm to 150 nm, 80 nm to 90 nm, 80 nm to 100 nm, 80 nm to 125 nm, 80 nm to 150 nm, 90 nm to 100 nm, 90 nm to 125 nm, 90 nm to 150 nm, 100 nm to 125 nm, and 100 nm to 150 nm).

In one non-limiting instance, the alloy includes grain (e.g., at least one grain or a plurality of grains) having a grain length (e.g., an average grain length) of greater than about 100 nm (e.g., greater than about 200 nm, 500 nm, 750 nm, 1000 nm). In another non-limiting instance, the alloy includes a grain (e.g., at least one grain or a plurality of grains) having a grain length (e.g., an average grain length) of from about 20 nm to about 2000 nm (e.g., from 20 nm to 50 nm, 20 nm to 75 nm, 20 nm to 100 nm, 20 nm to 200 nm, 20 nm to 300 nm, 20 nm to 400 nm, 20 nm to 500 nm, 20 nm to 750 nm, 20 nm to 1000 nm, 20 nm to 1500 nm, 50 nm to 75 nm, 50 nm to 100 nm, 50 nm to 200 nm, 50 nm to 300 nm, 50 nm to 400 nm, 50 nm to 500 nm, 50 nm to 750 nm, 50 nm to 1000 nm, 50 nm to 1500 nm, 50 nm to 2000 nm, 75 nm to 75 nm, 75 nm to 100 nm, 75 nm to 200 nm, 75 nm to 300 nm, 75 nm to 400 nm, 75 nm to 500 nm, 75 nm to 750 nm, 75 nm to 1000 nm, 75 nm to 1500 nm, 75 nm to 2000 nm, 100 nm to 75 nm, 100 nm to 100 nm, 100 nm to 200 nm, 100 nm to 300 nm, 100 nm to 400 nm, 100 nm to 500 nm, 100 nm to 750 nm, 100 nm to 1000 nm, 100 nm to 1500 nm, 100 nm to 2000 nm, 250 nm to 75 nm, 250 nm to 100 nm, 250 nm to 200 nm, 250 nm to 300 nm, 250 nm to 400 nm, 250 nm to 500 nm, 250 nm to 750 nm, 250 nm to 1000 nm, 250 nm to 1500 nm, 250 nm to 2000 nm, 500 nm to 75 nm, 500 nm to 100 nm, 500 nm to 200 nm, 500 nm to 300 nm, 500 nm to 400 nm, 500 nm to 500 nm, 500 nm to 750 nm, 500 nm to 1000 nm, 500 nm to 1500 nm, 500 nm to 2000 nm, 750 nm to 75 nm, 750 nm to 100 nm, 750 nm to 200 nm, 750 nm to 300 nm, 750 nm to 400 nm, 750 nm to 500 nm, 750 nm to 750 nm, 750 nm to 1000 nm, 750 nm to 1500 nm, 750 nm to 2000 nm, 1000 nm to 1500 nm, and 1000 nm to 2000 nm).

The grain can have any useful shape (e.g., a columnar shape). The shape can be characterized in any useful manner. In one non-limiting instance, the grain has an aspect ratio defined by a ratio of a first dimension (e.g., a grain diameter, including an average grain diameter) to a second dimension (e.g., a grain length, including an average grain length). The aspect ratio can be determined in any useful manner. In one instance, an aspect ratio is determined for each grain and then each ratio can be used to formulate an average. In another instance, an aspect ratio is determined by employing an average first dimension and an average second dimension. In one non-limiting embodiment, the aspect ratio is a ratio of a grain diameter:grain length. Exemplary aspect ratio includes 1:2 or greater (e.g., 1:3, 1:4, 1:5, 1:6, 1:7, 1:8, 1:9, 1:10, 1:15, 1:20, or greater). Yet other exemplary aspect ratios include that of from about 1:2 to about 1:100 (e.g., from 1:2 to 1:5, 1:2 to 1:10, 1:2 to 1:25, 1:2 to 1:50, 1:2 to 1:75, 1:2 to 1:100, 1:5 to 1:10, 1:5 to 1:25, 1:5 to 1:50, 1:5 to 1:75, 1:5 to 1:100, 1:10 to 1:25, 1:10 to 1:50, 1:10 to 1:75, and 1:10 to 1:100).

In yet another non-limiting embodiment, an average grain diameter of the plurality of columnar grains is less than about 100 nm (or any range described herein), and/or an average grain length of the plurality of columnar grains in greater than about 100 nm (or any range described herein).

In some embodiments, stability of the grain is characterized by minimal grain growth (e.g., at a temperature of from about 300° C. after weeks of exposure). Minimal grain growth can be determined in any useful manner (e.g., a growth less than about 30% of one or more grain dimensions, such as a growth of less than about 20% of one or more grain dimensions). Without wishing to be limited by mechanism, in some instances, the presence of columnar grains may impart resistance to stress-induced grain growth, which in turn may promote ultra-low wear behavior.

Alloys

The present invention relates to an alloy (e.g., a binary alloy) characterized by a base material (e.g., a solvent) and a dopant (e.g., a solute). Exemplary solvents include a metal, such as silver (Ag), aluminum (Al), gold (Au), cobalt (Co), chromium (Cr), copper (Cu), iron (Fe), hafnium (Hf), iridium (Ir), lanthanum (La), manganese (Mn), molybdenum (Mo), niobium (Nb), nickel (Ni), osmium (Os), palladium (Pd), platinum (Pt), rhenium (Re), rhodium (Rh), ruthenium (Ru), scandium (Sc), strontium (Sr), tantalum (Ta), technetium (Tc), thorium (Th), titanium (Ti), vanadium (V), tungsten (W), yttrium (Y), and zirconium (Zr). Exemplary solutes include a metal, such as silver (Ag), aluminum (Al), gold (Au), barium (Ba), beryllium (Be), bismuth (Bi), calcium (Ca), cadmium (Cd), cobalt (Co), chromium (Cr), cesium (Cs), copper (Cu), iron (Fe), gallium (Ga), germanium (Ge), hafnium (Hf), indium (In), potassium (K), lanthanum (La), lithium (Li), magnesium (Mg), manganese (Mn), molybdenum (Mo), sodium (Na), niobium (Nb), nickel (Ni), lead (Pb), palladium (Pd), rubidium (Rb), rhodium (Rh), antimony (Sb), scandium (Sc), tin (Sn), strontium (Sr), tantalum (Ta), thorium (Th), titanium (Ti), thallium (Tl), vanadium (V), tungsten (W), yttrium (Y), zinc (Zn), and zirconium (Zr).

In particular embodiments, the alloy includes one solvent (e.g., any herein) and one solute (e.g., any herein), in which the solvent and the solute are different. The solute can be present in any useful amount. In one non-limiting instance, the solute is present at an amount of about 1 atomic percent (at. %) or greater and/or of from about 1 at. % to about 50 at. % (e.g., from 1 at. % to 10 at. %, 1 at. % to 10 at. %, 1 at. % to 15 at. %, 1 at. % to 20 at. %, 1 at. % to 25 at. %, 1 at. % to 30 at. %, 1 at. % to 35 at. %, 1 at. % to 40 at. %, 1 at. % to 45 at. %, 2 at. % to 10 at. %, 2 at. % to 15 at. %, 2 at. % to 20 at. %, 2 at. % to 25 at. %, 2 at. % to 30 at. %, 2 at. % to 35 at. %, 2 at. % to 40 at. %, 2 at. % to 45 at. %, 2 at. % to 50 at. %, 5 at. % to 10 at. %, 5 at. % to 15 at. %, 5 at. % to 20 at. %, 5 at. % to 25 at. %, 5 at. % to 30 at. %, 5 at. % to 35 at. %, 5 at. % to 40 at. %, 5 at. % to 45 at. %, 5 at. % to 50 at. %, 10 at. % to 15 at. %, 10 at. % to 20 at. %, 10 at. % to 25 at. %, 10 at. % to 30 at. %, 10 at. % to 35 at. %, 10 at. % to 40 at. %, 10 at. % to 45 at. %, 10 at. % to 50 at. %, 15 at. % to 20 at. %, 15 at. % to 25 at. %, 15 at. % to 30 at. %, 15 at. % to 35 at. %, 15 at. % to 40 at. %, 15 at. % to 45 at. %, 15 at. % to 50 at. %, 20 at. % to 25 at. %, 20 at. % to 30 at. %, 20 at. % to 35 at. %, 20 at. % to 40 at. %, 20 at. % to 45 at. %, 20 at. % to 50 at. %, 25 at. % to 30 at. %, 25 at. % to 35 at. %, 25 at. % to 40 at. %, 25 at. % to 45 at. %, 25 at. % to 50 at. %, 30 at. % to 35 at. %, 30 at. % to 40 at. %, 30 at. % to 45 at. %, 30 at. % to 50 at. %, 35 at. % to 40 at. %, 35 at. % to 45 at. %, 35 at. % to 50 at. %, 40 at. % to 45 at. %, 40 at. % to 50 at. %, and 45 at. % to 50 at. %). In another non-limiting instance, the solute is present at of from about 1 vol. % to about 60 vol. % (e.g., from 1 vol. % to 10 vol. %, 1 vol. % to 20 vol. %, 1 vol. % to 30 vol. %, 1 vol. % to 40 vol. %, 1 vol. % to 50 vol. %, 2 vol. % to 10 vol. %, 2 vol. % to 20 vol. %, 2 vol. % to 30 vol. %, 2 vol. % to 40 vol. %, 2 vol. % to 50 vol. %, 2 vol. % to 60 vol. %, 5 vol. % to 10 vol. %, 5 vol. % to 20 vol. %, 5 vol. % to 30 vol. %, 5 vol. % to 40 vol. %, 5 vol. % to 50 vol. %, 5 vol. % to 60 vol. %, 10 vol. % to 20 vol. %, 10 vol. % to 30 vol. %, 10 vol. % to 40 vol. %, 10 vol. % to 50 vol. %, 10 vol. % to 60 vol. %, 15 vol. % to 20 vol. %, 15 vol. % to 30 vol. %, 15 vol. % to 40 vol. %, 15 vol. % to 50 vol. %, 15 vol. % to 60 vol. %, 20 vol. % to 30 vol. %, 20 vol. % to 40 vol. %, 20 vol. % to 50 vol. %, 20 vol. % to 60 vol. %, 25 vol. % to 40 vol. %, 25 vol. % to 50 vol. %, 25 vol. % to 60 vol. %, 30 vol. % to 40 vol. %, 30 vol. % to 50 vol. %, 30 vol. % to 60 vol. %, 35 vol. % to 40 vol. %, 35 vol. % to 50 vol. %, 35 vol. % to 60 vol. %, 40 vol. % to 50 vol. %, 40 vol. % to 60 vol. %, 45 vol. % to 50 vol. %, 45 vol. % to 60 vol. %, and 50 vol. % to 60 vol. %).

In particular embodiments, the alloy includes Pt and Au. In certain embodiments, the alloy displays high aspect ratio grain structures having grain diameters <100 nm and with >50% of the Au segregated to grain boundaries. In other embodiments, the alloy possesses nanocrystalline structures of high thermodynamic stability, which in turn provides materials having unprecedented thermo-mechanical stability and other beneficial physical characteristics.

Exemplary characteristics include low specific wear rates (e.g., less than about $1 \times 10^{-8}$ mm$^3$/N-m), low friction coefficients (e.g., of from about 0.2 to about 0.3), low resistivity (e.g., in the range of about $10^{-8}$ $\Omega \cdot$m), and/or high endurance limit (e.g., numerous cycling even at high stress).

In particular embodiment, the alloy is a binary alloy. Exemplary binary alloys include Ag—La, Ag—Sc, Ag—Y, Ba—Pd, Ba—Pt, Be—Ti, Bi—Pd, Ca—Pt, Cd—Pd, Co—Al, Co—As, Co—Ga, Co—Ge, Co—Hf, Co—Nb, Co—Sc, Co—Ta, Co—Ti, Co—Y, Co—Zr, Cr—Pt, Cu—Sc, Fe—Al, Fe—As, Fe—Hf, Fe—Zr, Hf—Bi, Hf—Co, Hf—Ni, Hf—Os, Hf—Re, Hf—Tl, Ir—Ge, La—Ag, La—Ir, La—Rh, La—Zn, Mn—Ga, Mn—Pd, Mn—Sb, Nb—Co, Nb—Ni, Nb—Re, Nb—Sb, Ni—Ga, Ni—Ge, Ni—Hf, Ni—La, Ni—Nb, Ni—Ta, Ni—Th, Ni—Y, Os—As, Os—V, Os—Y, Pt—Bi, Pt—Mn, Re—As, Re—Hf, Re—Nb, Re—Ta, Re—Ti, Rh—Sb, Rh—Sn, Rh—Zn, Ru—Ga, Ru—La, Ru—V, Ru—Y, Sc—Ag, Sc—Ni, Sc—Os, Sc—Ru, Sc—Tc, Sn—Pd, Sr—Pd, Sr—Pt, Ta—Ga, Ta—Ni, Ta—Re, Ta—Sb, Tc—La, Tc—Th, Tc—Y, Th—Ir, Th—Rh, Ti—Be, Ti—Bi, Ti—Co, Ti—Ni, Ti—Pb, Ti—Sn, Ti—Zn, V—Ru, V—Sb, V—Tc, W—As, W—Si, Y—Ag, Y—Ir, Y—Rh, Y—Zn, Zn—Hf, Zn—La, Zn—Sc, Zn—Y, Zr—Be, Zr—Co, Zr—Ni, and Zr—Re.

Further exemplary binary alloys (e.g., having nanocrystalline metastability) include Fe—Sc, Hf—Ag, Ir—Cd, Ir—Cr, Ir—In, Ir—Mg, Ir—Mn, Ir—Sb, Ir—Zn, La—Au, Mo—Al, Mo—Ge, Mo—Pd, Nb—Ga, Nb—Sn, Nb—Zn, Ni—In, Ni—Mg, Ni—Zn, Os—Ga, Os—Ge, Os—P, Os—Zn, Pd—Mn, Pt—K, Pt—Na, Pt—Tl, Re—Al, Re—Ga, Re—Ge, Re—Sc, Rh—Bi, Rh—Cd, Rh—In, Rh—Mg, Rh—Mn, Rh—Tl, Ru—Ge, Ru—Mg, Ru—Zn, Sc—Cu, Ta—Al, Ta—Fe, Ta—Sn, Ta—Zn, Tc—Ge, Tc—V, Tc—Zn, Ti—Cd, Ti—In, V—Ga, W—Al, W—Ge, W—Hf, W—Ir, W—Pt, W—Zr, Zr—Ag, and Zr—Cu.

Yet other exemplary alloys include Al—Pb, Al—Zn, Co—Cd, Co—Cu, Co—Pd, Cu—Ag, Cu—Bi, Cu—Pb, Cu—Y, Fe—Ag, Fe—Au, Fe—Cu, Fe—In, Fe—Mg, Hf—Mg, Hf—Sc, Hf—Ti, Ir—Ag, Ir—Au, Ir—Cu, Ir—Ni, Ir—Pd, Ir—Rh, La—Ba, La—Ca, La—Cr, La—Li, Mn—Cd, Mo—Au, Mo—Cr, Mo—Sc, Nb—Bi, Nb—Cu, Nb—Zr, Ni—Ag, Ni—Au, Ni—Cu, Ni—Pb, Ni—Sn, Ni—Tl, Os—Ag, Os—Cu, Os—Ni, Os—Pd, Os—Rh, Pd—Au, Pt—Au, Pt—Pd, Re—Cu, Re—Ni, Re—Pd, Re—Rh, Rh—Ag, Rh—Au, Rh—Co, Rh—Cu, Rh—Ni, Rh—Pd, Ru—Ag, Ru—Cu, Ru—Ni, Ru—Pd, Ru—Rh, Sc—Au, Sc—Ba, Sc—Cr, Sc—Cu, Sc—Sr, Sr—Mn, Ta—Bi, Ta—Cu, Ta—Hf, Ta—In, Ta—Zr, Tc—Cu, Tc—Ni, Tc—Pd, Th—Cr, Th—La, Th—Mo, Th—Sc, Th—Ti, Th—V, Th—Y, Ti—Ca, Ti—K, Ti—

La, Ti—Mg, Ti—Sc, V—Cd, V—Cu, V—Sc, W—Au, W—Cr, W—Cu, W—Sb, W—Sc, W—Th, W—Y, Y—Ba, Y—Ca, Y—Cr, Y—Sr, Y—Tl, Y—V, Zr—Cs, Zr—K, Zr—Mg, Zr—Sc, Zr—Ti, and Zr—Y.

In particular embodiments, the alloy includes one or more of the following: Hf, La, Mo, Nb, Ni, Os, Pt, Re, Rh, Ru, Ta, Tc, Ti, V, W, Y, and Zr (e.g., as a solvent). In other embodiments, the alloy includes one or more of the following: Ag, Al, Au, Ba, Be, Bi, Ca, Cd, Co, Cr, Cs, Cu, Fe, Ga, Ge, In, K, La, Li, Mg, Mn, Na, Ni, Pb, Rb, Sb, Sc, Sn, Sr, Th, Tl, Y, Zn, and Zr (e.g., as a solute).

Methods and Uses Thereof

The alloy and coating herein can be formed and used in any useful manner. In some embodiments, the alloy can be used as a coating (e.g., a contact coating). These coatings can be deposited using various physical vapor deposition routes, including sputtering (e.g., magnetron sputtering), atomic layer deposition, pulsed laser deposition, and electron beam deposition; chemical vapor deposition routes; electrodeposition routes, including electroplating; plating routes, including electroless plating; thermal spraying routes, including cold spray; and other deformation-based techniques, such as equal channel angular pressing, high-pressure torsion, rapid forging, and surface mechanical attrition treatment. The coating may be further treated (e.g., annealed and/or processed).

Other methods include forming a thin film (e.g., by depositing an alloy on a substrate, such as in any deposition routes described herein) and optionally annealing the film or alloy (e.g., at a temperature greater than about 300° C.). In some embodiments, the methods can be optimized to achieve a particular microstructure (e.g., a plurality of columnar grains).

Methods herein can also include forming a device or a component thereof. In one non-limiting embodiment, the method includes forming an electrical contact (e.g., by depositing an alloy on a substrate and optionally annealing the alloy at a temperature greater than about 300° C.). Further steps can be included to process a surface of the contact, e.g., by exposing the film to a current source or to a heat source, thereby removing one or more insulating species from a surface of the film. If the electrical contact is formed from an alloy that preserves its nanocrystallinity and/or microstructure at high currents and/or high temperature, then the exposure step provides a simplified way to clean an electrical contact surface from debris without negatively impacting the wear parameters of the contact.

The alloys herein can be employed in any useful form (e.g., a thin film) and in any useful device (e.g., a device component, such as an electrical contact, including sliding electrical contacts). In particular embodiments, the alloys herein provide enhanced wear characteristics even as a thin film. Thus, function can be retained even at reduced thickness of the coating.

Reduced thickness coating can have any useful thickness (e.g., greater than about 100 nm and/or less than about 5 μm, as well as any range described herein).

EXAMPLES

Example 1: Achieving Ultra-Low Wear with Nanocrystalline Metals

Precious metal electrical contacts are essential to the operation of a wide range of devices, from switches in cell phones to slip rings in wind turbines and spacecraft. One important characteristic of these components is wear resistance. More than a century of scientific research on the tribological behavior of materials, and specifically metals, has led to the discovery of intrinsic connections between atomic-scale mechanisms of deformation and their friction and wear behavior at the macro-scale. Concurrently, the development of new thermodynamic routes to achieve stable nanocrystallinity in metals created a unique opportunity to improve the efficiency and reliability of electrical contact technology. Herein, we show that alloys of Pt and Au, predicted to have nanocrystalline structures with high thermodynamic stability, also achieve unprecedented mechanical stability. We show that these alloys have wear rates similar to state-of-the-art non-conductive materials such as diamond-like carbon, and 100× lower rates than any reported nanocrystalline alloy, while exhibiting friction coefficients (μ~0.2-0.3) similar to polytetrafluoroethylene nanocomposites. This work both demonstrates the technological impact potential of nanostructured metals with highly stable grain structures, and also highlights the challenges ahead in the study of grain size stability in nanocrystalline materials.

Nanocrystalline metals have been shown to have desirable mechanical properties (see, e.g., Kumar K S et al., "Mechanical behavior of nanocrystalline metals and alloys," *Acta Mater.* 2003; 51(19):5743-74; and Meyers M A, "Mechanical properties of nanocrystalline materials," *Prog. Mater. Sci.* 2006; 51(4): 427-556), including high strength, low friction, and high wear resistance (see, e.g., Schuh C A, "Hall-Petch breakdown manifested in abrasive wear resistance of nanocrystalline nickel," *Scripta Mater.* 2002; 46(10):735-40; Sawyer W G et al., "Mechanistic studies in friction and wear of bulk materials," *Annu. Rev. Mater. Res.* 2014; 44:395-427; and Argibay N et al., "Linking microstructural evolution and macro-scale friction behavior in metals," *J. Mater. Sci.* 2017; 52(5):2780-99), though inherently high grain boundary curvature creates a strong driving force for grain growth and severely limits their usefulness in engineering applications.

Recently developed theoretical models suggest new routes for achieving stable nanocrystallinity through alloying (see, e.g., Murdoch H A et al., "Stability of binary nanocrystalline alloys against grain growth and phase separation," *Acta Mater.* 2013; 61(6):2121-32; Chookajorn T et al., "Design of stable nanocrystalline alloys," *Science* 2012; 337(6097):951-4; Weertman J R, "Retaining the nano in nanocrystalline alloys," *Science* 2012; 337(6097):921-2; and Koch C C et al., "Stabilization of nanocrystalline grain sizes by solute additions," *J. Mater. Sci.* 2008; 43(23):7264-72). Unlike traditional metallurgical approaches for stabilizing grain structures by retarding grain growth kinetics (see, e.g., Driver J H, "Stability of nanostructured metals and alloys," *Scripta Mater.* 2004; 51(8):819-23; Worner C H et al., "Grain growth stagnation by inclusions or pores," *JOM* 1992; 44(9):16-20; and Hillert M, "Inhibition of grain growth by second-phase particles," *Acta Metall.* 1988; 36(12):3177-81), these models rely on driving interfacial free energy effectively to zero via grain boundary solute segregation (see, e.g., Murdoch H A et al., *Acta Mater.* 2013; 61(6):2121-32; Chookajorn T et al., *Science* 2012; 337 (6097):951-4; Weissmüller J, "Alloy effects in nanostructures," *Nanostructured Mater.* 1993; 3(1-6):261-72; and Kirchheim R, "Grain coarsening inhibited by solute segregation," *Acta Mater.* 2002; 50(2):413-9). Herein, we present evidence of remarkable thermo-mechanical nanocrystalline stability for an exemplary noble metal alloy system ($Pt_{0.90}Au_{0.10}$), and the impact that mitigating grain growth can have on the wear and friction of nanocrystalline metals.

If stresses at asperity contacts do not regularly exceed the flow stress of the sliding metals, as can occur with nanocrystalline metals, wear becomes primarily a fatigue-dominated process (see, e.g., Suh N P, "An overview of the delamination theory of wear," *Wear* 1977; 44(1):1-16). Fatigue wear depends on the formation of cracks through repeated cycling of contact stress, leading to the formation of wear particles via cohesive failure. This often occurs at such slow rates that this regime is categorized as the "delamination wear regime." Persistent nanocrystallinity is directly related to low friction and wear in metals through a feedback loop that drives microstructural evolution (see, e.g., Argibay N et al., *J. Mater. Sci.* 2017; 52(5):2780-99).

Alloying is a classic approach to stabilizing grain structures in metals (see, e.g., Murdoch H A et al., *Acta Mater.* 2013; 61(6):2121-32; Chookajorn T et al., *Science* 2012; 337(6097):951-4; Weertman J R, *Science* 2012; 337(6097): 921-2; Weissmüller J, *Nanostructured Mater.* 1993; 3(1-6): 261-72; Kirchheim R, *Acta Mater.* 2002; 50(2):413-9; and Kirchheim R, "Reducing grain boundary, dislocation line and vacancy formation energies by solute segregation: I. Theoretical background," *Acta Mater.* 2007; 55(15):5129-38). Solute drag can retard the motion of grain boundaries (see, e.g., Cahn J W, "The impurity-drag effect in grain boundary motion," *Acta Metall.* 1962; 10(9):789-98; and Hillert M et al., "A treatment of the solute drag on moving grain boundaries and phase interfaces in binary alloys," *Acta Metall.* 1976; 24(8):731-43) and the formation of second phase precipitates can lead to Zener pinning of boundaries (see, e.g., Worner C H et al., *JOM* 1992; 44(9):16-20; and Hillert M, *Acta Metall.* 1988; 36(12):3177-81).

Recently developed thermodynamics models suggest new routes for achieving stable nanocrystallinity through alloying (see, e.g., Murdoch H A et al., *Acta Mater.* 2013; 61(6):2121-32; Chookajorn T et al., *Science* 2012; 337 (6097):951-4; Weertman J R, *Science* 2012; 337(6097):921-2; and Koch C C et al., *J. Mater. Sci.* 2008; 43(23):7264-72). In accordance with the Gibbs adsorption equation, the preferential segregation of solute to grain boundaries (GBs) when the chemical potential is increased at a fixed temperature and pressure leads to a reduction of the boundary energy, and thus the driving force for grain growth. If the energy advantage from segregation is strong enough, substantial reductions or possible elimination of the thermodynamic driving force for grain growth can be achieved. This will lead to either a reduction of grain growth kinetics or the thermodynamic stabilization of the nanocrystalline grain structure. This effect will be greatest in alloys with strong boundary segregation conditions that render segregated grain boundaries energetically preferable to solid solutions or second phases.

Pt—Au alloys were identified by Murdoch and Schuh (see, e.g., Murdoch H A et al., "Estimation of grain boundary segregation enthalpy and its role in stable nanocrystalline alloy design," *J. Mater. Res.* 2013; 28(16):2154-63) as one of several potentially thermodynamically stable alloys (see, e.g., Chookajorn T et al., *Science* 2012; 337(6097):951-4). This system has a positive enthalpy of mixing which leads to a substantial miscibility gap in the phase diagram. Experimentally, these alloys have the advantage that the constituent materials are available in high purity, and their shared nobility obviates the added complexity of oxide formation on the analysis of grain boundary stability. In previous studies on non-noble nanocrystalline systems, oxygen uptake has been noted as a key confounding factor (see, e.g., Clark B G et al., "Thermal stability comparison of nanocrystalline Fe-based binary alloy pairs," *JOM* 2016; 68(6): 1625-33; and Gianola D S et al., "Grain-size stabilization by impurities and effect on stress-coupled grain growth in nanocrystalline Al thin films," *Mater. Sci. Eng. A* 2008; 483-484:637-40). Also, a relatively small elastic mismatch of 4% between Pt and Au minimizes the role of lattice strain on segregation behavior.

Figure 1B:
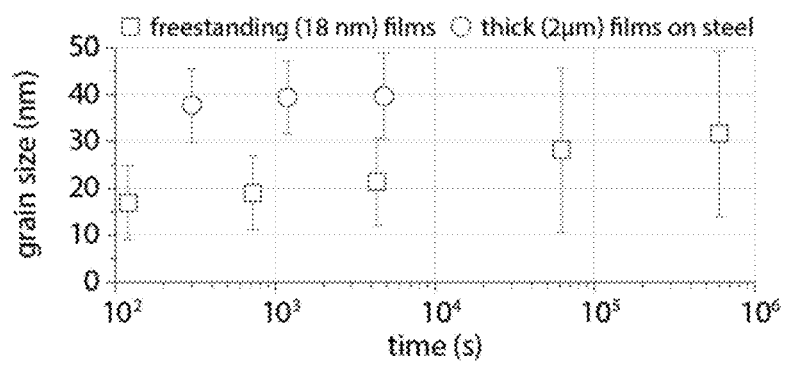

Results of thermal grain growth experiments on magnetron sputtered Pt—Au (10 at. % Au) are presented in FIG. 1A-1B, including in situ X-ray diffraction (XRD) and ex situ interrupted transmission electron microscopy (TEM) measurements of grain size for annealed specimens exposed to 500° C. and 700° C. Both 18 nm thick freestanding films as well as ~2 μm thick films on oxidized Si wafers were annealed, and are referred to as "thin" and "thick" films, respectively with respect to this Example only. These annealing temperatures represent homologous values $T/T_m$ of ~0.4 and 0.5 relative to the equilibrium solidus temperature (~1660° C.), a regime where grain growth is rampant for pure metal systems with nanoscale grain structures (see, e.g., Thompson C V, "Grain growth in thin films," *Annu. Rev. Mater. Sci.* 1990; 20:245-68). While the experimental grain growth in FIG. 1 is small, it is important to recognize that there are confounding factors that would otherwise act to cause stagnation of normal grain growth in columnar films (see, e.g., Thompson C V, *Annu. Rev. Mater. Sci.* 1990; 20:245-68).

Figure 1C:
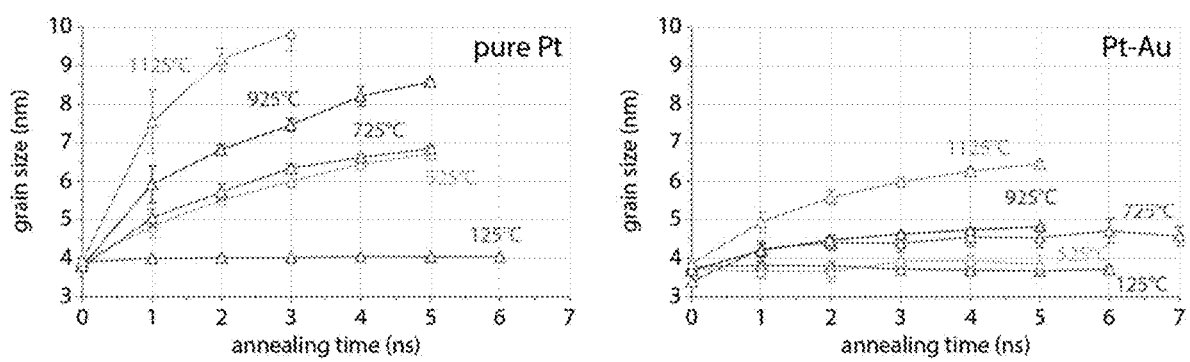

In FIG. 1C, we show the result of grain growth simulations using equiaxed microstructures at varying temperature, comparing pure Pt and Pt—Au. Details for the simulations are discussed herein, but it is clear that these simulations are in qualitative agreement with experiments showing negligible grain growth for this alloy up to 525° C.

Figure 1D:
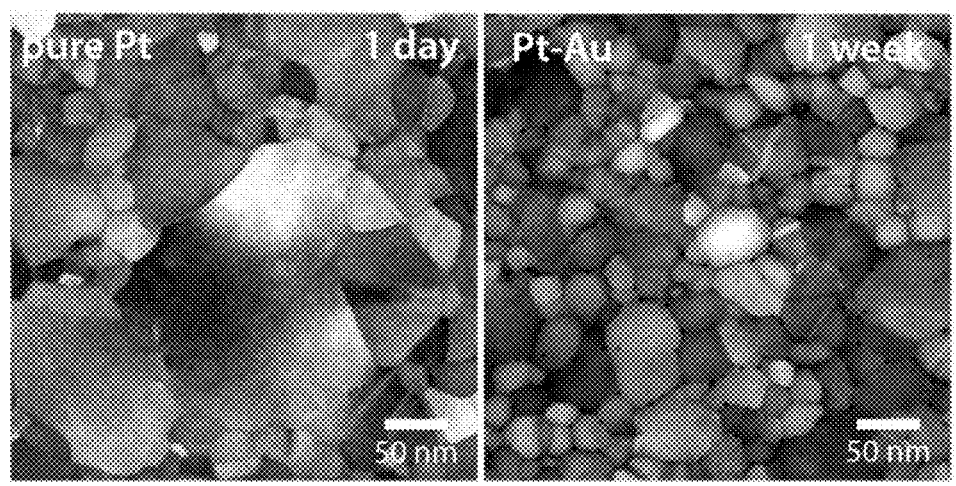
Figure 1E:
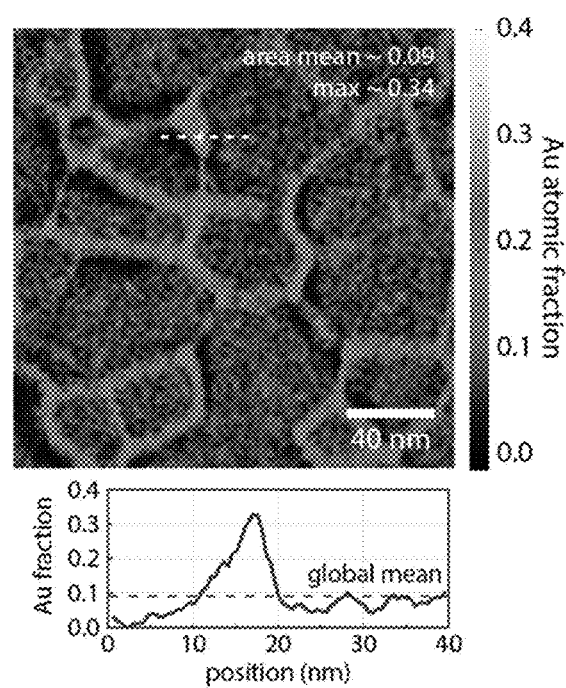

In FIG. 1D, we show representative plan-view TEM images of pure nanocrystalline Pt and Pt—Au thin films at varying stages of annealing, and a plan view composition map of a thick Pt—Au film is shown in FIG. 1E. Typical of magnetron sputter-deposited metal films, all thick films used in this study had a columnar structure with large grain aspect ratios. Thus, for the thick films in annealing and mechanical testing, the reported grain sizes are the average columnar grain diameters based on plan-view images of films sectioned near the middle of the film thickness. In situ X-ray diffraction annealing data suggests a stable grain size of 40-50 nm at temperatures up to 600° C. In both the thin and thick films, we found that Au segregated to grain boundaries and free surfaces, with highly heterogeneous distributions. Details of annealing investigations and additional data are provided in Example 2.

Equilibrium atomistic (non-lattice) Monte Carlo (MC) simulations were employed to predict the segregation of Au in a Pt—Au alloy. These simulations model the interatomic interactions by an embedded atom method (EAM) potential that predicts a bulk phase diagram in good agreement with experiment. A Metropolis MC algorithm is used to sample off-lattice thermal equilibrium configurations (see, e.g., Seki A et al., "Monte Carlo simulations of segregation at [001] twist boundaries in a Pt(Au) alloy-I. Results," *Acta Metall. Mater.* 1991; 39(12):3167-77; and Foiles S M, "Calculation of grain-boundary segregation in Ni—Cu alloys," *Phys. Rev. B* 1989; 40:11502-6). Note that since the procedures allow interchanges between distant atoms, this method does not reflect the kinetic pathways that the physical system will take to reach equilibrium. However, the results are representative of equilibrium compositional arrangements. Consistent with the bulk phase diagram, there are only dilute levels of Au in the grain interiors (see Example 2 herein, and exemplary columnar microstructure in FIG. 2D). The Au forms clusters in the structure, some at triple junctions and others within grain boundaries. Significantly, the Au clusters only occur on a subset of the grain boundaries, suggesting that the tendency towards segregation varies between boundaries.

FIG. 1C shows the evolution of the grain size for molecular dynamics anneals of the grain structures at temperatures ranging from 125° C. to 1125° C. The initial grain structure of the Pt was the result of a high-temperature anneal of a Voronoi grain construction that reduced the number of grains to approximately half of the initial structure. The alloy cases started with the same initial configuration as the pure Pt case with Au atoms added and segregated via the MC simulations. There is a slight structural relaxation during the MC simulation, so the initial grain structures are similar but not identical. The grain size is determined through cluster labelling that identifies and counts the number of grains in the sample. For the case of pure Pt, there is significant grain growth, whereas for the simulations with segregated Au the grain size is essentially unchanged below about 525° C., consistent with the experiments in FIG. 1A-1B.

Figure 2A:
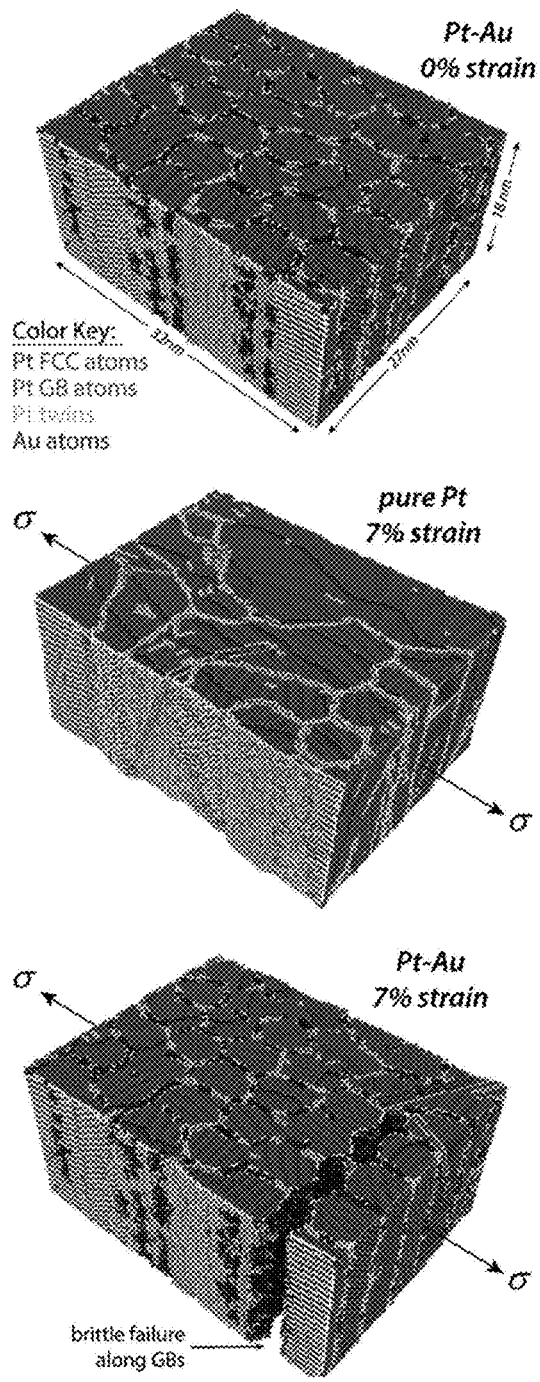
FIG. 2A-2D provides experimental and simulation data for stress-strain measurements in pure Pt and Pt—Au films. Provided are snapshot images at 0 and 7% of uniaxial stress-strain molecular dynamics (MD) simulations (FIG. 2A), in which the initial grain structures of Pt and Pt—Au were identical. Stress-driven grain growth was observed with pure Pt, while the Pt—Au showed negligible grain growth until brittle fracture. Atoms are classified by a combination of common neighbor analysis and the centrosymmetry parameter, such that Pt and Au atoms in a local face-centered-cubic (FCC) environment are colored blue and red, respectively; Pt twins are yellow and Pt at grain boundaries (GBs) and surfaces are gray. Provided is a graph showing tensile specimen fatigue experiments on freestanding, columnar grained 5 μm thick films of Pt—Au (FIG. 2B). These films show evidence of a relatively high endurance limit of about 1 GPa compared to other metals (see, e.g., Padilla II H A et al., "A review of fatigue behavior in nanocrystalline metals," Exp. Mech. 2010; 50(1):5-23). Because applied contact stresses were below the endurance limit of these films, inhibition of stress-driven grain growth and plastic deformation may have mitigated delamination wear (see, e.g., Suh N P, Wear 1977; 44(1): 1-16), dramatically reducing wear rate. Also provided is a graph showing experimental stress-strain data for 5 μm thick freestanding films of highly columnar through-the-thickness nanocrystalline pure Pt and Pt—Au (FIG. 2C). Finally, provided is a MD simulation of uniaxial tension stress-strain data for columnar grained nanocrystalline pure Pt and Pt—Au (FIG. 2D), corresponding to the simulation snapshots shown in FIG. 2A.

The most notable consistency between the experimental microstructures and computational segregation calculations is that the distribution of Au is not uniform along the grain boundaries but rather occurs in clusters (FIG. 1E, FIG. 2A and Example 2, herein). In both cases, many of the clusters occur at triple junctions. For those grain boundaries where segregation occurs, Au is not dispersed uniformly along the boundary, but rather is localized to specific spots. In addition, many grain boundaries had minimal segregation. The qualitative similarities between the experimental and simulation results provide strong support to the assertion that alloy segregation to the grain boundary network is highly heterogeneous both within any given boundary as well as between boundaries of different types.

The avoidance of oxides in these noble alloys offers a uniquely simplified view of grain stabilization by solute segregation, as compared to any prior study of which we are aware. However, this study also highlights some important caveats. For example, differences in the degree of heterogeneity and bulk concentrations of Au were found between the thin and thick film experimentally, and the thick film more closely corresponds to MC simulations of bulk material with periodic boundary conditions. Thus, artifacts found in thin film annealing experiments associated with free surfaces and thin film-related geometrical features, such as preferential segregation to the surface or grain boundary grooves, are currently not captured in the MC simulations. The present simulations are meant to explore thermal equilibrium only, and so do not reflect the kinetic pathways in the physical system, nor the destabilizing impact of preferential free surface segregation. We note, however, that while free surfaces and grooves do allow for a higher degree of heterogeneity in the thin film samples (see Example 2), surfaces will in fact destabilize the structure by allowing depletion of pinning sites in interior boundaries. The fact that we find such notable stability in these samples indicates that this effect is likely small.

Additionally, models based on the assumption of uniform boundary properties predict alloy combinations that should possess intrinsically stable nanocrystalline grain structures. Attempts to demonstrate this experimentally have shown only enhanced, not perfect, stability (see, e.g., Clark B G et al., *JOM* 2016; 68(6): 1625-33). The simplification of homogeneous boundary properties has proven useful in pointing to the possibility of thermodynamic stabilization of grain structures via grain boundary segregation, as well as in the screening of potential alloy systems of interest. Clearly, to improve predictive fidelity, future models could incorporate segregation heterogeneity across boundary types and at triple junctions.

A second implication of heterogeneous segregation is the possibility that it may contribute to abnormal grain growth (see, e.g. Darling K A et al., "Grain size stabilization of nanocrystalline copper at high temperatures by alloying with tantalum," *J. Alloys Compd.* 2013; 573:142-50; Korznikov A V et al., "Thermal stability of nanocrystalline Ni," *Acta Physica Polonica A* 2002; 102(2):265-71; and Wang N et al., "Isokinetic analysis of nanocrystalline nickel electrodeposits upon annealing," *Acta Mater.* 1997; 45(4):1655-69), since differently-segregated boundaries may have different mobilities (either under temperature or stress). This could open a pathway toward crack formation (see, e.g., Boyce B L et al., "Anomalous fatigue behavior and fatigue-induced grain growth in nanocrystalline nickel alloys," *Metall. Mater. Trans. A* 2011; 42(7):1793-804) and delamination wear (see, e.g., Suh N P, Wear 1977; 44(1):1-16) in cyclically stressed materials.

Figure 2B:
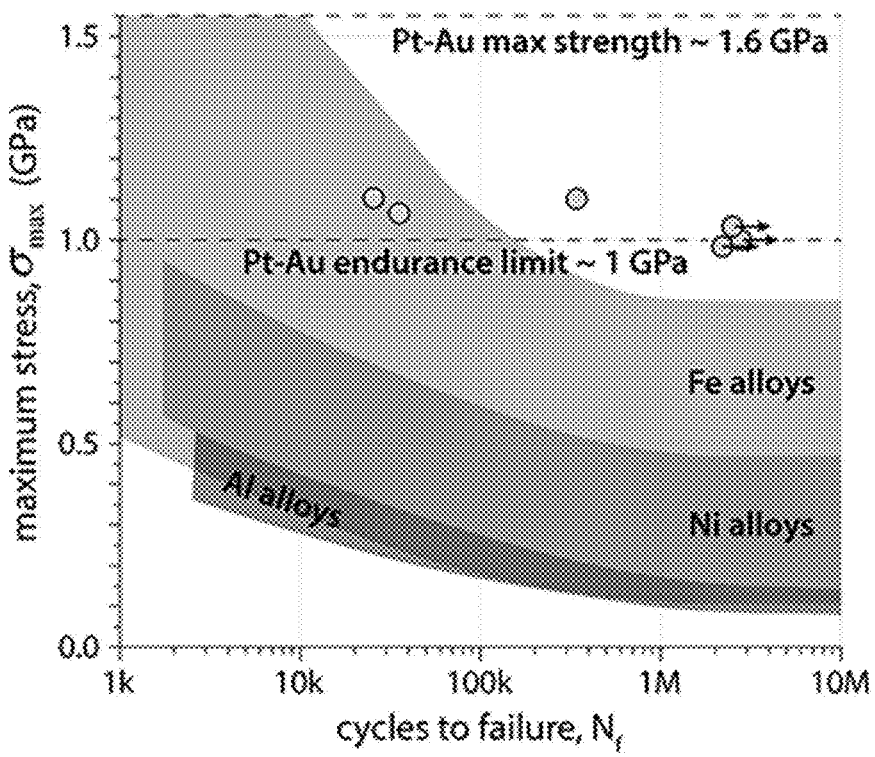

Recent simulations and experiments (see, e.g., Holm E A et al., "On abnormal subgrain growth and the origin of recrystallization nuclei," *Acta Mater.* 2003; 51(9):2701-16; and Jung S H et al., "Mechanism of abnormal grain growth in ultrafine-grained nickel," *Acta Mater.* 2013; 61(15):5685-93) have indicated that heterogeneous boundary properties can facilitate abnormal grain growth, which has indeed been observed in many nanocrystalline alloys (see, e.g., Jung S H et al., *Acta Mater.* 2013; 61(15):5685-93; and Sansoz F et al., "Grain growth behavior at absolute zero during nanocrystalline metal indentation," *Appl. Phys. Lett.* 2006; 89:111901 (3 pp.)). However, we performed cyclic fatigue tests using 5 μm thick freestanding columnar grained Pt—Au dogbones in tension (FIG. 2B) and found no failure up to $3 \times 10^6$ cycles, implying a remarkably high endurance limit for these materials at maximum stresses above 1 GPa (fatigue tests were performed using force-control with an R-ratio of 0.3 and a frequency of 30 Hz—further details in Example 2). In FIG. 2B, arrows indicate where the experiment concluded with no fatigue failure.

Figure 2C:
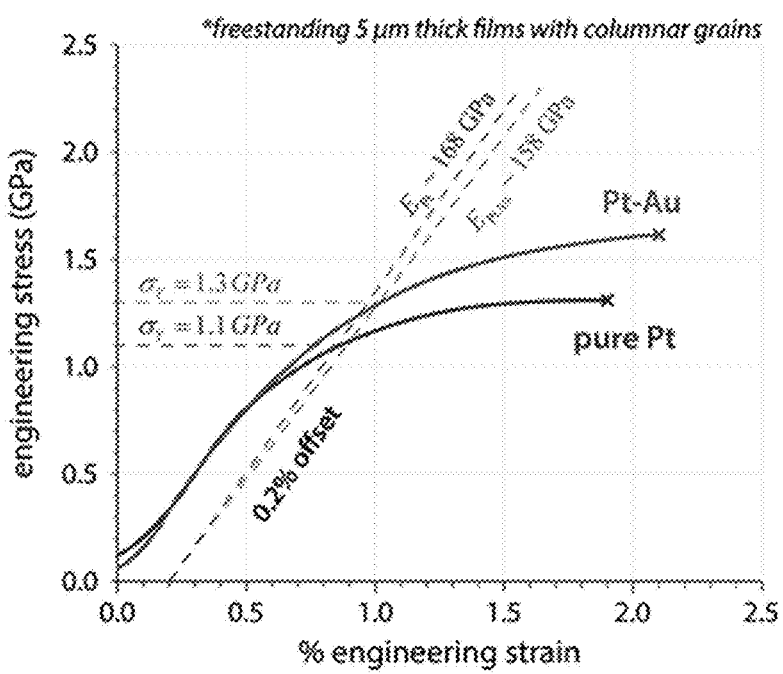
Figure 2D:
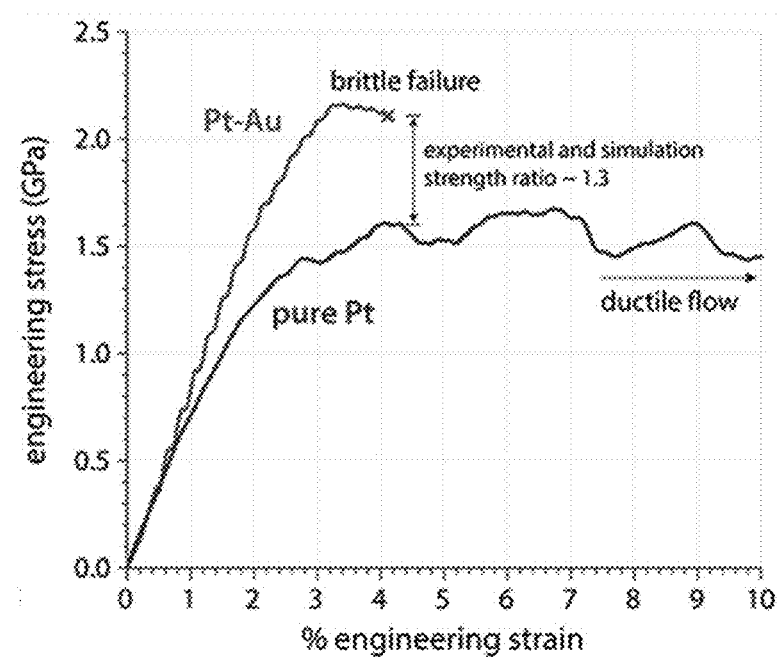

A comparison of uniaxial tension experiments and simulations using columnar grained structures is shown in FIG. 2C-2D. Brittle failure of the nanocrystalline Pt—Au was observed in experiments and simulations, and a max strength ratio of 1.3 (as compared to the pure Pt samples) measured for both. As expected, the smaller grains in the simulations (5 nm compared to 50 nm in the tensile specimens) leads to higher strength, and the higher strain rates in the simulation lead to higher ductility (details in Example 3). However, the simulations are a valuable means of determining the atomic-scale mechanisms responsible for the strength and deformation behavior of these materials. For example, FIG. 2A shows that the pure Pt undergoes significant stress-driven grain growth, compared to the negligible grain growth of the Pt—Au alloy up to 7% strain. In addition, brittle fracture of the Pt—Au alloy along grain boundaries was obvious at approximately 4% strain. In FIG. 2A, we present snapshots at 7% where the crack is clearly visible in the Pt—Au, as is the grain growth and ductile flow of the pure Pt.

Figure 3A:
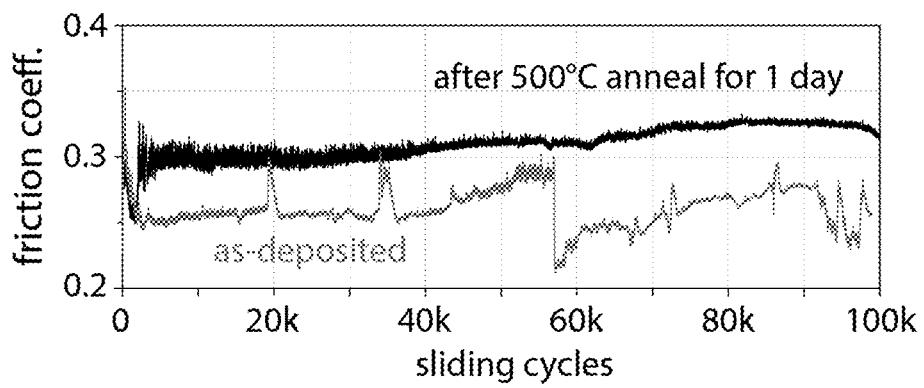
FIG. 3A-3D provides wear and friction data for an exemplary Pt—Au film. Provided is a graph showing representative cycle-average friction coefficient data for 3.2 mm diameter sapphire spheres sliding against as-deposited and annealed ~2 μm thick Pt—Au films on steel substrates (FIG. 3A). Also provided is an average cross-sectional profile of the 1 mm long wear track (FIG. 3B), having a measured specific wear rate after $10^5$ cycles of sliding (using a 1 N contact force and 1 mm/s sliding speed) of $3\times10^{-9}\pm1\times10^{-9}$ mm$^3$/Nm. Provided is a graph (FIG. 3C) comparing state-of-the-art in tribological materials (see, e.g., Sawyer W G et al., "Mechanistic studies in friction and wear of bulk materials," Annu. Rev. Mater. Res. 2014; 44:395-427; Erdemir A et al., "Tribology of diamond-like carbon films: recent progress and future prospects," J. Phys. D. Appl. Phys. 2006; 39(18):R311-R327; Slade P G (ed.), "Electrical Contacts: Principles and Applications," (Marcel Dekker, Inc., New York, N.Y., 1999); Rupert T J et al., "Sliding wear of nanocrystalline Ni—W: structural evolution and the apparent breakdown of Archard scaling," Acta Mater. 2010; 58(12):4137-48; and Scharf T W et al., "Friction and wear mechanisms in MoS$_2$/Sb$_2$O$_3$/Au nanocomposite coatings," Acta Mater. 2010; 58(12):4100-9) and Pt—Au, including highly wear resistant but electrically non-conductive materials such as diamond-like carbon, MoS$_2$ nanocomposites, and polytetrafluoroethylene (PTFE) nanocomposites. Finally, provided is a representative cross-sectional STEM-HAADF image (FIG. 3D) inside the wear track, corresponding to data shown in FIG. 3B, which reveals negligible impact on the microstructure of the film even at these relatively high applied stresses and sliding cycles.

The implications of nanocrystalline mechanical stability are most clearly evident in the friction and wear behavior of these films, demonstrated here by sliding a 3.2 mm diameter sapphire sphere against a ~2 μm thick Pt—Au film on a 303 stainless steel substrate in laboratory air (<20% relative humidity, 20° C.). A normal force of 1 N was applied to the contact, corresponding to a Hertzian maximum stress of 1.1 GPa, approximately equal to the endurance limit from fatigue testing of films with similar columnar grain structure. Using a stroke length of 1 mm in bi-directional sliding at 1 mm/s, we find that friction coefficients are in the range i=0.2 to 0.3 for $10^5$ sliding passes ($5\times10^4$ bi-directional cycles). To demonstrate the combined thermo-mechanical stability of Pt—Au, we annealed a specimen in ultra-high vacuum for 1 day at 500° C., and again measured friction and wear over an equivalent number of cycles; the cycle average friction coefficient data for both is plotted in FIG. 3A. The specific wear rates were identical for both tracks, with a value of K=$3\times10^{-9}\pm1\times10^{-9}$ mm$^3$/N·m.

Figure 3B:
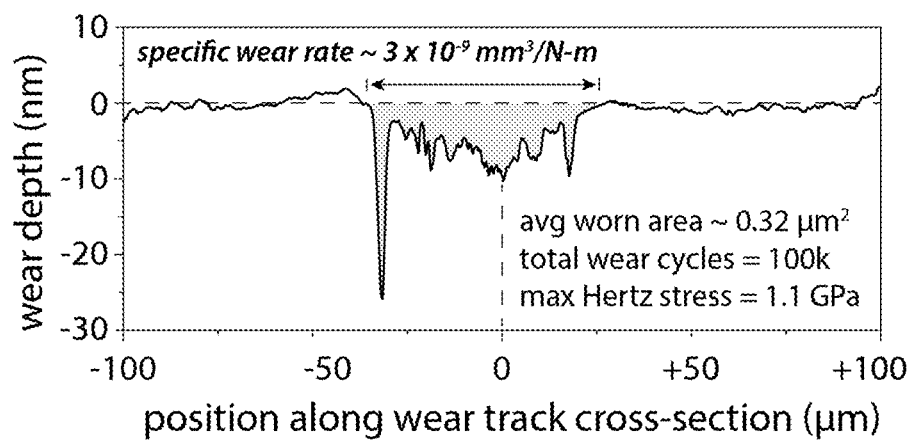
Figure 3C:
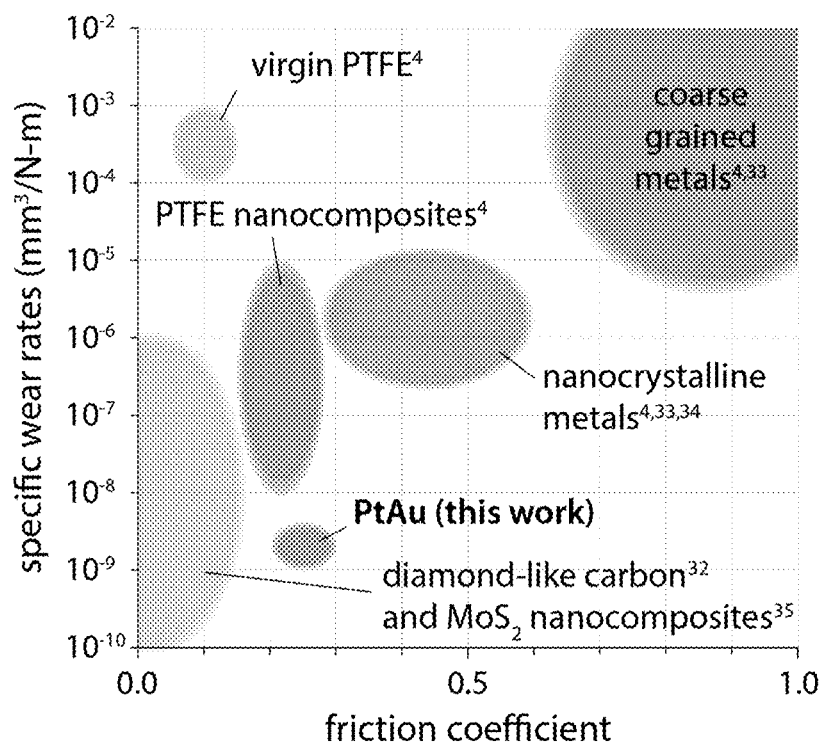

Specific wear rates and wear rate uncertainty were based on a volumetric material loss method (see, e.g., Schmitz T L et al., "Wear-rate uncertainty analysis," *Trans. ASME J. Tribol.* 2004; 126(4):802-8), where a scanning white light interferometer (Bruker Contour GT) was used to measure the entirety of each wear track. An example average cross-section of a wear track after 100 k passes is shown in FIG. 3B. Multiple tests were performed to confirm the consistency of the friction and wear results. We illustrate where the friction and wear performance of Pt—Au lies with respect to the state-of-the-art for a cross-section of all materials in FIG. 3C, including less stable nanocrystalline metals and non-conductive polymer and ionic solid nanocomposites (see, e.g., Sawyer W G et al., *Annu. Rev. Mater. Res.* 2014; 44:395-427; Erdemir A et al., "Tribology of diamond-like carbon films: recent progress and future prospects," *J. Phys. D. Appl. Phys.* 2006; 39(18):R311-R327; Slade P G (ed.), "Electrical Contacts: Principles and Applications," (Marcel Dekker, Inc., New York, N.Y., 1999); Rupert T J et al., "Sliding wear of nanocrystalline Ni—W: structural evolution and the apparent breakdown of Archard scaling," *Acta Mater.* 2010; 58(12):4137-48; and Scharf T W et al., "Friction and wear mechanisms in MoS$_2$/Sb$_2$O$_3$/Au nanocomposite coatings," *Acta Mater.* 2010; 58(12):4100-9).

Figure 3D:
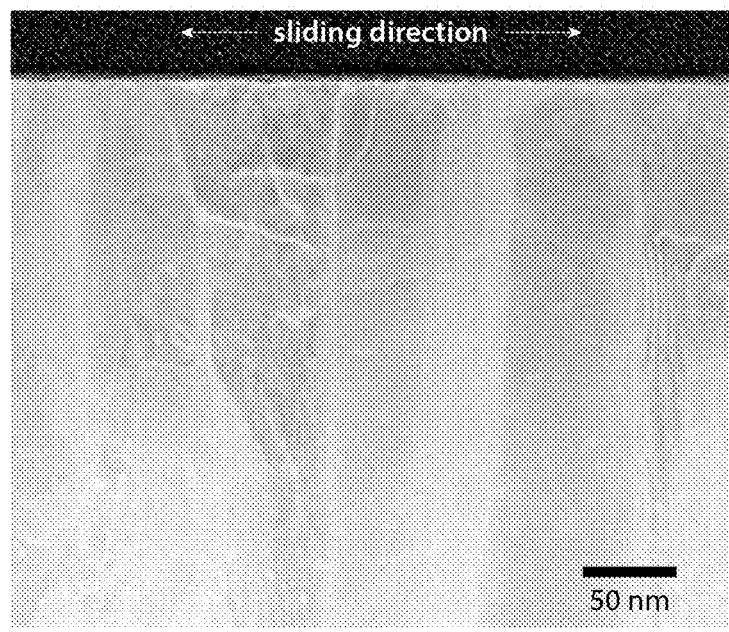

While many composites require environmental control to achieve the lowest reported wear rates, such as ultra-high vacuum for MoS$_2$ and diamond-like carbon, the notably low wear rates of noble metal Pt—Au films were obtained in laboratory air. Additionally, these coatings in the as-deposited condition exhibited a relatively low electrical resistivity of 30 nΩ·m (1.8× higher than that of coarse grained pure Cu). The hardness of the films was measured via nanoindentation at dozens of locations before and after annealing. The as-deposited average hardness was 7.1±0.4 GPa. On a separate specimen annealed in vacuum for 1 day at 500° C., it was 6.5±0.5 GPa. The annealed value is marginally different, within one standard deviation of the as-deposited value, again indicating negligible softening with prolonged exposure to relatively high temperature. We see negligible, if any, evolution of the near-surface microstructure in the wear track (FIG. 3D), implying the suppression of dislocation activity, which has been linked to low friction in metal contacts (see, e.g., Argibay N et al., *J. Mater. Sci.* 2017; 52(5):2780-99). Without wishing to be limited by mechanism, the absence of delamination wear suggests atomic-scale attrition may become the dominant wear mechanism, as with other ultra-low materials (see, e.g., Bhaskaran H et al., "Ultralow nanoscale wear through atom-by-atom attrition in silicon-containing diamond-like carbon," *Nat. Nanotechnol.* 2010; 5:181-5).

These results suggest important and interesting directions for future research. For models, it is natural to extend mesoscale models of grain boundary segregation to incorporate heterogeneous boundary properties in order to elucidate their influence on long-time microstructure evolution. Such extensions will require reasonable estimates of the variability of segregation tendencies between boundaries, in addition to the influence of solute drag and alloy segregation on boundary mobility. Molecular dynamics simulations sampling a variety of boundaries can provide insights into these needed parameters. Experimentally, an investigation is underway to explore evidence of destabilization of the Pt—Au nanocrystalline structure in thin films at even higher temperatures. Preliminary work with thin films in TEM (with single grain film thickness, ~18 nm) revealed the formation of Au precipitates at temperatures exceeding 700° C., where destabilization appears to be associated with the proximity of all grain boundary segregated solute to a free surface.

Technologically, demonstration of a noble metal alloy with 100× reductions in wear rate having nanocrystalline stability up to 500° C. has far reaching implications, particularly in an electrical contact industry driven by increasing demand for greater efficiency in the use, storage and transmission of energy. A noteworthy example of an application where these particular coatings may have high immediate impact potential is in the developing field of nano- and micro-electromechanical devices. The proliferation of gigahertz nano/micro switches remains fundamentally limited by stress and temperature driven grain growth, oxidation and the formation of insulating organic films. An intrinsically stable or significantly stabilized nanocrystalline noble metal alloy could address these obstacles. This is one practical example of why the impact of stress on nanocrystalline stability has been identified as a subject of great importance for further experimental and theoretical investigation (see, e.g., Weertman J R, *Science* 2012; 337(6097):921-2).

Example 2: Experimental Methods and Additional Characterization Data

DC Magnetron Sputter Deposition of Pt—Au Films:

Pt—Au (Pt-10 at. % Au) thin films were deposited by direct current (DC) magnetron sputtering using a cryopumped vacuum system with a base pressure of $2\times10^{-7}$ Torr. A single, high purity Pt—Au target (Refining Systems) was used for all depositions. This target was pre-sputtered for ~5 min. prior to the start of each deposition to avoid incorporation of adventitious carbon or other impurities in the deposited films. Ultra-high purity Ar (99.999%) was used for all sputter processes, and substrates did not exceed 50° C. during deposition. A quartz crystal monitor was used to determine film thickness with Angstrom-level precision. Thickness calibrations conducted prior to depositions utilized a calibrated DEKTAK 3 (Veeco; Woodbury, N.Y.) surface profilometer and cross-section TEM. The 18 nm thin film and the ~2 μm thick film were deposited on polycrystalline NaCl and oxidized Si(100) substrates, respectively. The thick films deposited on a 150 mm diameter Si wafer showed an in-plane compressive residual stress of ~650 MPa, determined from wafer curvature.

Film composition was verified by Wavelength Dispersive Spectroscopy (also referred to as Electron Microprobe). A JEOL model JXA-8530F Microprobe operating at 7.0 keV incident energy (20 nA, 2 μm beam diameter) was used to determine the composition of a 1 μm thick Pt—Au witness film. The average of 50 spaced measurements demonstrated a film composition of $Pt_{0.90}Au_{0.10}$. Uncertainty in the measurement was +0.5 at. % with 95% confidence.

Tribological Testing:

A custom linear reciprocating tribometer was used for friction and wear measurements, similar in design to the instrument described by Erickson G M et al., "Paleotribology: development of wear measurement techniques and a three-dimensional model revealing how grinding dentitions selfwear to enable functionality," *Surf Topogr. Metrol. Prop.* 2016; 4:024001 (12 pp.). This instrument relies on two pairs of leaf-springs to generate linear elastic deformation in two independent axes with negligible rotation in response to the friction and normal contact forces experienced by the spherical probe (3.2 mm diameter sapphire ball lens) as it was slid back and forth on a Pt—Au coated substrate. A piezo positioner maintained the desired contact load within an error of 1%, and a precision stepper motor linear stage (PLS-85 by Physik Instrumente) generated the sliding motion. The instrument was placed inside a glove box with controlled humidity and ambient temperature, backfilled with laboratory air. The relative humidity (RH) was maintained in the range 10-20%, and the ambient temperature at 20±1° C. Specific wear rates and wear rate uncertainty were based on a volumetric material loss method (see, e.g., Schmitz T L et al., "Wear-rate uncertainty analysis," *Trans. ASME J. Tribol.* 2004; 126(4):802-8), where a scanning white light interferometer (Bruker Contour GT) was used to measure the entirety of each wear track.

TEM Annealing Experiments:

An FEI Titan™ G2 80-200 scanning transmission electron microscope (STEM) with a Cs probe corrector and ChemiSTEM™ technology (X-FEG™ and SuperX™ EDS with four windowless silicon drift detectors) operated at 200 kV was used. Energy dispersive spectroscopy (EDS) spectral imaging was acquired as a series of frames where the same region was scanned multiple times (see, e.g., Lu P et al., "Atomic-scale chemical imaging and quantification of metallic alloy structures by energy-dispersive x-ray spectroscopy," *Sci. Rep.* 2014; 4:3945 (5 pp.)). An electron probe of size less than 0.13 nm, convergence angle of 18.1 mrad, and current of ~75 pA was used for data acquisition.

Scanning TEM high-angle annular dark-field (STEM-HAADF) images were recorded under similar optical conditions using an annular detector with a collection range of 60-160 mrad. Au L lines and Pt L lines were used for constructing the EDS maps of Au and Pt, respectively. Since the Au L lines overlap with the Pt L lines significantly, the EDS spectra was deconvoluted pixel-by-pixel using pure spectra of Au and Pt as reference spectra before map construction. Atomic composition was calculated using Cliff and Lorimer method (see, e.g., Cliff G et al., "The quantitative analysis of thin specimens," *J. Microscop.* 1975; 103(2):203-7).

FIG. 1D-1E show representative scanning TEM high-angle annular dark-field (STEM-HAADF) images for thin films, and STEM energy dispersive X-ray spectroscopy (STEM-EDS) map and composition line scans for the thick film. Solute enrichment at boundaries and triple junctions was observed in both thin and thick films. For the ~2 µm thick film, solute denuded zones also appeared in the bulk grains adjacent to the boundaries as a result of the segregation behavior.

For the 18 nm thin film, a TEM specimen was prepared by dissolving the NaCl substrate in water, rinsing the film in water and methanol (more than 24 hours) and laying the removed film on a Mo TEM grid. The annealing of the thin film was carried out using a Gatan 628 TEM in-situ heating holder in vacuum (pressure <$10^{-6}$ Torr). For the thick film, the sample annealing was carried out in a tube furnace in air.

The plan-view TEM samples for the thick film and the cross-sectional TEM sample for the thin film were prepared by focused ion beam (FIB) methods. The cross-sectional TEM sample for the thin film involved additional steps before FIB sectioning, including coating the film surfaces with a carbon film, and adhering the film stack onto the Si substrate.

Figure 4A:
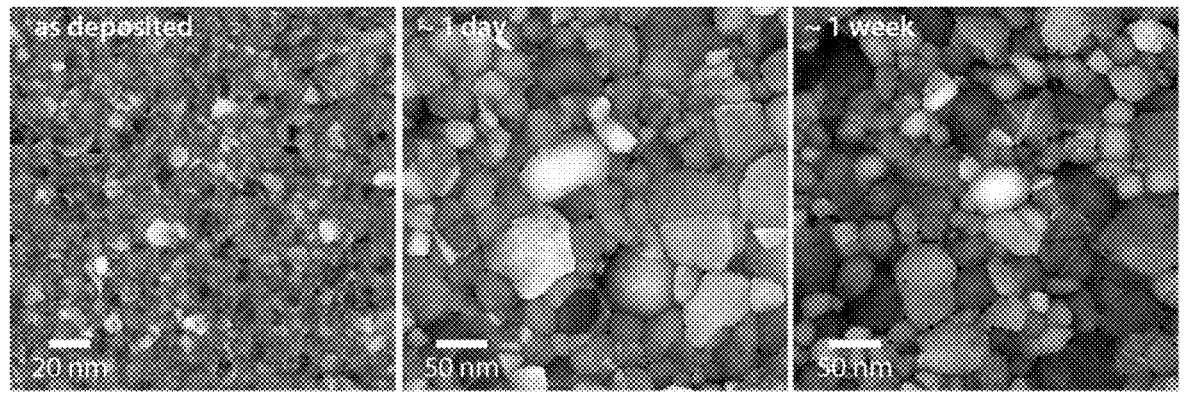
FIG. 4A-4C shows grain evolution and grain histograms for Pt—Au films. Provided are plan view STEM-HAADF images of freestanding Pt—Au thin (18 nm) films (FIG. 4A) and Pt—Au thick (2 μm thickness) films (FIG. 4B). Images in FIG. 4A-4B are provided for as-deposited films, as well as after varying amounts of annealing time at 500° C. Also provided are grain size histograms (FIG. 4C) of grain size for the Pt—Au thin films after varying annealing times.
Figure 4B:
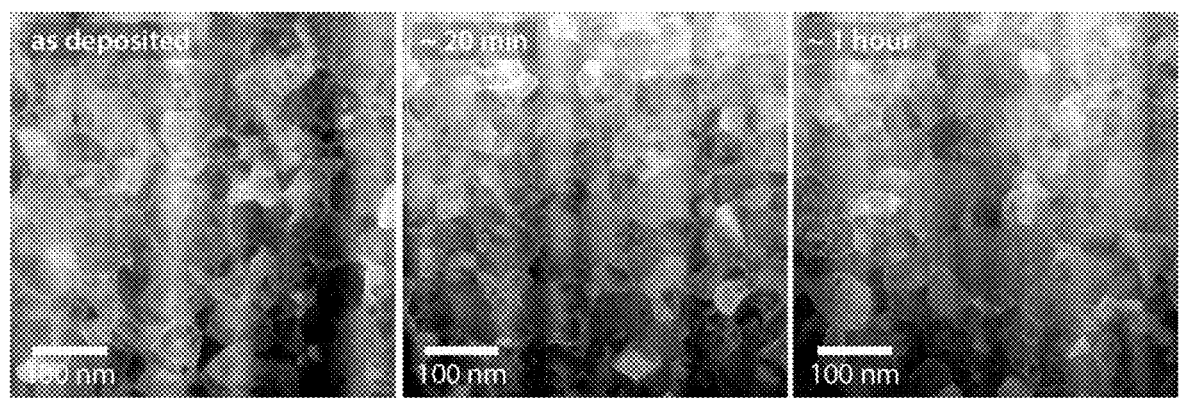
Figure 4C:
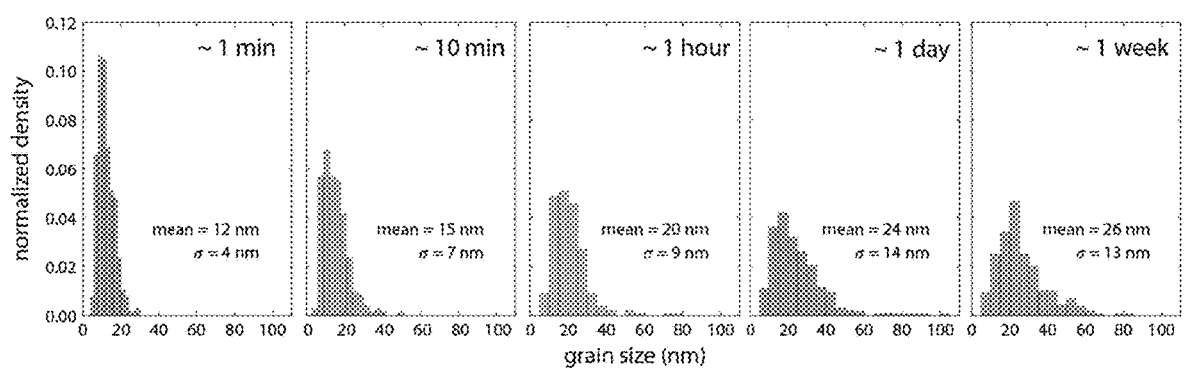
Figure 5:
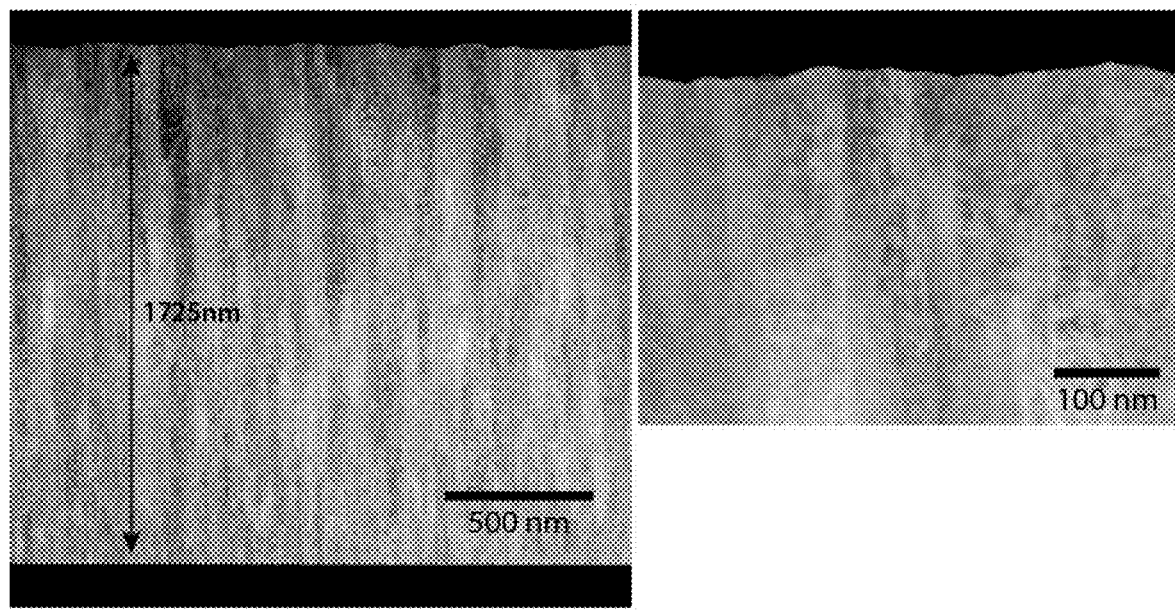
FIG. 5 shows cross-sectional STEM-HAADF images of Pt—Au thick films as-deposited, contrasting with wear track TEM images shown in FIG. 3D.
Figure 6:
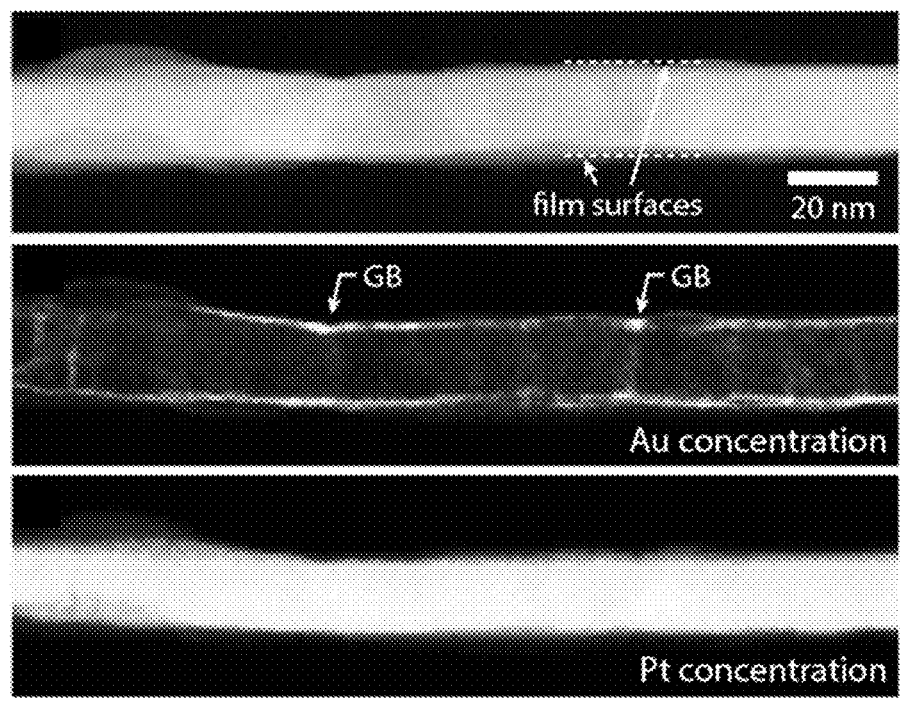
FIG. 6 shows an exemplary Pt—Au film subjected to a 500° C. anneal for 17 hours ($6\times10^4$ s). Provided are a cross-sectional STEM-HAADF image of the film (top), a STEM energy dispersive X-ray spectroscopy (STEM-EDS) map for Au (middle), and a STEM-EDS map for Pt (bottom) acquired in the same region. In the STEM-EDS maps, concentration refers to EDS X-ray count intensity, rather than at. % concentration.
Figure 7:
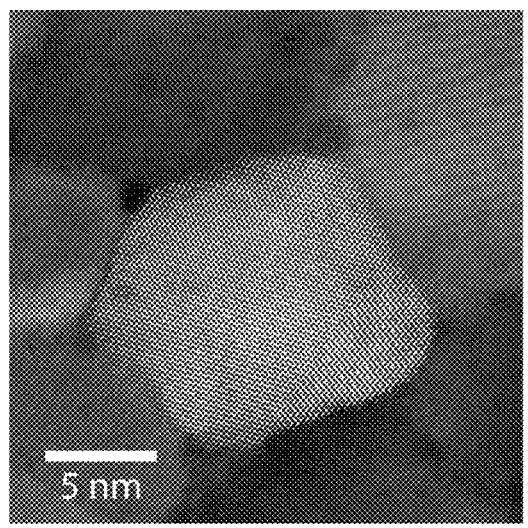
FIG. 7 shows a STEM-HAADF image of a freestanding Pt—Au thin film after annealing for 17 hours at 500° C. This atomic resolution image shows the formation of pores at grain boundaries.

FIG. 4A-4B shows time-lapse plan view TEM images of thin, freestanding and thick-on-substrate Pt—Au films at varying stages of annealing at 500° C., including as-deposited. FIG. 4C shows grain size histograms at varying stages of annealing. FIG. 5 shows representative cross-sectional TEM views of Pt—Au thick films in the as-deposited state, a reference for the cross section TEM of worn films shown in FIG. 3D. FIG. 6 shows a cross-sectional view of a thin film specimen after annealing for 17 hours, along with EDS maps indicative of relative Au and Pt concentrations. In FIG. 7, we present a high resolution STEM-HAADF image of the freestanding film in planar view after annealing for 17 hours, showing the formation of pores at triple junctions, an example of boundary localized structural heterogeneity.

XRD Annealing Experiments Showed Remarkable Stability of Thick Pt—Au Films Up to 700° C.:

High temperature XRD experiments were performed using a Scintag PAD X diffractometer (Thermo Electron Inc.; Waltham, Mass.). This diffractometer was equipped with a sealed-tube source (Cu Kα, λ=0.15406 nm), an incident-beam mirror optic, a Peltier-cooled Ge solid-state detector, and a Buehler hot-stage with Pt/Rh heating strip and surround heater. Scintag instrument power settings were 40 kV and 30 mA, and fixed slits were employed. Temperature calibration was performed using thermal expansion behavior of know materials (e.g. alumina) and calibrated to +5° C. Samples were heated in a static air environment using a 20° C./min ramp rate to the desired analysis temperature. Diffraction patterns were collected over a scan range of 20-80° 2θ at a step-size of 0.04° 2θ employing various count times. The grain size throughout each anneal was determined using the Scherrer Equation.

Grain growth data presented in FIG. 1A shows a summary of mean grain size evolution from in situ XRD annealing experiments. Temperature was increased in intervals of 50° C. beginning at 20° C., with a 1 hour hold at each step, and mean grain size values reported at the end of each annealing step. These measurements were based on analysis of the (111) Pt peak position and broadening. Annealing was performed on thick films (e.g., ~2 µm thick Pt-10 at. % Au films on oxidized Si). XRD grain growth data is in good agreement with TEM-based grain growth data shown in FIG. 1B for both film thicknesses.

Figure 8A:
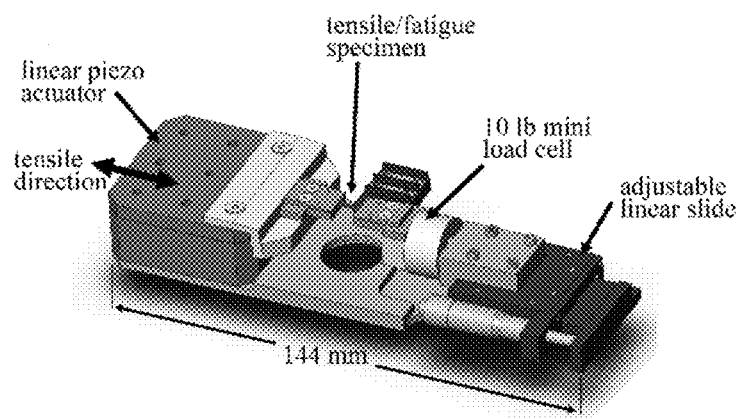
FIG. 8A-8D shows an exemplary tensile and fatigue testing apparatus. Provided are an annotated schematic (FIG. 8A) and a photograph (FIG. 8B) of the apparatus. Also provided are photographs of a 5 µm thick dogbone (plan view) used for mechanical testing (FIG. 8C) and of probe setup for electrical resistivity measurements on dogbones (FIG. 8D).
Figure 8B:
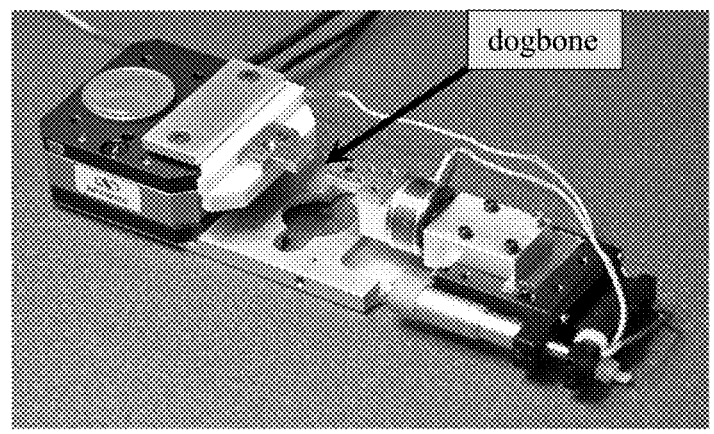
Figure 8C:
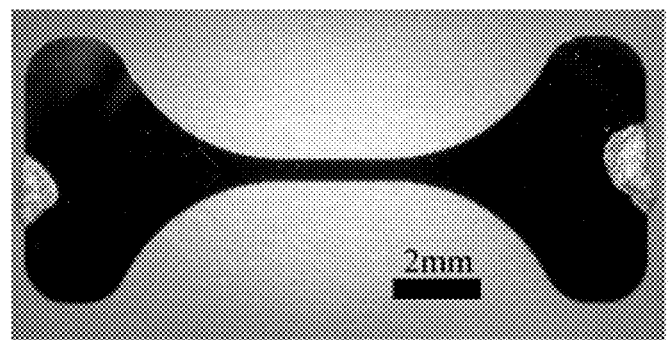

Fatigue Strength and Endurance Limit of Pt—Au:

For fatigue and tensile testing, ~5 µm-thick pure Pt and ~5 µm-thick $Pt_{0.90}Au_{0.10}$ films were deposited on oxidized Si(100) substrates and laser machined to shape (see, e.g., FIG. 8C). Laser machining involved a Clark MXR CPA-series Ti:sapphire femtosecond laser. This laser outputs a 775 nm, 150 fs pulse train at 1 kHz. The power was set to 20 mW and focused through a 5× Mitutoyo M Plano APO NIR objective to produce a focused spot on sample with a diameter of ~50 µm. The features were defined by translating the leveled specimen using a computer-controlled Aerotech stage with encoders. Table speed was 1.9 mm/sec. Ten passes were required to ablate through the Pt—Au films and define dogbone test samples. Samples were delaminated from substrates by peeling.

Fatigue Tests with Freestanding PtAu Tensile Specimens:

Monotonic tension and tension-tension fatigue tests were performed using a custom-built piezo-actuated tester, as shown in FIG. 8A-8B. The tester included a Newport NPX400SG piezo actuator with 320 µm displacement range (in closed-loop mode) and a Honeywell Model 31 44.5 N capacity load cell. Real-time load and displacement (actuator position) were output to a custom-build LabView program, which was used to provide either force control (for the fatigue tests) or actuator position control (for the monotonic tests). 'Dogbone' specimens with 2.4 mm gage length, 0.50 mm gage width, and 5.0 µm thickness, as shown in FIG. 8C, were cut from the original sputter deposited wafer using a femtosecond laser (details provided in earlier herein) that provides a minimum heat affected zone. Once cut, the tensile dogbones were carefully manually lifted from the substrate to produce freestanding foils (made possible due to relatively weak adhesion between a native Si-Ox layer between the substrate and coating). All subsequent mechanical tests were conducted in lab air at room temperature. Additional methods for conducting tensility tests are known (see, e.g., Sharon J A et al., "Interpreting the ductility of nanocrystalline metals," *J. Mater. Res.* 2013; 28(12):1539-52).

The monotonic tension tests were performed using an actuator position rate of 2.4 µm/s, which produced a strain rate $\sim 10^{-3}$/s. The strain was approximated by normalizing the actuator displacement by the original gage length. For the reported tensile curves, the tensile data were 'corrected' for machine compliance by assuming the measured moduli to be equal to the theoretical moduli. The machine compliance (i.e., reciprocal machine stiffness) was approximated using the following equation:

$$\frac{1}{E_{measured}} = \frac{1}{E_{specimen}} + \frac{1}{E_{machine}},$$

where E is the elastic modulus and $1/E_{machine}$ is the machine compliance. $E_{specimen}$ was assumed equal to the theoretical elastic moduli of the materials (168 GPa for Pt and 158 GPa for Pt—Au). It should be noted that this method was used due to difficulty in measuring the specimen strain directly, given the small specimen sizes, and only serves to better approximate the 0.2% offset yield strengths. The ultimate tensile strengths, however, are not affected by this transformation.

Tension-tension fatigue tests were performed in force control (sine loading) using an R-ratio ($\sigma_{min}/\sigma_{max}$) of 0.3 and a frequency of 30 Hz. Due to time constraints, specimens were removed and a new test started if fatigue failure did not occur in <1M cycles. A 'runout' arrow was included in figures to note the specimens that did not fail. No failure was found up to $3 \times 10^6$ cycles at maximum stresses above 1 GPa for multiple specimens. An endurance limit of about 1 GPa and an ultimate tensile strength of 1.6 GPa were found. FIG. 2B summarizes experimental fatigue and tensile strength results for Pt—Au; arrows indicate where experiments were concluded with no fatigue failure.

Figure 8D:
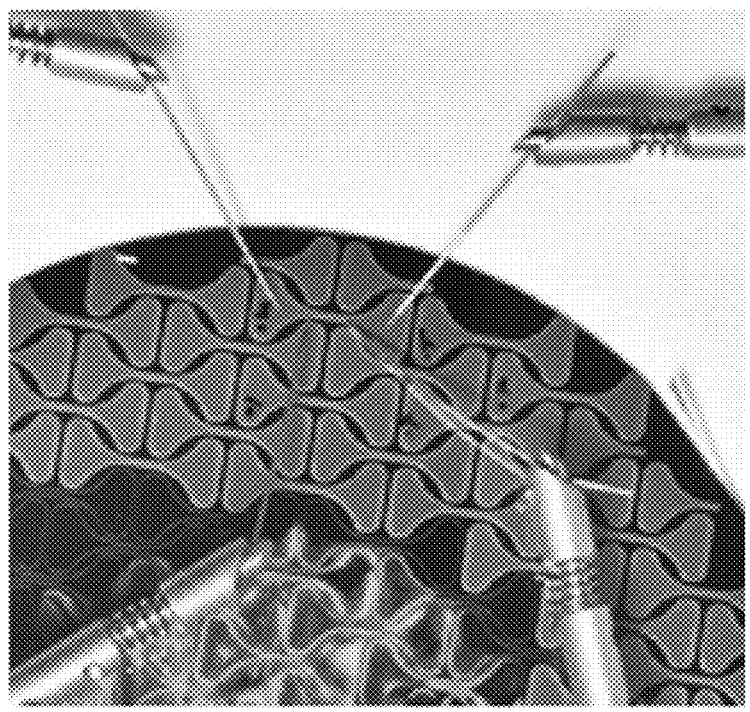

Electrical Resistivity:

The electrical resistivity of Pt—Au was measured using the approximately 5 µm thick tensile specimens (FIG. 8D) deposited on Si wafers with a thick, electrically insulating Si-Ox layer. An Agilent 374420 NanoVolt/MicroOhm meter in 4-wire mode and four in-line Signatone S926 micropositioner stages with W needle probes were used to determine the resistance of the films along the straight gauge of the tensile specimens. The dimensions of the gauge (5 µm thick by 0.5 mm width by 2-3 mm length) were used with electrical resistance measurements to calculate electrical resistivity. The average and standard deviation of ten dogbones was found to be 30.1±3.1 nΩ~m.

Figure 9:
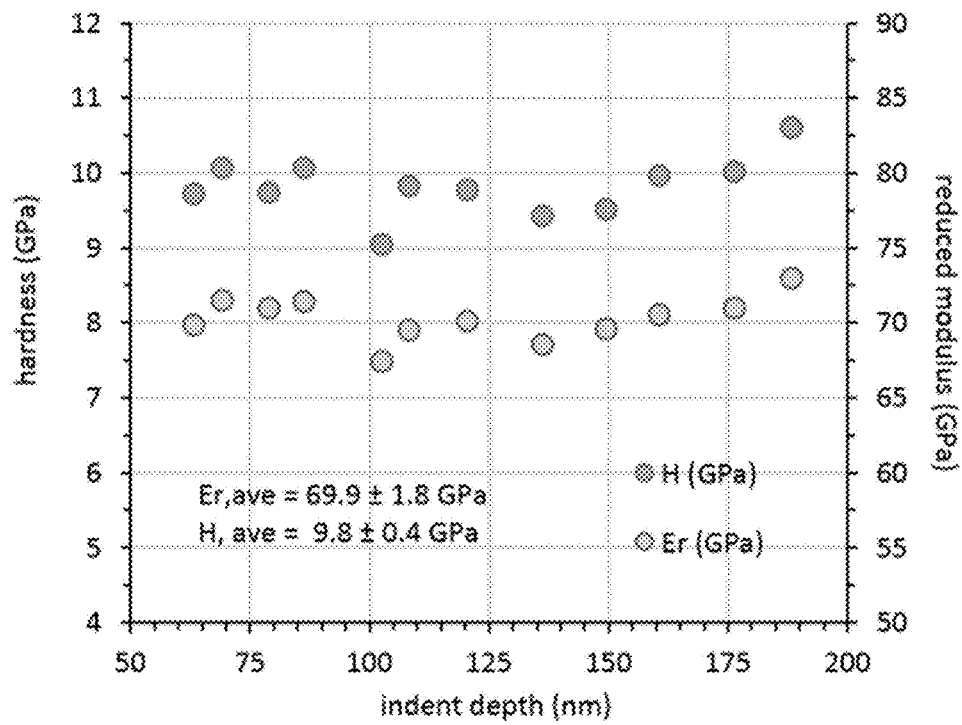
FIG. 9 is a graph showing verification of nanoindentation calibration parameters determined on fused-quartz, which displays reduced modulus and hardness as functions of the indentation depth in the range of 60-190 nm.

Nanoindentation Hardness:

Nanoindentation hardness was determined using a Hysitron Performech Triboindenter with a Berkovitch tip using the Oliver-Pharr method (see, e.g., Oliver W C et al., "An improved technique for determining hardness and elastic modulus using load and displacement sensing indentation experiments," *J. Mater. Res.* 1992; 7(6):1564-83). Prior to indentation of the Pt—Au film, calibration of the indenter and the Berkovitch area function were performed according to standard Hysitron procedures. FIG. 9 shows the hardness and reduced modulus results on fused quartz as verification of the calibration parameters in the indent depth range of 60-190 nm.

The Pt—Au films used for nanoindentation hardness measurements were magnetron sputtered under identical conditions as those used for freestanding thin and thick films described herein. However, to ensure adequate stiffness and flatness during nanoindentation, these films were sputtered directly onto 25.4 mm diameter, 6.35 mm thick, polished 303 stainless steel (SS) wafers. Prior to indentation, the SS wafer/Pt—Au coatings were mounted and leveled on glass slides using CrystalBond™ 509 to ensure a flat surface for indentation. The Pt—Au coating thickness in all cases was 2.0 µm. High-vacuum annealing was performed on one sample set at 500° C. for 24 hours with a vacuum pressure of $\sim 5 \times 10^{-6}$ Torr using a custom-built vacuum annealing furnace comprising a 1700° C. maximum temperature Lindberg Model 54434 furnace.

Nanoindentation was performed on the as-deposited and annealed samples using 7×7 indent arrays with each indent separated by 3 µm at two randomly selected locations on each sample. The loading was performed with a 5 second ramp time, 5 second hold time, and 5 second unload time. The maximum indent force was varied from 4000 µN to 1100 µN across the indent arrays to assess any force/depth dependent behavior.

Figure 10:
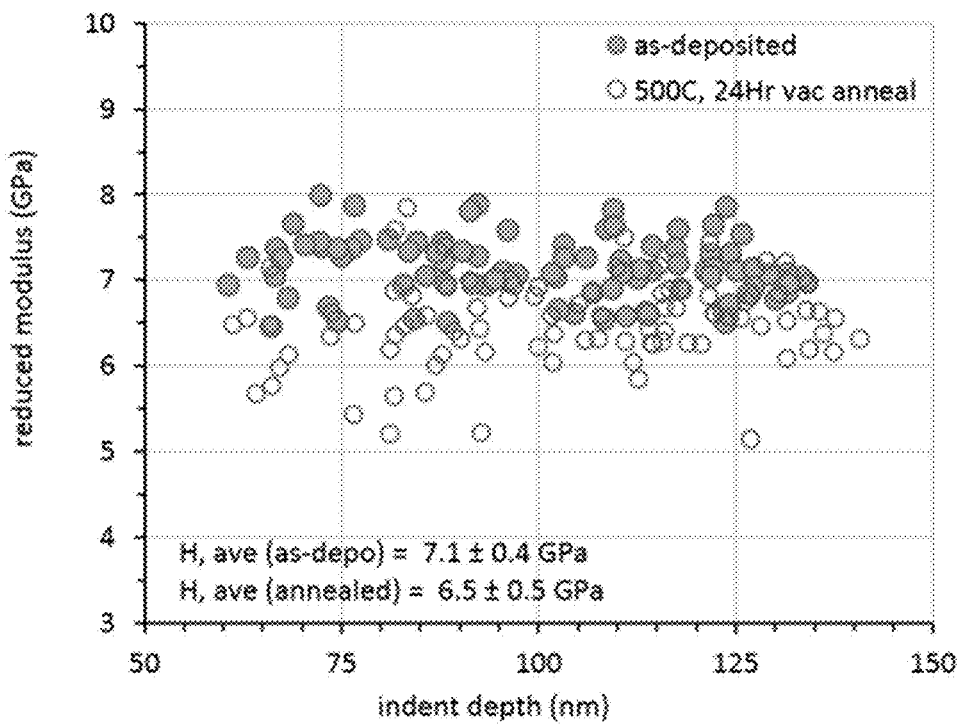
FIG. 10 is a graph showing nanoindentation hardness results for as-deposited and annealed Pt—Au. The average as-deposited hardness was determined to be 7.1±0.4 GPa and only a marginally lower hardness of 6.5±0.5 GPa was determined after annealing for 24 hours at 500° C.

Average hardness in the depth range of 60-145 nm were 7.1±0.4 GPa for the as-deposited material and 6.5±0.5 GPa after the 24 hour anneal at 500° C. The hardness results are shown in FIG. 10. The annealed value is marginally different, within one standard deviation of the as-deposited value, again indicating limited softening with prolonged exposure to relatively high temperature. Relaxation during annealing may simply have offset grain growth, allowing gold to migrate to grain boundaries through a combination of diffusion and grain boundary motion, required to achieve a fully stable nanocrystalline structure at the stable grain size for this composition. This subtle change in microstructure may also explain denuded zones adjacent to grain boundaries (e.g., shown in FIG. 11B), and the occasional, though relatively small jumps in friction data observed exclusively in the as-deposited films. Without wishing to be limited by mechanism, we speculate that stress was the driver for microstructure evolution toward the stable grain size for this composition in the as-deposited case. A small amount of stress-driven softening would have increased contact area, and thus friction coefficient. The slightly higher and more consistent friction coefficient of the annealed specimen, in part, supports this hypothesis.

Example 3: Molecular Dynamics and Monte Carlo Simulations

The equilibrium configuration of the alloy systems was generated using equilibrium off-lattice Monte Carlo (MC)

simulations as described in detail elsewhere (see, e.g., Foiles S M, *Phys. Rev. B* 1989; 40:11502-6). The algorithm employs two types of atomic-level changes. First, random atomic displacements are performed to incorporate local structural relaxation and thermal vibrations. Second, the atomic species associated with two randomly selected atoms are swapped, which provides for efficient sampling of the potential compositional arrangements. The molecular dynamics (MD) simulations are performed using the LAMMPS code (see, e.g., Plimpton S J, "Fast parallel algorithms for short-range molecular dynamics," *J. Comput. Phys.* 1995; 117(1):1-19). The resultant grain size is determined through cluster labelling that identifies and counts the number of grains in the sample and the resulting average grain size is converted into a squared grain diameter.

A newly developed embedded atom method (EAM) potential is employed for the MC and MD simulations (see, e.g., O'Brien C J et al., "Grain boundary phase transformations in PtAu and relevance to thermal stabilization of bulk nanocrystalline metals," *J. Mater. Sci.* 2018; 53(4):2911-27). Due to the lack of measured properties for the Pt—Au alloy, we relied on Density Functional Theory (DFT) to provide forces and energies for ordered and disordered configurations with which the potentials will be parameterized.

In some examples, two databases were generated, one for parameterization and one for validation. DFT calculations were carried out using the VASP package (see, e.g., Kresse G et al., "Efficient iterative schemes for ab initio total-energy calculations using a plane-wave basis set," *Phys. Rev. B* 1996; 54(16):11169-86) with the PBE exchange correlation functional (see, e.g., Perdew J P et al., "Generalized gradient approximation made simple," *Phys. Rev. Lett.* 1996; 77(18): 3865-8) and PAW pseudopotentials (see, e.g., Kresse G et al., "From ultrasoft pseudopotentials to the projector augmented-wave method," *Phys. Rev. B* 1999; 59(3): 1758-75).

The databases included of a wide variety of configurations that represent a range of conditions at which the potential might be applied. Since the fit must be applicable to grain boundaries that contain disordered states at the boundary, it was necessary to fit the potentials for disordered solids in addition to crystalline phases. Single element potentials were fit to a small range of lattice constants about equilibrium for the FCC, BCC, HCP, and diamond lattice structures along with a liquid state at 2000K and FCC with random displacements. The fitting database for the alloy potential consists of Pt—Au liquid at 2000K, a random Pt—Au FCC alloy with random displacements, and a range of lattice constants for the ordered compounds L12, B1, and L2O.

The validation database for the single element potentials include comparisons to independent data for the elemental liquid at 2000K and the FCC structure with random displacements. Specific geometries of $\Sigma 3(111)<110>$(coherent twin) boundary, self-interstitial, vacancy, and (111), (100), and (110) surfaces. The validation database for the alloy potential includes independent data for the Pt—Au liquid and random Pt—Au FCC alloy.

The thermodynamic analysis of the proposed stabilization generally employs a description in which all boundaries have the same segregation behavior. Lattice-based Monte Carlo methods (see, e.g., Chookajorn T et al., "Thermodynamics of stable nanocrystalline alloys: a Monte Carlo analysis," *Phys. Rev. B* 2014; 89(6): 064102 (10 pp.)) and diffuse interface phase-field models (see, e.g., Abdeljawad F et al., "Stabilization of nanocrystalline alloys via grain boundary segregation: a diffuse interface model," *Acta Mater.* 2015; 101:159-71) of the coupled segregation and grain growth have been employed to show the influence of the thermodynamic factors in slowing or halting grain growth. Since these models do not resolve the atomic level structure of the boundaries, all grain boundaries are treated as having the same thermodynamic and kinetic properties. While the simplification that all grain boundaries can be treated equally provides a useful interpretation of the role of grain boundary segregation on nanocrystalline stabilization, it is well known that the detailed atomic structure and resulting boundary properties such as energy (see, e.g., Olmsted D L et al., "Survey of computed grain boundary properties in face-centered cubic metals: I. Grain boundary energy," *Acta Mater.* 2009; 57(13):3694-703), mobility (see, e.g., Olmsted D L et al., "Survey of computed grain boundary properties in face-centered cubic metals: II. Grain boundary mobility," *Acta Mater.* 2009; 57(13):3704-13) and segregation behavior (see, e.g., Seki A et al., *Acta Metall. Mater.* 1991; 39(12):3167-77) depend on the macroscopic degrees of freedom associated with grain boundary character (see, e.g., Olmsted D L et al., *Acta Mater.* 2009; 57(13): 3704-13; and Ratanaphan S et al., "Grain boundary energies in body-centered cubic metals," *Acta Mater.* 2015; 88:346-54). Here, we show that atomistically accurate simulations possess significant atomic-scale heterogeneity in segregation behavior as well. Further, even for boundaries that do contain Au clusters, the clusters often only cover a portion of the boundary, indicating that clustering can exist within a given boundary. These results show a much richer segregation behavior than results from the assumption of uniform boundary properties.

Example 4: Tribological Behavior of Stable Nanocrystalline Pt—Au Films

Recent work suggests that thermally stable nanocrystallinity in metals is achievable in several binary alloys by modifying grain boundary energies via solute segregation. The remarkable thermal stability of these alloys has been demonstrated in recent reports, with many alloys exhibiting negligible grain growth during prolonged exposure to near-melting temperatures. We show that Pt—Au, a proposed stable alloy consisting of two noble metals, exhibits extraordinary resistance to wear. Ultra-low wear rates, less than a monolayer of material removed per sliding pass, were measured for Pt—Au thin films at a maximum Hertz contact stress of up to 1.1 GPa. To our understanding, this is the first instance of an all-metallic material exhibiting a specific wear rate on the order of $10^{-9}$ mm$^3$/N-m, comparable to diamond-like carbon and sapphire. Remarkably, the wear rate of sapphire and silicon nitride probes used in wear experiments were either higher or comparable to that of the Pt—Au alloy, despite the substantially higher hardness of the ceramic probe materials. High-resolution microscopy showed negligible surface microstructural evolution in the wear tracks after 100 k sliding passes. Mitigation of fatigue-driven delamination enabled a transition to wear by atomic attrition, a regime previously limited to highly wear resistant materials such as diamond-like carbon.

Materials exhibiting ultra-low wear rates are generally defined as having a rate of attrition on the order of a monolayer per sliding pass (see, e.g., Bhaskaran H et al., "Ultralow nanoscale wear through atom-by-atom attrition in silicon-containing diamond-like carbon," *Nat. Nanotechnol.* 2010; 5:181-5), translating to a specific or volumetric wear rate less than $10^{-8}$ mm$^3$/N-m. Very few materials exhibit this behavior, including diamond-like carbon (DLC) (see, e.g., Erdemir A et al., "Tribology of diamond-like carbon films: recent progress and future prospects," *J. Phys. D. Appl.*

Phys. 2006; 39(18):R311-R327; and Liu Y et al., "A study of the wear mechanism of diamond-like films," *Surf Coatings Technol.* 1996; 82:48-56), graphite (see, e.g., Berman D et al., "Few layer graphene to reduce wear and friction on sliding steel surfaces," *Carbon* 2013; 54:454-9; Berman D et al., "Macroscale superlubricity enabled by graphene nanoscroll formation," *Science* 2015; 348(6239):1118-22; and Liu Y et al., "An investigation of the relationship between graphitization and frictional behavior of DLC coatings," *Surf Coatings Technol.* 1996; 86-87(2):564-8), metal dichalcogenides like $MoS_2$ and $WS_2$ (see, e.g., Chhowalla M et al., "Thin films of fullerene-like $MoS_2$ nanoparticles with ultralow friction and wear," *Nature* 2000; 407:164-7; Lancaster J K, "The influence of substrate hardness on the formation and endurance of molybdenum disulphide films," *Wear* 1967; 10:103-17; Scharf T W et al., "Solid lubricants: a review," *J. Mater. Sci.* 2013; 48(2):511-31; and Hamilton M A et al., "A possible link between macroscopic wear and temperature dependent friction behaviors of $MoS_2$ coatings," *Tribol. Lett.* 2008; 32(2):91-8), metal nitrides and carbides widely used in bearings and coatings such as $Si_3N_4$ and WC, and even semiconductors like GaN (see, e.g., Zeng G et al., "Ultralow wear of gallium nitride," *Appl. Phys. Lett.* 2016; 109:051602 (5 pp.)). More recently, ultra-low wear has been achieved in polymer nanocomposites such as PTFE-alumina (see, e.g., Sawyer W G et al., "Mechanistic studies in friction and wear of bulk materials," *Annu. Rev. Mater. Res.* 2014; 44:395-427; and Krick B A et al., "Ultralow wear fluoropolymer composites: nanoscale functionality from microscale fillers," *Tribol. Int'l* 2016; 95:245-55).

As a material class, metals have remained a notable exception to this list (see, e.g., Sawyer W G et al., *Annu. Rev. Mater. Res.* 2014; 44:395-427; and Slade P G (ed.), "Electrical Contacts: Principles and Applications," (Marcel Dekker, Inc., New York, N.Y., 1999)). Some of these materials, like graphite and metal dichalcogenides, depend on the formation of highly-ordered low shear strength lamellar surface films to achieve low friction and high wear resistance (see, e.g., Scharf T W et al., *J. Mater. Sci.* 2013; 48(2):511-31; and Dienwiebel M et al., "Superlubricity of graphite," *Phys. Rev. Lett.* 2004; 92:126101 (4 pp.)) and can only accomplish this in specific environments (see, e.g., Lancaster J K, "A review of the influence of environmental humidity and water on friction, lubrication and wear," *Tribol. Int'l* 1990; 23(6):371-89). For metals, surface microstructure evolution—specifically refinement—has been linked to improved friction and wear resistance (see, e.g., Argibay N et al., "Linking microstructural evolution and macro-scale friction behavior in metals," *J. Mater. Sci.* 2017; 52(5):2780-99; Chandross M et al., "Shear-induced softening of nanocrystalline metal interfaces at cryogenic temperatures," *Scripta Mater.* 2018; 143:54-8; Greiner C et al., "Sequence of stages in the microstructure evolution in copper under mild reciprocating tribological loading," *ACS Appl. Mater. Interf.* 2016; 8(24):15809-19; and Chen X et al., "Lowering coefficient of friction in Cu alloys with stable gradient nanostructures," *Science Adv.* 2016; 2(12):e1601942 (8 pp.)), implying that alloys with grain structures that can resist thermal and mechanically driven grain growth should exhibit lower friction and higher wear resistance than conventional alloys. The potential practical impacts of ultralow wear alloys are significant, perhaps most notably in electrical contacts, where bare metal contacts remain an intrinsic requirement for maintaining electrical conductivity across sliding and rolling interfaces (see, e.g., Brown L et al., "Testing and evaluation of metal fiber brush operation on slip rings and commutators," *IEEE Trans. Components Packaging Technols.* 2008; 31(2):485-94; and Antler M, "Sliding wear of metallic contacts," *IEEE Trans. Components Hybrids Manuf. Technol.* 1981; CHMT-4:15-29).

Achieving ultra-low wear rates with metals requires the mitigation of deformation resulting from cyclic applied contact stresses, that can lead to evolution of the microstructure, defect nucleation, and eventual emission of wear particles. Hall-Petch strengthening via reduction in grain size is a primary mechanism to achieve higher hardness in metals (see, e.g. Pande C S et al., "Nanomechanics of Hall-Petch relationship in nanocrystalline materials," *Prog. Mater. Sci.* 2009; 54(6):689-706), which has historically been linked to increased wear resistance for a wide range of materials (see, e.g., Leyland A et al., "On the significance of the H/E ratio in wear control:a nanocomposite coating approach to optimised tribological behaviour," *Wear* 2000; 246(1-2): 1-11).

When applied surface stresses do not regularly exceed the flow stress of metals in sliding contact—as can be the case with nanocrystalline metals, even accounting for surface roughness—wear becomes primarily a fatigue-dominated process (see, e.g., Suh N P, "An overview of the delamination theory of wear," *Wear* 1977; 44(1):1-16; and Argibay N et al., "Copper-beryllium metal fiber brushes in high current density sliding electrical contacts," *Wear* 2010; 268(11-12): 1230-6). Fatigue wear depends on the formation of cracks through repeated cycling of contact stresses, leading to the formation of wear particles via cohesive failure. This regime is typically categorized as the "delamination wear regime." While most coarse-grained metals undergo dislocation-mediated plasticity, cell formation, and grain refinement under cyclic loading, nanocrystalline metals with unstable grain boundaries can undergo grain growth that facilitates cracking (see, e.g. Boyce B L et al., "Anomalous fatigue behavior and fatigue-induced grain growth in nanocrystalline nickel alloys," *Metall. Mater. Trans. A* 2011; 42(7):1793-804). In part, one motivation was to demonstrate that improving the thermo-mechanical stability of nanocrystalline alloys can mitigate stress-driven microstructure evolution at elevated contact stresses, and ultimately suppress delamination wear.

Alloying is a classic approach to stabilizing grain structures in metals (see, e.g., Kirchheim R, "Reducing grain boundary, dislocation line and vacancy formation energies by solute segregation: I. Theoretical background," *Acta Mater.* 2007; 55(15):5129-38; Murdoch H A et al., "Stability of binary nanocrystalline alloys against grain growth and phase separation," *Acta Mater.* 2013; 61(6):2121-32; Chookajorn T et al., "Design of stable nanocrystalline alloys," *Science* 2012; 337(6097):951-4; Weertman J R, "Retaining the nano in nanocrystalline alloys," *Science* 2012; 337 (6097):921-2; Weissmüller J, "Alloy effects in nanostructures," *Nanostructured Mater.* 1993; 3(1-6):261-72; and Kirchheim R, "Grain coarsening inhibited by solute segregation," *Acta Mater.* 2002; 50(2):413-9) via solute drag to retard motion of grain boundaries (GBs) (see, e.g., Cahn J W, "The impurity-drag effect in grain boundary motion," *Acta Metall.* 1962; 10(9):789-98; Hillert M et al., "A treatment of the solute drag on moving grain boundaries and phase interfaces in binary alloys," *Acta Metall.* 1976; 24(8): 731-43; and Hyun S et al., "Mechanical behavior of Pt and Pt—Ru solid solution alloy thin films," *Acta Mater.* 2004; 52(14):4199-211), or Zener pinning through formation of second phase precipitates (see, e.g., Argibay N et al., "On the thermal stability of physical vapor deposited oxide-hardened nanocrystalline gold thin films," *J. Appl. Phys.* 2015; 117: 145302 (13 pp.); Worner C H et al., "Grain growth stagnation by inclusions or pores," *JOM* 1992; 44(9):16-20; and Hillert M, "Inhibition of grain growth by second-phase particles," *Acta Metall.* 1988; 36(12):3177-81).

In contrast to these methods of kinetically limiting grain growth, recent models suggest new thermodynamic routes for achieving stable nanocrystallinity through alloying (see, e.g., Murdoch H A et al., *Acta Mater.* 2013; 61(6):2121-32; Chookajorn T et al., *Science* 2012; 337(6097):951-4; Weertman J R, *Science* 2012; 337(6097):921-2; Clark B G et al., "Thermal stability comparison of nanocrystalline Fe-based binary alloy pairs," *JOM* 2016; 68(6):1625-33; Koch C C et al., "Stabilization of nanocrystalline grain sizes by solute additions," *J. Mater. Sci.* 2008; 43(23):7264-72; and Murdoch H A et al., "Estimation of grain boundary segregation enthalpy and its role in stable nanocrystalline alloy design," *J. Mater. Res.* 2013; 28(16):2154-63). In accordance with the Gibbs adsorption equation, the preferential segregation of solute to GBs (when the chemical potential is increased at a fixed temperature and pressure) leads to a reduction of the boundary energy, and thus the driving force for grain growth. If the energy advantage from segregation is strong enough, substantial reduction or even elimination of the thermodynamic driving force for grain growth can be achieved. This can lead to either a slowing of the grain growth kinetics or the thermodynamic stabilization of the nanocrystalline grain structure. The effect can be greatest in alloys with strong boundary segregation, causing segregated grain boundaries to be energetically preferable to solid solutions or second phases.

Platinum and gold alloys were proposed (see, e.g., Gianola D S et al., "Grain-size stabilization by impurities and effect on stress-coupled grain growth in nanocrystalline Al thin films," *Mater. Sci. Eng. A* 2008; 483-484:637-40) as one of several binary metal alloys theoretically exhibiting the thermodynamic features needed for stable nanocrystallinity (see, e.g., Chookajorn T et al., *Science* 2012; 337 (6097):951-4). These alloys have the advantage that the constituent materials are available in high purity, and their shared nobility obviates the added complexity of oxide formation on the analysis of grain boundary stability. In addition to the benefits for electrical contact applications where oxidation is problematic, previous studies on non-noble nanocrystalline systems have shown oxygen uptake as a key confounding factor (see, e.g., Clark B G et al., *JOM* 2016; 68(6):1625-33; and Gianola D S et al., *Mater. Sci. Eng. A* 2008; 483-484:637) in the interpretation of stability. The role of lattice strain on segregation behavior in this alloy is also minimal, with a relatively small elastic mismatch of 4% between Pt and Au.

Here we present evidence that an exemplary solid solution alloy of Pt and Au ($Pt_{0.90}Au_{0.10}$, hereafter denoted "Pt—Au" in this Example to highlight the solution-state of Au in Pt), predicted to have unusually high nanocrystalline thermal stability (see, e.g., Murdoch H A et al., *Acta Mater.* 2013; 61(6):2121-32; Chookajorn T et al., *Science* 2012; 337 (6097):951-4; and Murdoch H A et al., *J. Mater. Res.* 2013; 28(16):2154-63), exhibits ultra-low wear rates. This suggests that the primary wear mechanism found with traditional nanocrystalline alloys having specific wear rates as low as $10^{-6}$ $mm^3$/N-m, i.e. fatigue-driven delamination wear (see, e.g., Sawyer W G et al., *Annu. Rev. Mater. Res.* 2014; 44:395-427; Slade P G (ed.), "Electrical Contacts: Principles and Applications," (Marcel Dekker, Inc., New York, N.Y., 1999); Suh N P, *Wear* 1977; 44(1):1-16; Argibay N et al., "Low wear metal sliding electrical contacts at high current density," *Wear* 2012; 274-275:229-37; Prasad S V et al., "EBSD studies on wear-induced subsurface regions in LIGA nickel," *Scripta Mater.* 2003; 48(3):255-60; Padilla H A et al., "Frictional performance and near-surface evolution of nanocrystalline Ni—Fe as governed by contact stress and sliding velocity," *Wear* 2013; 297(1-2):860-71; and Rupert T J et al., "Sliding wear of nanocrystalline Ni—W: structural evolution and the apparent breakdown of Archard scaling," *Acta Mater.* 2010; 58(12):4137-48), can be effectively inhibited or greatly suppressed in metals. As such, the studied Pt—Au alloys exhibit wear rates comparable to the most wear resistant materials in nature.

We deposited films of Pt—Au by magnetron-deposition of a mixed Pt and Au target (see herein, including Example 2). Representative scanning TEM high-angle annular darkfield (STEM-HAADF) image for a Pt—Au film in cross section, and STEM energy dispersive X-ray spectroscopy (STEM-EDS) plan view composition map and line scan are shown in FIG. 11A-11B. The Pt—Au films exhibited a columnar structure with large grain aspect ratios, typical of metal films produced by magnetron sputter-deposition. As such, reported grain sizes are the average columnar grain diameters (~40 nm), based on plan-view images of films sectioned near the middle of the film thickness. Solute enrichment at boundaries and triple junctions was observed, as well as solute denuded zones that appeared in bulk grains adjacent to the segregated boundaries. In these films, it was observed that Au segregated to grain boundaries and free surfaces, with highly heterogeneous distributions. A comprehensive thermal stability investigation on these films is reported herein (see, e.g., Example 5 herein). We note here that these films were shown to have extraordinarily stable nanocrystallinity, with no evidence of grain size evolution after annealing as much as 1 week at temperatures as high as 500° C.

Abdeljawad et al. (Abdeljawad F et al., "Grain boundary segregation in immiscible nanocrystalline alloys," *Acta Mater.* 2017; 126:528-39) utilized a diffuse interface modeling framework to examine GB segregation in Pt—Au, and generally in immiscible nanocrystalline alloys. Their work, in part, provides additional insights about the combined effects of GB solute segregation and bulk phase separation, and the relative role of each on the microstructural evolution of nanocrystalline alloys.

While the thermal stability of these alloys has been demonstrated, their stability under mechanical stress has not been previously investigated. We show in the following that our Pt—Au nanocrystalline films are remarkably resistant to growth under cyclic applied shear stress. Nanocrystalline mechanical stability is most clearly evident in the friction and wear behavior of these films, exhibiting wear rates of $3 \times 10^{-9} \pm 1 \times 10^{-9}$ $mm^3$/N-m and friction coefficients of i=0.2-0.3; these results are discussed in more detail below. Notably, the Pt—Au films even outperformed the harder sapphire and $Si_3N_4$ counterfaces. In all wear experiments, 3.2 mm diameter spheres were loaded in reciprocating contact in laboratory air (10-20% relative humidity, 20° C.) against a ~2 μm thick Pt—Au film deposited on a 440PH stainless steel substrate using a stroke length of 1 mm, in bi-directional sliding at 1 mm/s, for $10^5$ sliding passes ($5 \times 10^4$ bi-directional cycles). A constant normal force of 1 N was applied to the contacts, corresponding to Hertzian maximum stresses of 1.1 GPa for both sapphire and $Si_3N_4$ spheres.

To demonstrate the combined thermo-mechanical stability of Pt—Au, a specimen was annealed in ultra-high vacuum for 1 day at 500° C., followed by friction and wear experiments over the same number of cycles. The cycle average friction coefficient data for the annealed film as compared to the as-deposited film are plotted in FIG. 12A, and show minimal differences with a sapphire ball. When a Si$_3$N$_4$ ball was used instead of sapphire, the friction progressively increased, likely a result of the much higher roughness of Si$_3$N$_4$ as compared to sapphire; the root-mean-square surface roughness of the sapphire and Si$_3$N$_4$ balls were 10 and 200 nm, respectively. While the friction coefficient of the as-deposited film (μ~0.25) is slightly lower than the annealed film (μ~0.3), we attribute these differences to a slight change in microstructure as the annealed film achieves its grain size. We also note that a friction coefficient of 0.3 is consistent with reports of nanocrystalline metals (see, e.g., Argibay N et al., *J. Mater. Sci.* 2017; 52(5):2780-99; Padilla H A et al., *Wear* 2013; 297(1-2):860-71; and Prasad S V et al., "Friction transitions in nanocrystalline nickel," *Scripta Mater.* 2011; 64(8):729-32).

The specific wear rates were identical for both annealed and as-deposited Pt—Au wear tracks, with a value of K=3×10$^{-9}$+/−1×10$^{-9}$ mm$^3$/N-m, low enough to identify atomic attrition as the likely dominant wear mechanism (see, e.g., Bhaskaran H et al., *Nat. Nanotechnol.* 2010; 5:181-5). Specific wear rates and wear rate uncertainty were based on a volumetric material loss method (see, e.g., Schmitz T L et al., "Wear-rate uncertainty analysis," *Trans. ASME J. Tribol.* 2004; 126(4):802-8), where a scanning white light interferometer (Bruker Contour GT) was used to measure the entirety of each wear track. The average cross-sectional area of the wear track (A), wear track length (L), total sliding passes (N), and contact force (Fn) were used to calculate the equivalent volumetric specific wear rate K using the following expression:

$$K\left[\frac{mm^3}{N-m}\right] = \frac{A \cdot L}{F_n \cdot N \cdot L}.$$

An established method is described in greater detail by Erickson G M et al., "Paleo-tribology: development of wear measurement techniques and a three-dimensional model revealing how grinding dentitions selfwear to enable functionality," *Surf. Topogr. Metrol. Prop.* 2016; 4:024001 (12 pp.).

Figure 12B:
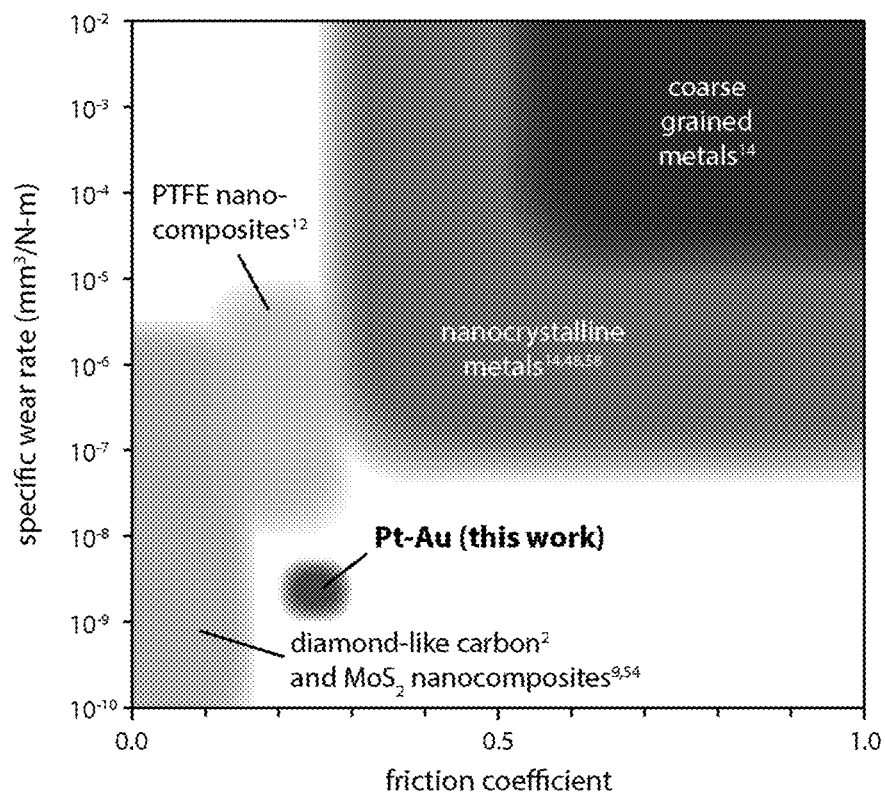
Figure 13A:
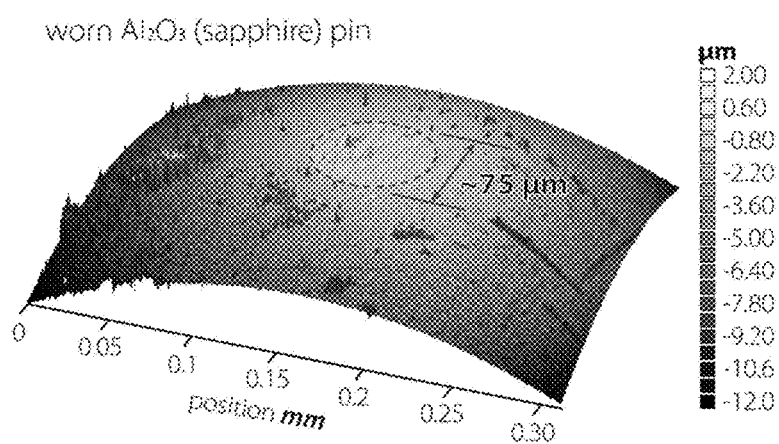
FIG. 13A-13D shows wear track results obtained near the middle of the track after 100 k sliding passes. Provided are surface topographical area scans of the worn sapphire ball (FIG. 13A) and the Pt—Au wear track (FIG. 13B). Also provided are representative cross-section wear depth plots of the ball and Pt—Au wear track (FIG. 13C), representative cross-sectional STEM inside the wear track (FIG. 13D, left), and a plan view back-scattered SEM image of wear track where FIB lift-out was taken (FIG. 13D, right).
Figure 13B:
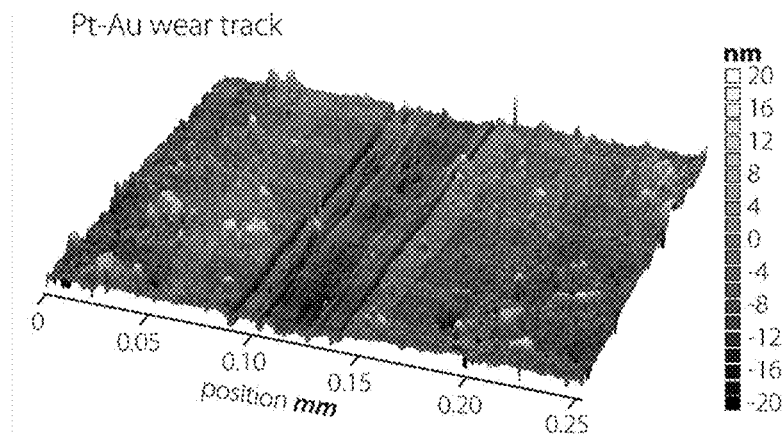
Figure 13C:
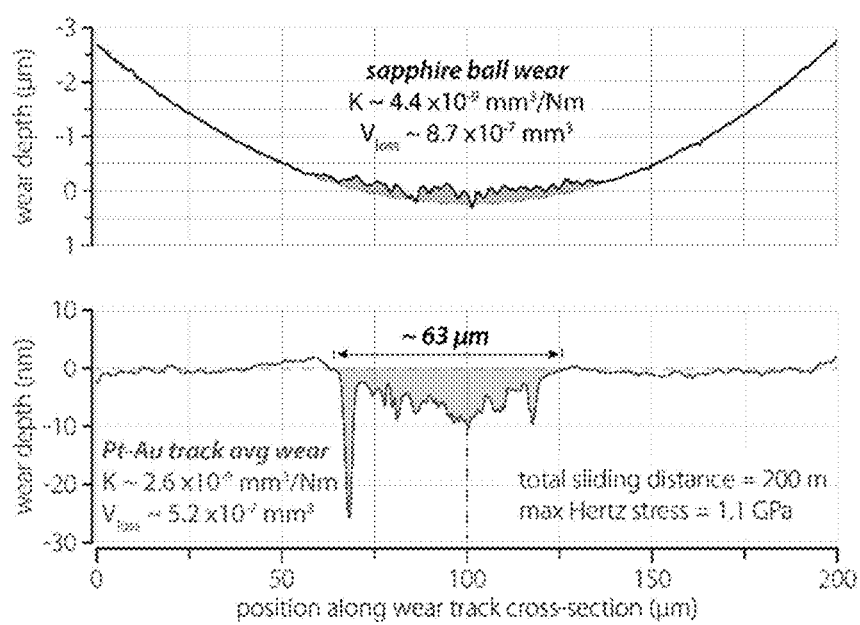
Figure 13D:
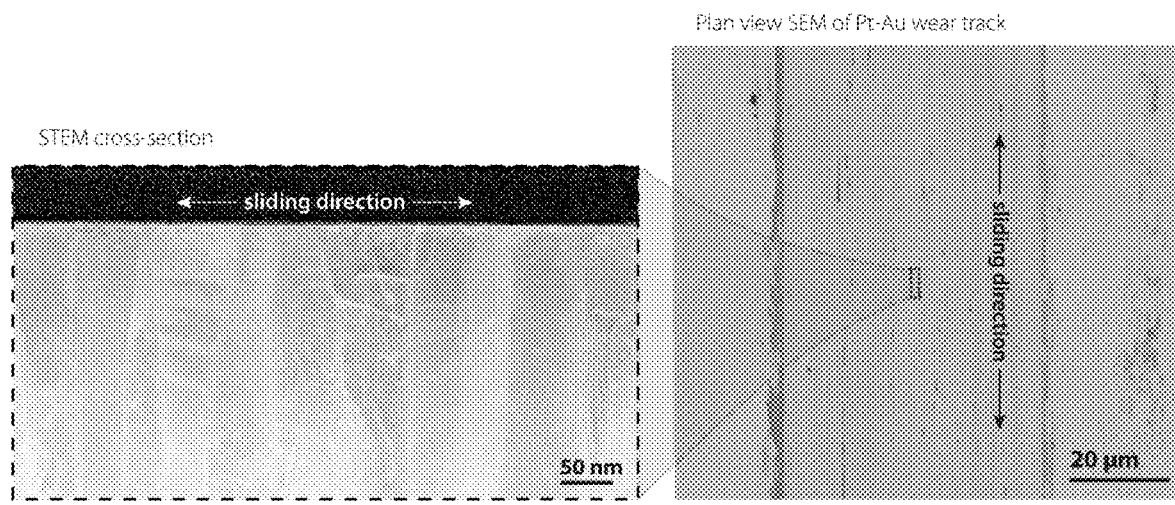

A comparison of the friction and wear performance of Pt—Au with respect to state-of-the-art tribological materials is presented in FIG. 12B, including conventional (i.e. not stabilized) nanocrystalline metals and non-conductive polymer and ionic solid nanocomposites (see, e.g., Erdemir A et al., *J. Phys. D. Appl. Phys.* 2006; 39(18):R311-R327; Scharf T W et al., *J. Mater. Sci.* 2013; 48(2):511-31; Sawyer W G et al., *Annu. Rev. Mater. Res.* 2014; 44:395-427; Slade P G (ed.), "Electrical Contacts: Principles and Applications," (Marcel Dekker, Inc., New York, N.Y., 1999); Rupert T J et al., *Acta Mater.* 2010; 58(12):4137-48; Jeong D H et al., "The effect of grain size on the wear properties of electrodeposited nanocrystalline nickel coatings," *Scripta Mater.* 2001; 44(3):493-9; and Scharf T W et al., "Friction and wear mechanisms in MoS$_2$/Sb$_2$O$_3$/Au nanocomposite coatings," *Acta Mater.* 2010; 58(12):4100-9). It is worth mentioning that while many composites require environmental control to achieve the lowest reported wear rates, such as ultra-high vacuum for MoS$_2$ and various environments for diamond-like carbon films (see, e.g., Scharf T W et al., *J. Mater. Sci.* 2013; 48(2):511-31; and Scharf T W et al., *Acta Mater.* 2010; 58(12):4100-9), the remarkably low wear rates of these Pt—Au films were obtained in laboratory air.

In studies assessing wear of materials, harder countersurfaces are generally used so that wear is predominantly due to the material or coating of interest. Interestingly, for these Pt—Au thin films, we found that the specific wear rates (i.e. aggregate volume lost) was lower than that of the much harder sapphire sphere (FIG. 13A-13D). Neither cross-sectional STEM (FIG. 13D, left) or plan-view SEM (FIG. 13D, right) of the wear track surface suggested the presence of surface contaminants, and molecularly thin films that are non-load bearing would not significantly affect stress-driven fatigue wear of the load bearing metal film. Even in cases where vapor-phase, thin-film lubrication was implemented in sliding metal contacts, the lowest reported wear rates were about 100× higher than what we report here, and there was consistently evidence of wear debris and surface morphologies associated with high-cycle fatigue and delamination wear (see, e.g., Argibay N et al., *Wear* 2010; 268(11-12):1230-6; and Bares J A et al., "High current density copper-on-copper sliding electrical contacts at low sliding velocities," *Wear* 2009; 267:417-27).

Figure 14A:
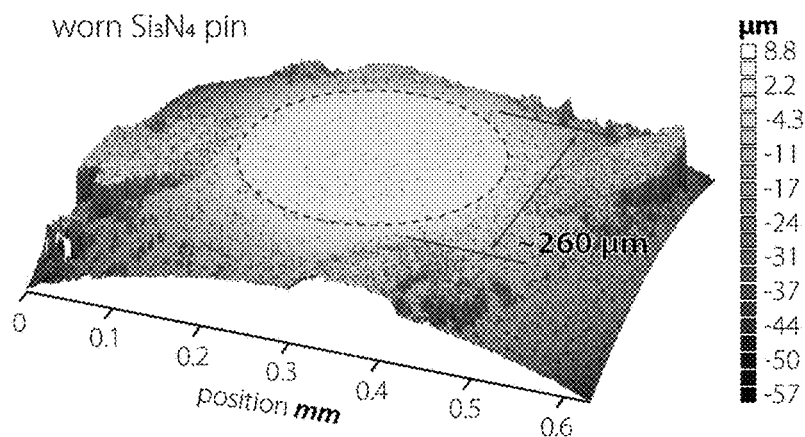
Figure 14B:
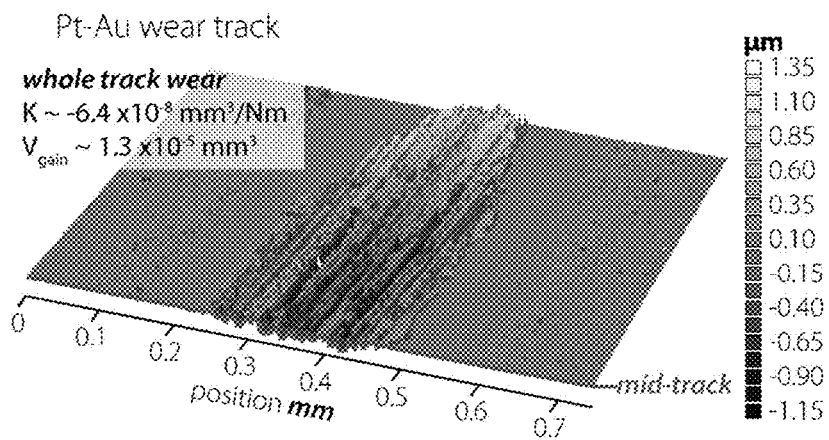

Similar experiments against Si$_3$N$_4$ spheres are shown in FIG. 14A-14E. While the wear rates for both Pt—Au and Si$_3$N$_4$ were substantially higher than the sapphire case, with evidence of plastic deformation and ploughing, FIG. 14A-14C shows that the wear rate of the Pt—Au was nearly an order of magnitude lower than the Si$_3$N$_4$. In FIG. 12A, where we show the friction coefficient for the case of the Si$_3$N$_4$ sphere, the gradual increase in friction coefficient can be associated with transfer and embedding of Si$_3$N$_4$ wear particles into the Pt—Au film, resulting in higher roughness and a transition to sliding of Si$_3$N$_4$ against Si$_3$N$_4$ debris. SEM and EDS surface analysis (FIG. 14D-14E) reveal significant transfer and embedding of the Si$_3$N$_4$ into the Pt—Au film.

The maximum Hertzian contact stresses of about 1.1 GPa in friction experiments are approximately equal to, or just below, the fatigue endurance limit of these Pt—Au films, and well below the measured nanoindentation hardness of 7.1±0.4 GPa (see, e.g., Example 2). Briefly, the endurance limit was found using 5 μm free-standing films having microstructures equivalent to those of the films used in the friction experiments. Nanoindentation hardness was measured on the same films used in friction experiments, in the as-deposited and annealed states. We hypothesize that because the sapphire balls were relatively smooth, contact stresses at asperities remained below the fatigue endurance limit of Pt—Au. As such, crack nucleation/propagation, stress-driven microstructure evolution, and grain growth were inhibited, suppressing fatigue-driven wear. Without wishing to be limited by mechanism, we hypothesize that the higher measured wear rate of Si$_3$N$_4$ was due to higher fatigue-wear of the ceramic ball, leading to the observed transfer of material and overall volume gain inside the Pt—Au wear track (FIG. 14E).

We note that an ultra-low wear rate is not necessarily concomitant with a low friction coefficient (see, e.g., Erdemir A et al., *J. Phys. D. Appl. Phys.* 2006; 39(18):R311-R327), as wear is a property of the bulk while friction coefficient is a property of the surface. In instances of ultra-low wear, friction coefficients are often largely dependent on the presence of adsorbates on the film surface, which can significantly affect the shear strength of the sliding interface. While an increase in contact shear strength due to a thin film of adventitious carbon adsorbates can certainly enhance wear rate by amplifying stress, any such adsorbates did not in this case compromise the ultra-low wear of the load-bearing Pt—Au film, which is a further testament to the impressive wear resistance of this alloy.

In conclusion, ultra-low wear rates on the order of $10^{-9}$ mm$^3$/N-m were measured for highly stable nanocrystalline Pt—Au thin films in lab air. These results suggest important and interesting directions for future research. Technologically, the demonstration of a noble metal alloy with an extremely low wear rate and extraordinary thermo-mechanical stability has far reaching implications, particularly in an electrical contact industry driven by increasing demand for greater efficiency in the use, storage and transmission of energy. An additional benefit for electrical contacts is the electrical resistivity of these coatings (measured to be approximately 30 nΩ-m; see, e.g., Example 2 herein), that was only 1.8× higher than that of coarse grained pure Cu. One noteworthy example of an application where these coatings may have high immediate impact potential is in the developing field of nano- and micro-electromechanical devices. The proliferation of gigahertz nano/micro switches remains fundamentally limited by stress and temperature driven grain growth, oxidation and the formation of insulating organic films. A highly stable nanocrystalline noble metal alloy could address persistent roadblocks to widespread adoption of this technology.

Example 5: Thermal Stability and Grain Boundary Segregation in Nanocrystalline Pt—Au Alloys Grain boundary (GB) segregation inhibits grain growth in nanocrystalline (NC) metals and has been proposed as a new route to achieve stable NC structures. In this study, we demonstrate remarkable thermal stability in a noble metal alloy system (Pt—Au) achieved due to the GB solute segregation. This effect is shown experimentally by comparing thermal stability of $Pt_{0.90}Au_{0.10}$ alloy and pure Pt films processed under identical conditions and is further verified by molecular dynamics (MD) simulations. The preferential Au segregation to GBs in the alloy $Pt_{0.90}Au_{0.10}$ film is revealed by aberration-corrected scanning transmission electron microscopy using energy-dispersive x-ray spectroscopy. The result also indicates the segregation is heterogeneous, i.e., variation between GBs as well as non-uniformity within the same GB, consistent with predictions from MD simulations. This study validates the mechanism of GB segregation and provides further understanding of the impact of thermodynamics and kinetics for NC stabilization.

Nanocrystalline (NC) metals have been shown to have desirable mechanical properties including high strength, hardness and wear resistance (see, e.g., Kumar K S et al., "Mechanical behavior of nanocrystalline metals and alloys," *Acta Mater.* 2003; 51(19):5743-74; and Meyers M A, "Mechanical properties of nanocrystalline materials," *Prog. Mater. Sci.* 2006; 51(4): 427-556). NC metal grain structures, however, are inherently unstable due to strong driving forces for grain growth, associated with high grain boundary (GB) area and boundary curvature. The ability to reduce grain growth and retain nanocrystallinity for an extended period under a practical service condition is one of the key challenges to the large scale commercial application of such systems, and has recently become an area of intense research (see, e.g., Murdoch H A et al., "Stability of binary nanocrystalline alloys against grain growth and phase separation," *Acta Mater.* 2013; 61(6):2121-32; Chookajorn T et al., "Design of stable nanocrystalline alloys," *Science* 2012; 337(6097):951-4; Weertman J R, "Retaining the nano in nanocrystalline alloys," *Science* 2012; 337(6097):921-2; Koch C C et al., "Stabilization of nanocrystalline grain sizes by solute additions," *J. Mater. Sci.* 2008; 43(23):7264-72; and Driver J H, "Stability of nanostructured metals and alloys," *Scripta Mater.* 2004; 51(8):819-23).

A classic approach to stabilizing grain structures in conventional microstructured metals is through alloying (see, e.g., Murdoch H A et al., *Acta Mater.* 2013; 61(6):2121-32; Chookajorn T et al., *Science* 2012; 337(6097):951-4; Weertman J R, *Science* 2012; 337(6097):921-2; Weissmüller J, "Alloy effects in nanostructures," *Nanostructured Mater.* 1993; 3(1-6):261-72; Kirchheim R, "Grain coarsening inhibited by solute segregation," *Acta Mater.* 2002; 50(2):413-9; and Kirchheim R, "Reducing grain boundary, dislocation line and vacancy formation energies by solute segregation: I. Theoretical background," *Acta Mater.* 2007; 55(15):5129-38). Solute drag can retard the motion of GBs (see, e.g., Cahn J W, "The impurity-drag effect in grain boundary motion," *Acta Metall.* 1962; 10(9):789-98; and Hillert M et al., "A treatment of the solute drag on moving grain boundaries and phase interfaces in binary alloys," *Acta Metall.* 1976; 24(8):731-43) and the formation of second phase precipitates can lead to Zener pinning of boundaries (see, e.g., Wörner C H et al., "Grain growth stagnation by inclusions or pores," *JOM* 1992; 44(9):16-20; and Hillert M, "Inhibition of grain growth by second-phase particles," *Acta Metall.* 1988; 36(12):3177-81).

Recently, GB solution segregation has been proposed as a new route for stabilizing nanocrystallinity (see, e.g., Murdoch H A et al., *Acta Mater.* 2013; 61(6):2121-32; and Chookajorn T et al., *Science* 2012; 337(6097):951-4). Unlike traditional metallurgical approaches for stabilizing grain structures by retarding grain growth kinetics (see, e.g., Driver J H, *Scripta Mater.* 2004; 51(8):819-23; Wörner C H et al., *JOM* 1992; 44(9):16-20; and Hillert M, *Acta Metall.* 1988; 36(12):3177-81), the new approach via GB solute segregation primarily relies on reducing interfacial free energy by creating local, quasi-equilibrium conditions near the GBs (see, e.g., Murdoch H A et al., *Acta Mater.* 2013; 61(6):2121-32; Chookajorn T et al., *Science* 2012; 337 (6097):951-4; Weissmüller J, *Nanostructured Mater.* 1993; 3(1-6):261-72; and Kirchheim R, *Acta Mater.* 2002; 50(2): 413-9). In accordance with the Gibbs adsorption equation, the preferential segregation of solute to GBs when the chemical potential is increased at a fixed temperature and pressure leads to reduction in the boundary energy, and thus the driving force for grain growth. If the energetic advantage from segregation is strong enough, substantial reductions or possible elimination of the thermodynamic driving force for grain growth can be achieved. This leads to either a reduction of grain growth kinetics or the thermodynamic stabilization of the nanocrystalline grain structure. This effect is expected to be the strongest in alloys with a miscibility gap that strongly favors boundary segregation, which can lead to substantial reductions in GB energy.

Although recent experiments have indicated increased NC thermal stability through GB solute segregation in several non-noble NC alloy systems, practical complexities associated with the non-noble metal systems such as presence of oxides and other impurities have greatly confounded experimental demonstrations (see, e.g., Clark B G et al., "Thermal stability comparison of nanocrystalline Fe-based binary alloy pairs," *JOM* 2016; 68(6):1625-3; and Gianola D S et al., "Grain-size stabilization by impurities and effect on stress-coupled grain growth in nanocrystalline Al thin films," *Mater. Sci. Eng. A* 2008; 483-484:637-40). In this study, we present both experimental and molecular dynamics (MD) evidence showing remarkable NC stability for a noble metal alloy system (e.g., Pt—Au) owing to solute segregation.

The Pt—Au alloy system is chosen because of a substantial miscibility gap in its phase diagram which makes it a good candidate for a thermodynamically stabilized alloy (see, e.g., Murdoch H A et al., "Estimation of grain boundary segregation enthalpy and its role in stable nanocrystalline alloy design," *J. Mater. Res.* 2013; 28(16):2154-63), and its nobility that avoids the complexity of oxide formation. Additionally, a relatively small elastic modulus mismatch of 4% between Pt and Au minimizes the role of strain on segregation behavior. Furthermore, this system is amenable to description by semi-empirical interatomic potentials in MD simulations.

Here, we describe the thermal stability for both thin films (~18 nm) and thick films (~2 μm) experimentally, and demonstrate thermal stability due to solution segregation by comparing thermal stability of the $Pt_{0.90}Au_{0.10}$ and pure Pt films. Aberration-corrected scanning transmission electron microscopy (STEM) using energy-dispersive x-ray spectroscopy (EDS) is used to reveal the Au segregation in GBs. The experimental results are supported and informed by MD simulations.

Results of grain growth experiments on $Pt_{0.90}Au_{0.10}$ alloy film and pure Pt thin films (~18 nm) are presented in FIG. 15A-15D. The annealing experiments were conducted at 500° C., representing a homologous value $T/T_m$ of ~0.4 relative to the equilibrium solidus temperature (~1930 K), a regime where grain growth is rampant for pure metal systems with nanoscale grain structures (see, e.g., Thompson C V, "Grain growth in thin films," *Annu. Rev. Mater. Sci.* 1990; 20:245-68). The as-deposited $Pt_{0.90}Au_{0.10}$ film and pure Pt film both have a grain size of about 7.3 nm. Further experimental details are provided in Example 6 herein.

Figure 15A:
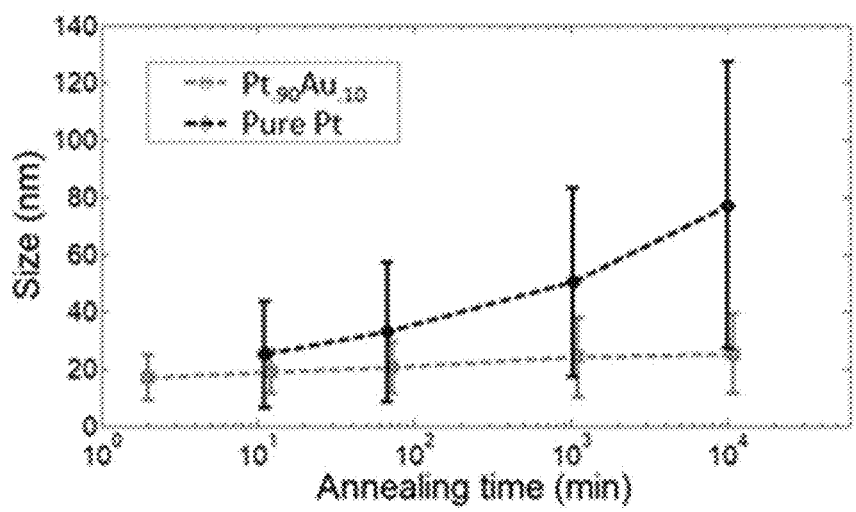
FIG. 15A-15D shows grain size of various films. Provided are average grain size and standard deviation as a function of annealing time determined via STEM-HAADF imaging for thin $Pt_{0.90}Au_{0.10}$ and pure Pt film at 500° C.
Figure 15B:
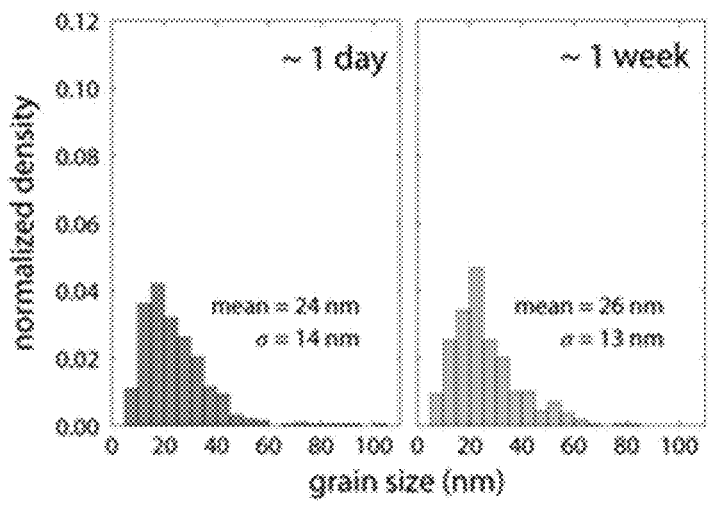
Figure 15C:
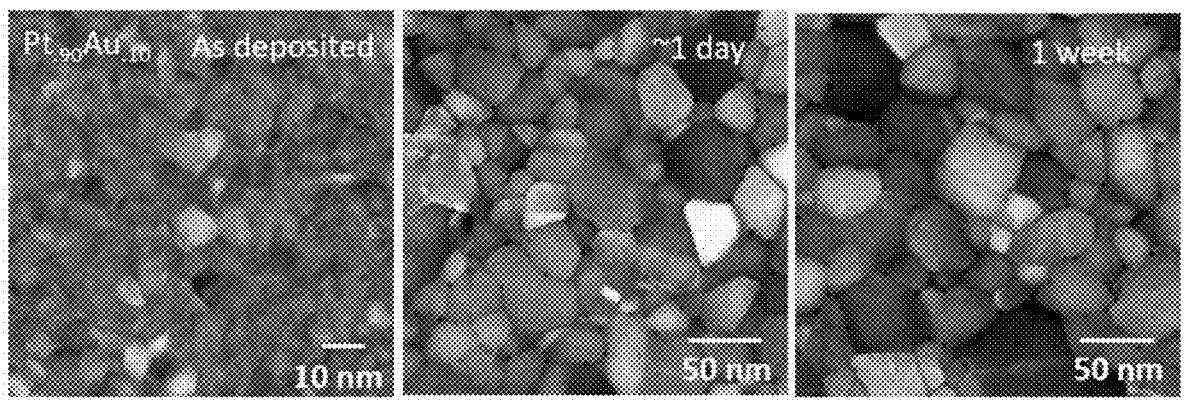
Figure 15D:
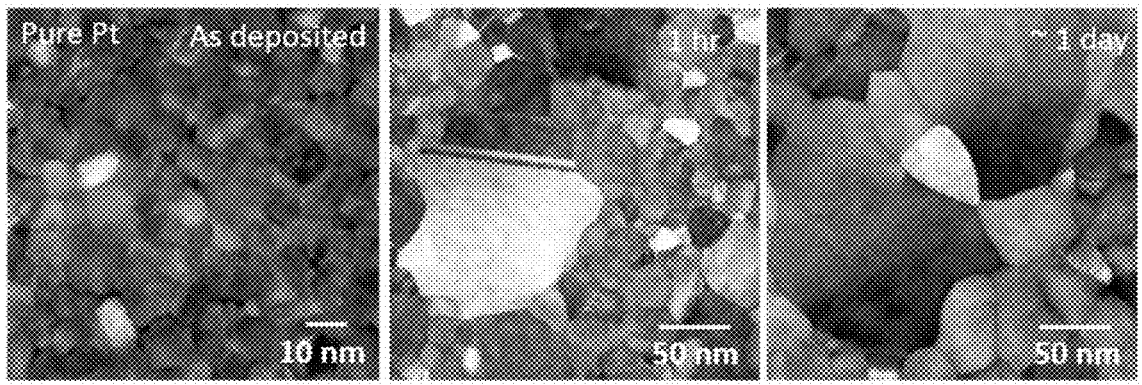

Significantly different grain growth behaviors are observed upon annealing at 500° C. (FIG. 15A, 15C, 15D). The average grain size of $Pt_{0.90}Au_{0.10}$ film increases at a considerable slower rate than that of the pure Pt (FIG. 15A). The grain structure for the alloy film appears to be stabilized just after a few hours of annealing which can be seen from STEM HAADF images in FIG. 15C as well as the histograms of grain size in FIG. 15B.

The rampant growth in pure Pt film, on the other hand, continues even after days of annealing (FIG. 15A). The pure Pt also displays an abnormal grain growth behavior where a few grains grow quickly and consume the smaller ones upon further annealing; a phenomenon that is not seen in the $Pt_{0.90}Au_{0.10}$ film (FIG. 15C-15D). A large grain, with a diameter of over 50 nm, can be seen in the Pt film that had only been annealed for about 1 hour, and the grain growth continues with additional annealing (FIG. 15D). Abnormal grain growth appears to result in significant grain growth and increasingly larger standard deviation of grain size in the pure Pt film.

Figure 16A:
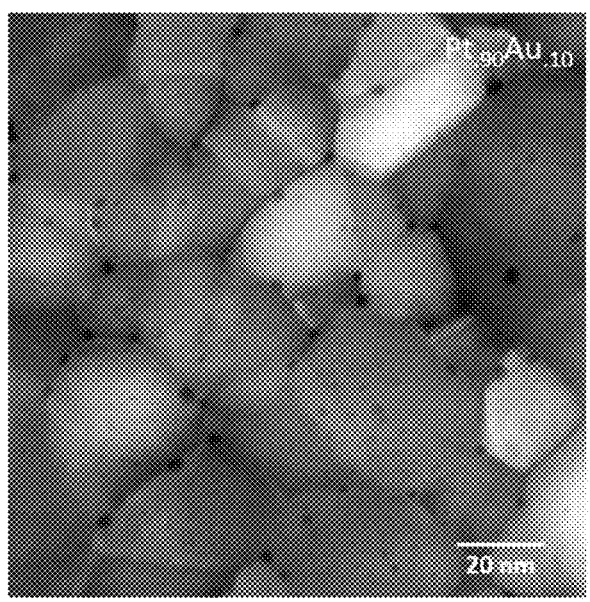
FIG. 16A-16B provides STEM-HAADF images showing the presence of voids in GBs and grains for a thin $Pt_{0.90}Au_{0.10}$ alloy film (FIG. 16A) and a pure Pt film (FIG. 16B) after annealing at 500° C. for about 1 day.
Figure 16B:
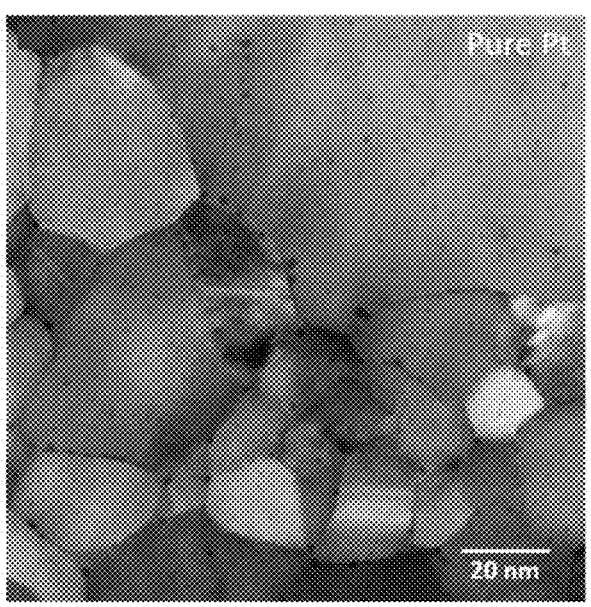

It is important to point out the presence of 1-5 nm diameter voids in the annealed films (both pure Pt and $Pt_{0.90}Au_{0.10}$ film), given that these voids may influence grain growth rates through Zener pinning of boundaries (see, e.g., Worner C H et al., *JOM* 1992; 44(9): 16-20; and Hillert M, *Acta Metall.* 1988; 36(12):3177-81). FIG. 16A-16B shows STEM HAADF images showing presence of nano-sized voids in the GBs as well as within individual grains for both the $Pt_{0.90}Au_{0.10}$ (FIG. 16A) and pure Pt thin film (FIG. 16B). The appearance of the voids after annealing is attributed to clustering of vacancies present in the as-deposited films. Careful comparison indicates that the size of voids at GBs in $Pt_{0.90}Au_{0.10}$ film is slightly larger than that in the pure Pt. Since a high density of voids is present in both $Pt_{0.90}Au_{0.10}$ alloy and pure Pt thin film, Zener pinning by voids alone does not appear to significantly mitigate grain growth and impact nanocrystalline stability.

The solution segregation in the $Pt_{0.90}Au_{0.10}$ film is studied utilizing STEM-EDS. FIG. 17(a) shows a HAADF image of the region where EDS mapping is carried out. The nanoscale voids are visible in this image. FIG. 17(b) shows the grain structures of the region. Preferential Au segregation to GBs is clearly seen from EDS maps (FIG. 17(c)), quantitative Au composition map (FIG. 17(d)), 3-dimensional (3D) plot of the Au composition (FIG. 17(e)), and a representative composition line scan (FIG. 17(f)). Although the average atomic composition of the alloy is approximately 10 at %, the GBs with Au concentration of more than 50 at % are frequently observed (FIG. 17(f)).

Additionally, segregation appears to be heterogenous, meaning that it is strongly dependent on the GB type (e.g., low- vs. high-energy GBs) and that the composition is non-uniform along the boundary for same GB. The heterogeneity can be most clearly seen from the 3D plot in FIG. 17(e) and by comparing the GB structure (FIG. 17(b)) with the EDS results (FIG. 17(c)-(e)). There are several GBs in FIG. 17(b), that do not show the enriched Au concentration. These GBs are typically low-energy GBs such as twin boundaries, identified in FIG. 17(b). It is interesting to note that the non-uniformity along the GB is often associated with the voids within GBs and locations of the voids typically exhibit a higher Au concentration. Several of these voids with a higher Au concentration are marked by the dashed circles in FIG. 17(a)-(d). This data suggests that the internal surfaces of the voids are likely Au-rich, resulting from preferential segregation of Au atoms to a free surface.

The NC thermal stability was also found in $Pt_{0.90}Au_{0.10}$ thick film (~2 μm) deposited on Si substrate. No visible changes in grain size were found between as-deposited and one annealed at 500° C. for up to 2 hrs. It is important to point out that the thick films had a columnar structure with large grain aspect ratios, a typical feature of magnetron sputter-deposited metal films. This microstructure alone may cause stagnation of normal grain growth in columnar films (see, e.g., Thompson C V, *Annu. Rev. Mater. Sci.* 1990; 20:245-68). Nevertheless, preferential Au segregation to GBs has also been observed in the thick film, and the Au segregation may have provided additional stability for the film. FIG. 18(a) shows a typical plan-view structure of the film after annealing 500° C. for about 30 min, with a mean grain size of about 43 nm. The grain size represents the widths of columnar grain near the middle of the film thickness. A quantitative Au composition map is shown in FIG. 18(b), along with a composition line profile across the GBs (FIG. 18(c)). The result indicates that segregation of Au into GBs occurs in the thick film during annealing, and is similar to that observed in thin $Pt_{0.90}Au_{0.10}$ film. For the thick film, solute denuded zones also appear in the bulk grains adjacent to the boundaries.

Figure 17:
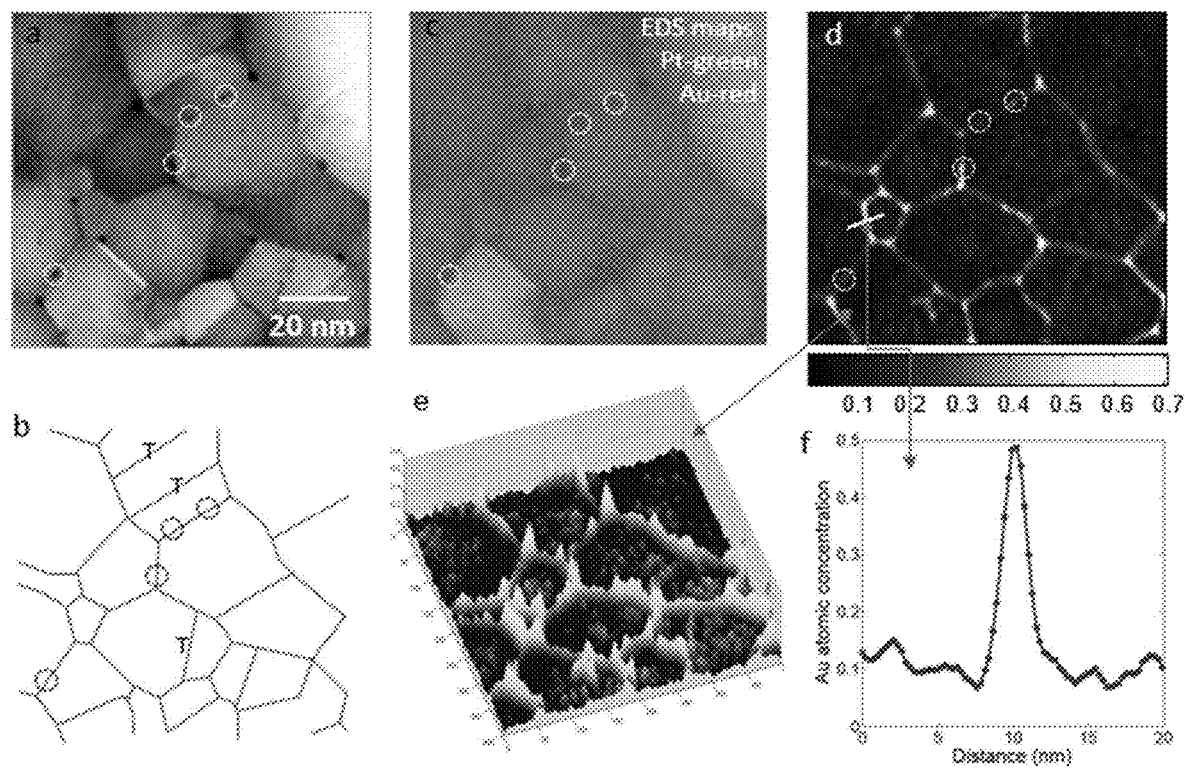
FIG. 17 shows STEM observation of Au segregation in GBs in $Pt_{0.90}Au_{0.10}$ thin film after 17 hours of annealing at 500° C. Provided are (a) STEM-HAADF image; (b) GB structure; (c) (Au, Pt) EDS composite map including Au L and Pt L; (d) quantified Au atomic concentration map; (e) 3D plot of (d); and (f) line-profile of Au atomic concentration across a GB as marked in (d). Locations of several voids in GBs are marked by the dashed circles in (a), (b), (c) and (d), respectively. The twin boundaries are marked by letter T in (b).
Figure 18:
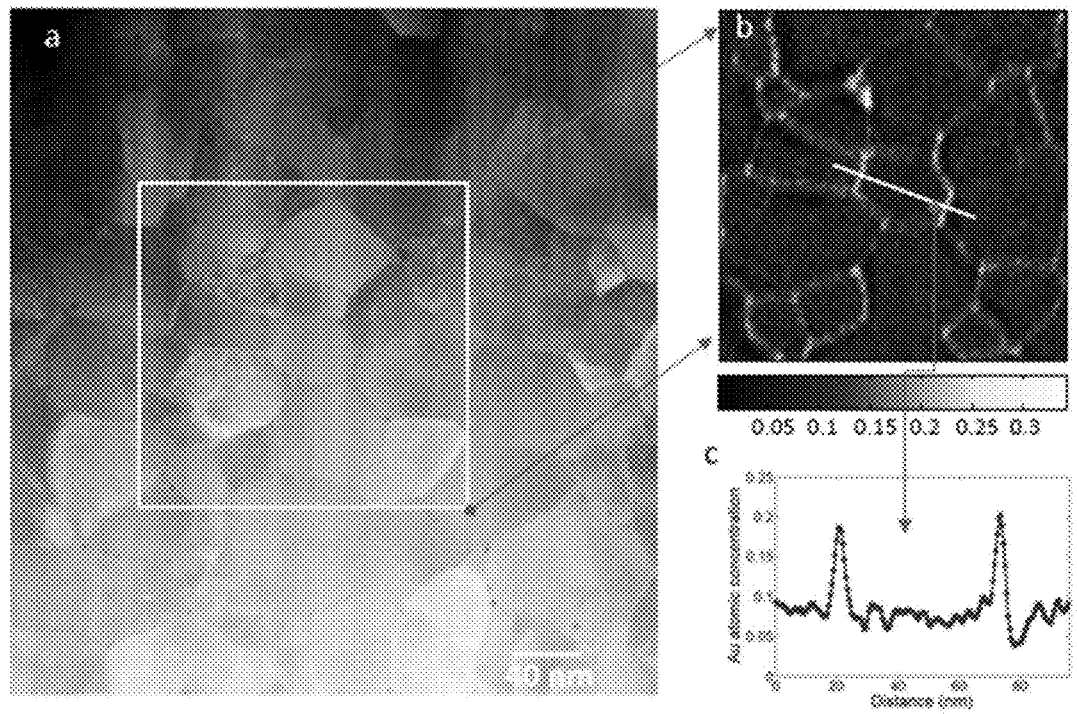
FIG. 18 shows (a) STEM-HAADF image of thick (~2 µm) $Pt_{0.90}Au_{0.10}$ film annealed at 500° C. for 30 min; (b) quantified Au atomic concentration map from a region marked by the square in (a); and (c) line-profile of Au atomic concentration across GBs as marked in (b).
Figure 19A:
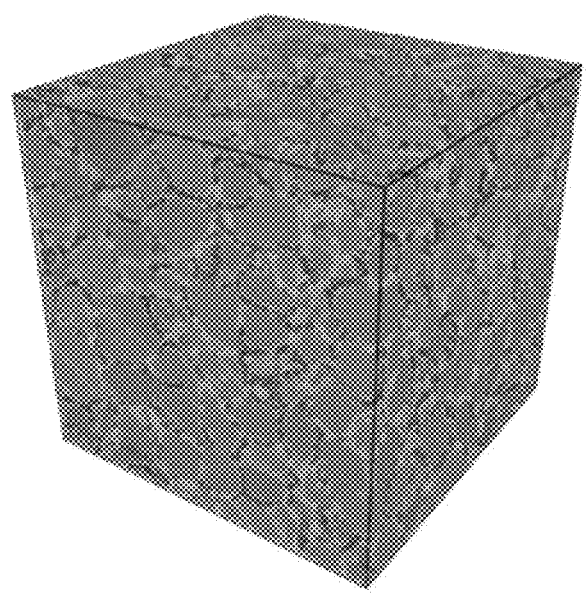
FIG. 19A-19B shows results of Monte Carlo simulation of a nanocrystalline $Pt_{0.85}Au_{0.15}$ alloy at 775 K (502° C.). Provided is a graph of the equilibrium state of a nanocrystalline Pt—Au alloy with 15 at % Au at 502° C.

FIG. 19A shows a snapshot of an equilibrium configuration of a nanocrystalline $Pt_{0.85}Au_{0.15}$ alloy at 775 K (502° C.) generated through MC simulation, with a grain size on the order of 5 nm. The shading in the figure differentiates both locally crystalline atoms from GB atoms and, in addition, reflects the atomic composition. Consistent with the bulk phase diagram, there are only dilute levels of Au in the grain interiors. The Au is observed to form clusters in the structure, some located at triple junctions and others within grain boundaries. The Au clusters only occur on a subset of the grain boundaries suggesting that segregation tendencies vary between boundaries. Further, even for boundaries that do contain Au clusters, the clusters often only cover a portion of the boundary segment, indicating that clustering can exist within a given boundary. The strong Au solution segregation at GBs and the heterogenous distribution of Au are in qualitative agreement with the experiments (FIGS. 17-18).

Figure 19B:
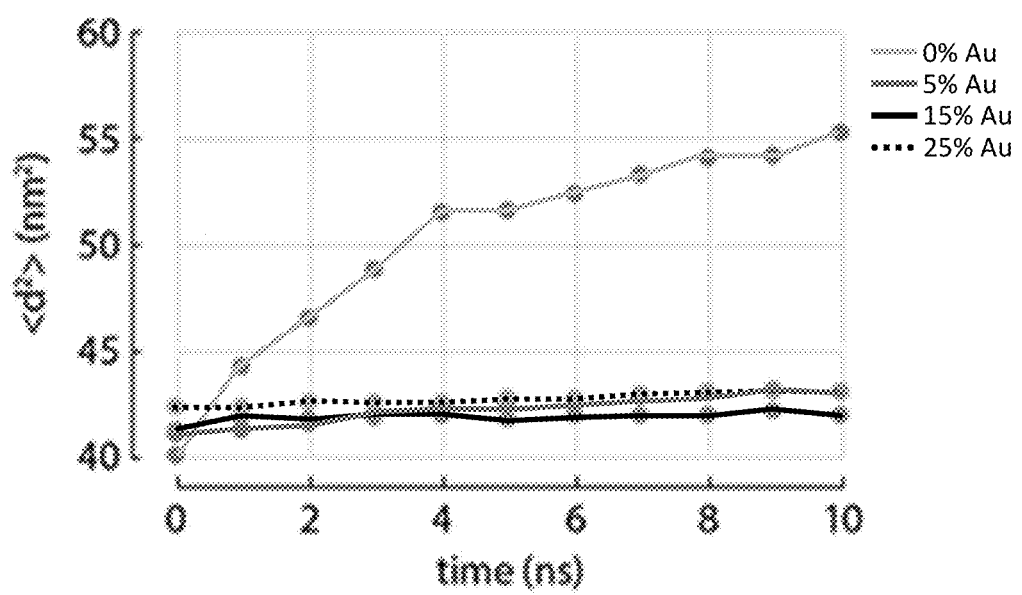

FIG. 19B shows the evolution of the squared grain size for molecular dynamics anneals of the grain structure also at 775 K for pure Pt (0 at. % Au) and 5 at. %, 15 at. %, and 25 at. % Au. The initial grain structure of the Pt was the result of a high-temperature anneal of a Voronoi grain construction which reduced the number of grains to approximately half of the initial Voronoi structure. The alloy cases started with the same initial configuration as the pure Pt case with Au atoms added via the MC simulations. There is slight structural relaxation during the MC simulation, so the initial grain structures are similar but not exactly the same. The grain size is determined through cluster labelling that identifies and counts the number of grains in the sample and the resulting average grain size is converted into a squared grain diameter. For the case of pure Pt, there is significant grain growth over the 10 ns simulation, whereas for the simulations with segregated Au, the grain size is essentially unchanged, consistent with the experiments in FIG. 15A.

The qualitative similarities between the experimental and simulation results provide strong support to the assertion that the GB segregation is a key to the thermal stability observed in $Pt_{0.90}Au_{0.10}$ alloy, and that the GB segregation is highly heterogeneous both within a given boundary type and between boundaries of different types. The heterogeneity with the boundary type (e.g., high- vs. low-energy GBs) is not a surprise given that reduction of the thermodynamic driving force by solution segregation is highly dependent on the GB structure. The energy reduction by solution segregation to a high-energy GB, for example, is expected to be substantially more than that of a low-energy GB, e.g., twins. Through the heterogeneous GB segregation, the thermodynamic driving force for the grain growth, especially that of high energy GBs, is significantly reduced or eliminated. This makes the GBs more thermodynamically homogeneous, preventing the abnormal grain growth that is typically associated with movement of the high-energy GBs due to the heterogeneous boundary properties (see, e.g., Jung S H et al., "Mechanism of abnormal grain growth in ultrafine-grained nickel," *Acta Mater.* 2013; 61(15):5685-93; and Sansoz F et al., "Grain growth behavior at absolute zero during nanocrystalline metal indentation," *Appl. Phys. Lett.* 2006; 89:111901 (3 pp.)). The overall effect may have produced the NC thermal stability in the alloy film as observed.

The heterogeneity associated within the same boundary is also of interest. Experimentally, the voids along GBs are often found to be associated with the locations with higher Au concentration. The MD simulation, on the other hand, depicts the formation of Au clusters along the GB. Without wishing to be limited by mechanism, in the presence of voids along the GB, Au atoms of the clusters might prefer the sites of the voids where Au atoms occupy the internal surface of the voids for additional energy reduction. In one non-limiting instance, this effect could be duplicated by including vacancies in the MD simulations.

The use of noble alloys in this study to avoid oxides offers a simplified view of grain stabilization by solute segregation as compared to any prior study of which we are aware. On the other hand, presence of the voids may also contribute to thermal stability through Zener pinning but the overall effect appears to be relatively small since a high density of voids is present in both $Pt_{0.90}Au_{0.10}$ and pure Pt films. It is also important to point out that they might be the artifacts associated with using a thin film for annealing experiments. Free surfaces and thin film-related geometrical features, such as preferential surface segregation and grain boundary grooves may impact experimental results that are not captured in MD simulations. The free surfaces and grooves allow for greater heterogeneity in the thin film samples and will, in fact, destabilize the structure by allowing depletion of pinning sites in boundaries. The fact that we find such notable stability in these samples, and the agreement found between the experiments and simulations indicate that this effect is also likely small at the annealing conditions used in this study.

By comparing grain growth behavior of the $Pt_{0.90}Au_{0.10}$ and pure Pt film and investigating the Au segregation in the $Pt_{0.90}Au_{0.10}$ film, we have demonstrated the effect on the NC stability in $Pt_{0.90}Au_{0.10}$ film owning to Au segregation to the GBs. The results from the experimental observations have been confirmed by MD simulations. Segregation of Au to GBs was found to be highly heterogeneous, including variation between the GBs as well as non-uniformity within the same GB. The heterogeneous solution segregation provides overall GB energy saving particularly from that of high-energy GBs, and thus reduction of the driving force for grain growth. This effect leads to inhibition of abnormal grain growth and a more stable NC structure in the alloy system. This study verifies the mechanism of solution segregation for stabling NC structure, and provides a strong foundation for utilizing the solution segregation mechanism for future NC metal and alloy design.

Example 6: Experimental Details for Thermal Stability Studies

Direct current (DC) magnetron sputtering was used to deposit pure Pt and $Pt_{0.90}Au_{0.10}$ films utilizing high purity (>99.99%) targets. The system has a cryo-pumped vacuum system with a base pressure of better than $2 \times 10^{-7}$ Torr. The targets were pre-sputtered for ~5 min prior to the start of each deposition to avoid incorporation of adventitious carbon in the deposited films. Ultra-high purity Ar (99.995%) was used for all sputter processes, and substrate temperature was controlled to be less than 50° C. during the deposition. Quartz crystal monitors were used to monitor film thickness with Angstrom-level precision. Thickness calibration was conducted prior to depositions utilized a calibrated DEK-TAK 3 (Veeco; Woodbury, N.Y.) surface profilometer, and transmission electron microscopy (TEM).

Both pure Pt and $Pt_{0.90}Au_{0.10}$ thin films (~18 nm) as well as thick films (~2 µm) were used for thermal stability studies. The 18 nm thin film and 2 µm thick film were deposited on polycrystalline NaCl and Si substrates, respectively. The annealing of the thin film was carried out using a Gatan 628 TEM in-situ heating holder in vacuum (pressure $<10^{-6}$ Torr). The thin film TEM specimens were prepared by dissolving the NaCl substrate in water, rinsing the film in water and methanol (more than 48 hours) and laying the film on a Mo TEM grid. For the thick film, the sample annealing was carried out in a tube furnace in air, and after the annealing, the TEM samples were made by focused ion beam (FIB).

An FEI Titan™ G2 80-200 STEM with a Cs probe corrector and ChemiSTEM™ technology (X-FEG™ and SuperX™ EDS with four windowless silicon drift detectors) operated at 200 kV was used. The film microstructure was studied by STEM using high-angle annular dark-field (HAADF) detector. The GB segregation was studied by STEM-EDS. EDS spectral imaging was acquired as a series of frames where the same region was scanned multiple times.

A typical acquisition of EDS spectral imaging took about 4 hrs. Au L lines and Pt L lines were used for constructing the EDS maps of Au and Pt, respectively. Since the Au L lines overlap with the Pt L lines significantly, the EDS spectra were deconvoluted pixel-by-pixel using pure spectra of Au and Pt as references before map construction. Au atomic concentration was calculated using Cliff and Lorimer method (see, e.g., Cliff G et al., "The quantitative analysis of thin specimens," *J. Microscop.* 1975; 103(2):203-7). Unless otherwise specified in Example 5, MC and MD simulations were conducted as described herein in Example 3.

OTHER EMBODIMENTS

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A coating comprising a binary alloy, wherein the binary alloy comprises a plurality of columnar grains, and wherein at least one of the plurality of columnar grains has a grain diameter of less than about 100 nm and an aspect ratio of 1:2 or greater, and wherein the binary alloy comprises a solvent and a solute, and wherein the solute is preferentially segregated at grain boundaries.

2. The coating of claim 1, wherein the at least one of the plurality of columnar grains has a grain length greater than about 100 nm.

3. The coating of claim 1, wherein the aspect ratio is of from about 1:5 to about 1:10.

4. The coating of claim 1, wherein an average grain diameter of the plurality of columnar grains is less than about 100 nm and an average grain length of the plurality of columnar grains in greater than about 100 nm.

5. The coating of claim 1, wherein the coating is a thin film.

6. The coating of claim 5, wherein the thin film has a thickness of from about 10 nm to about 1000 nm.

7. The coating of claim 1, wherein the binary alloy comprises one or more noble metals.

8. The coating of claim 7, wherein the binary alloy comprises one or more selected from the group consisting of Ag, Al, Au, Ba, Be, Bi, Ca, Cd, Co, Cr, Cs, Cu, Fe, Ga, Ge, Hf, In, Ir, K, La, Li, Mg, Mn, Mo, Na, Nb, Ni, Os, Pb, Pd, Pt, Rb, Re, Rh, Ru, Sb, Sc, Sn, Sr, Ta, Tc, Th, Ti, Tl, V, W, Y, Zn, and Zr.

9. The coating of claim 8, wherein the binary alloy comprises Pt and Au.

10. The coating of claim 1, wherein the solvent is selected from the group consisting of Hf, La, Mo, Nb, Ni, Os, Pt, Re, Rh, Ru, Ta, Tc, Ti, V, W, Y, and Zr.

11. The coating of claim 1, wherein the solute is selected from the group consisting of Ag, Al, Au, Ba, Be, Bi, Ca, Cd, Co, Cr, Cs, Cu, Fe, Ga, Ge, In, K, La, Li, Mg, Mn, Na, Ni, Pb, Rb, Sb, Sc, Sn, Sr, Th, Tl, Y, Zn, and Zr.

12. The coating of claim 11, wherein the solvent comprises Pt and the solute comprises Au.

13. The coating of claim 1, wherein the binary alloy comprises a stable, nanocrystalline structure.

14. The coating of claim 13, wherein the binary alloy comprises Al—Pb, Al—Zn, Co—Cd, Co—Cu, Co—Pd, Cu—Ag, Cu—Bi, Cu—Pb, Cu—Y, Fe—Ag, Fe—Au, Fe—Cu, Fe—In, Fe—Mg, Hf—Mg, Hf—Sc, Hf—Ti, Ir—Ag, Ir—Au, Ir—Cu, Ir—Ni, Ir—Pd, Ir—Rh, La—Ba, La—Ca, La—Cr, La—Li, Mn—Cd, Mo—Au, Mo—Cr, Mo—Sc, Nb—Bi, Nb—Cu, Nb—Zr, Ni—Ag, Ni—Au, Ni—Cu, Ni—Pb, Ni—Sn, Ni—Tl, Os—Ag, Os—Cu, Os—Ni, Os—Pd, Os—Rh, Pd—Au, Pt—Au, Pt—Pd, Re—Cu, Re—Ni, Re—Pd, Re—Rh, Rh—Ag, Rh—Au, Rh—Co, Rh—Cu, Rh—Ni, Rh—Pd, Ru—Ag, Ru—Cu, Ru—Ni, Ru—Pd, Ru—Rh, Sc—Au, Sc—Ba, Sc—Cr, Sc—Cu, Sc—Sr, Sr—Mn, Ta—Bi, Ta—Cu, Ta—Hf, Ta—In, Ta—Zr, Tc—Cu, Tc—Ni, Tc—Pd, Th—Cr, Th—La, Th—Mo, Th—Sc, Th—Ti, Th—V, Th—Y, Ti—Ca, Ti—K, Ti—La, Ti—Mg, Ti—Sc, V—Cd, V—Cu, V—Sc, W—Au, W—Cr, W—Cu, W—Sb, W—Sc, W—Th, W—Y, Y—Ba, Y—Ca, Y—Cr, Y—Sr, Y—Tl, Y—V, Zr—Cs, Zr—K, Zr—Mg, Zr—Sc, Zr—Ti, or Zr—Y.

15. The coating of claim 1, wherein the at least one of the plurality of columnar grains has a grain diameter of from about 0.5 nm to about 90 nm.

16. The coating of claim 1, wherein the at least one of the plurality of columnar grains has a grain length of from about 20 nm to about 2000 nm.

17. A noble metal alloy electrical contact coating, comprising a thin film comprising an alloy of platinum and gold, the alloy comprising less than about 50 atom percent gold, and wherein the alloy comprises columnar grains with grain diameters of less than about 100 nm and grain lengths of greater than about 100 nm.

18. The coating of claim 17, wherein grain growth is negligible up to a temperature of about 500° C. after weeks of exposure.

19. The coating of claim 17, wherein the gold is preferentially segregated at grain boundaries.

20. The coating of claim 17, wherein the thin film is deposited on a substrate by physical vapor deposition, chemical vapor deposition, sputter deposition, cold spray, electron beam deposition, atomic layer deposition, electroplating, or electroless plating.

21. A noble metal alloy electrical contact coating, comprising a thin film comprising an alloy of platinum and gold, the alloy comprising less than about 50 atom percent gold and wherein the gold is preferentially segregated at grain boundaries.

22. The coating of claim 21, wherein the alloy comprises columnar grains with grain diameters of less than about 100 nm and grain lengths of greater than about 100 nm.

23. The coating of claim 21, wherein grain growth is negligible up to a temperature of about 500° C. after weeks of exposure.

24. The coating of claim 21, wherein the thin film is deposited on a substrate by physical vapor deposition, chemical vapor deposition, sputter deposition, cold spray, electron beam deposition, atomic layer deposition, electroplating, or electroless plating.

* * * * *